(12) United States Patent
Hirose et al.

(10) Patent No.: US 12,426,467 B2
(45) Date of Patent: Sep. 23, 2025

(54) DISPLAY APPARATUS AND ELECTRONIC DEVICE COMPRISING FIRST CAPACITOR AND SECOND CAPACITOR

(71) Applicant: Semiconductor Energy Laboratory Co., Ltd., Kanagawa-ken (JP)

(72) Inventors: Takeya Hirose, Kanagawa (JP); Hideaki Shishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 495 days.

(21) Appl. No.: 17/787,654

(22) PCT Filed: Dec. 11, 2020

(86) PCT No.: PCT/IB2020/061798
§ 371 (c)(1),
(2) Date: Jun. 21, 2022

(87) PCT Pub. No.: WO2021/130585
PCT Pub. Date: Jul. 1, 2021

(65) Prior Publication Data
US 2022/0416008 A1    Dec. 29, 2022

(30) Foreign Application Priority Data

Dec. 25, 2019   (JP) ................. 2019-235131
Apr. 3, 2020   (JP) ................. 2020-067214

(51) Int. Cl.
*H01L 29/08* (2006.01)
*H10K 59/121* (2023.01)
*H10K 59/131* (2023.01)

(52) U.S. Cl.
CPC ..... *H10K 59/1315* (2023.02); *H10K 59/1213* (2023.02); *H10K 59/1216* (2023.02)

(58) Field of Classification Search
CPC ........... H10K 59/1315; H10K 59/1213; H10K 59/1216
(Continued)

(56) References Cited

U.S. PATENT DOCUMENTS 6,236,195 B1 *  5/2001  Nagatomo .............. G05F 3/242
                                                323/311
8,059,068 B2   11/2011  Kimura
(Continued)

FOREIGN PATENT DOCUMENTS

CN         001419228 A    5/2003
CN         001591104 A    3/2005
(Continued)

OTHER PUBLICATIONS

International Search Report (Application No. PCT/IB2020/061798) Dated Apr. 6, 2021.
(Continued)

*Primary Examiner* — Phuc T Dang
(74) *Attorney, Agent, or Firm* — Husch Blackwell LLP

(57) ABSTRACT

A display apparatus with high display quality is provided. A high-resolution display apparatus is provided. The display apparatus includes a plurality of pixels, and the pixels each include a light-emitting device, a first transistor, a second transistor, a third transistor, a fourth transistor, and a first capacitor. One electrode of the light-emitting device is electrically connected to one of a source and a drain of the first transistor, one of a source and a drain of the second transistor, and one electrode of the first capacitor. A gate of the second transistor is electrically connected to the other electrode of the first capacitor, one of a source and a drain of the third transistor, and one of a source and a drain of the fourth transistor. One frame period of each of the pixels (Continued)

includes a period in which the first transistor and the fourth transistor are each in a conduction state.

11 Claims, 32 Drawing Sheets

(58) Field of Classification Search
USPC .......................................................... 257/40
See application file for complete search history.

(56) References Cited

U.S. PATENT DOCUMENTS

| | | | |
|---|---|---|---|
| 8,242,986 | B2 | 8/2012 | Kimura |
| 8,325,111 | B2 | 12/2012 | Kimura |
| 8,508,443 | B2 | 8/2013 | Kimura |
| 8,520,312 | B2 | 8/2013 | Miyano |
| 8,823,610 | B2 | 9/2014 | Miyazawa |
| 8,890,180 | B2 | 11/2014 | Kimura |
| 9,496,408 | B2 | 11/2016 | Yamazaki et al. |
| 9,659,526 | B2 | 5/2017 | Miyake |
| 9,825,068 | B2 | 11/2017 | Kimura |
| 9,997,584 | B2 | 6/2018 | Kimura |
| 10,128,280 | B2 | 11/2018 | Kimura |
| 11,037,964 | B2 | 6/2021 | Kimura |
| 11,417,273 | B2 | 8/2022 | Toyotaka et al. |
| 2003/0090481 | A1 | 5/2003 | Kimura |
| 2005/0083270 | A1 | 4/2005 | Miyazawa |
| 2007/0126664 | A1 | 6/2007 | Kimura |
| 2010/0201658 | A1* | 8/2010 | Koshiishi ............ H10K 59/131 438/4 |
| 2010/0207920 | A1 | 8/2010 | Chaji et al. |
| 2010/0289782 | A1 | 11/2010 | Yamamoto et al. |
| 2012/0038991 | A1 | 2/2012 | Miyano |
| 2013/0088417 | A1 | 4/2013 | Kim et al. |
| 2013/0320334 | A1 | 12/2013 | Yamazaki et al. |
| 2014/0132175 | A1 | 5/2014 | Hokazono et al. |
| 2015/0029079 | A1* | 1/2015 | Miyazawa ............ G09G 3/3233 345/82 |
| 2015/0077411 | A1 | 3/2015 | Miyake |
| 2015/0161940 | A1* | 6/2015 | Woo ....................... G09G 3/325 345/58 |
| 2015/0171115 | A1* | 6/2015 | Yamazaki ........ G02F 1/133345 257/43 |
| 2015/0310793 | A1 | 10/2015 | Kawashima et al. |
| 2016/0104419 | A1 | 4/2016 | Chung et al. |
| 2018/0026218 | A1 | 1/2018 | Kobayashi et al. |
| 2018/0277615 | A1 | 9/2018 | Kimura |
| 2020/0350391 | A1 | 11/2020 | Kimura |
| 2021/0090513 | A1 | 3/2021 | Takahashi et al. |
| 2021/0296372 | A1 | 9/2021 | Kimura |

FOREIGN PATENT DOCUMENTS

| | | |
|---|---|---|
| CN | 001975844 A | 6/2007 |
| CN | 103578410 A | 2/2014 |
| CN | 104715718 A | 6/2015 |
| EP | 1 310 937 A1 | 5/2003 |
| EP | 1 517 290 A2 | 3/2005 |
| EP | 1 793 366 A2 | 6/2007 |
| EP | 2 302 614 A2 | 3/2011 |
| EP | 2 309 479 A2 | 4/2011 |
| JP | 2001-042822 A | 2/2001 |
| JP | 2003-216110 A | 7/2003 |
| JP | 2005-099715 A | 4/2005 |
| JP | 2007-179041 A | 7/2007 |
| JP | 2009-015276 A | 1/2009 |
| JP | 2012-042569 A | 3/2012 |
| JP | 2014-007399 A | 1/2014 |
| JP | 2015-025978 A | 2/2015 |
| JP | 2015-079241 A | 4/2015 |
| JP | 2018-010203 A | 1/2018 |
| JP | 2018-045164 A | 3/2018 |
| KR | 2003-0040056 A | 5/2003 |
| KR | 2005-0021960 A | 3/2005 |
| KR | 2007-0058320 A | 6/2007 |
| KR | 10-1341797 | 12/2013 |
| KR | 2015-0031181 A | 3/2015 |
| KR | 2015-0068154 A | 6/2015 |
| KR | 2019-0073015 A | 6/2019 |
| WO | WO-2019/111137 | 6/2019 |

OTHER PUBLICATIONS

Written Opinion (Application No. PCT/IB2020/061798) Dated Apr. 6, 2021.

* cited by examiner

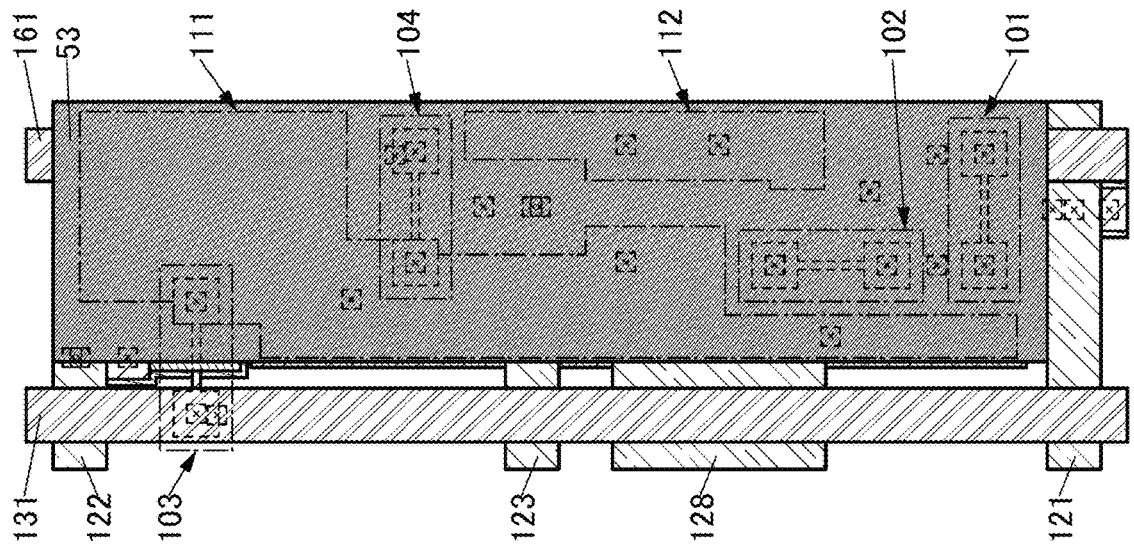
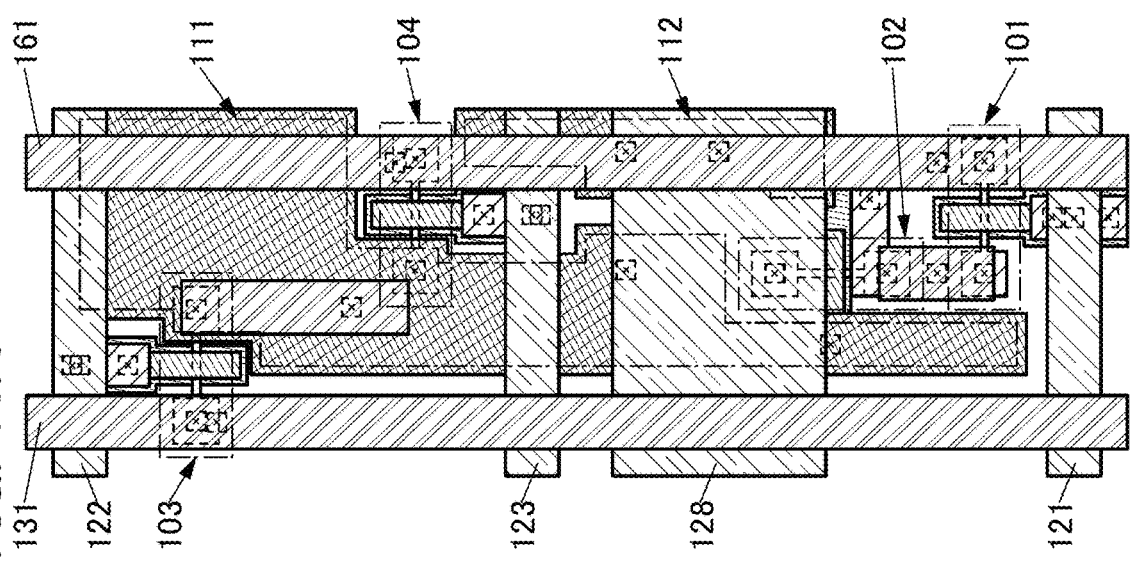

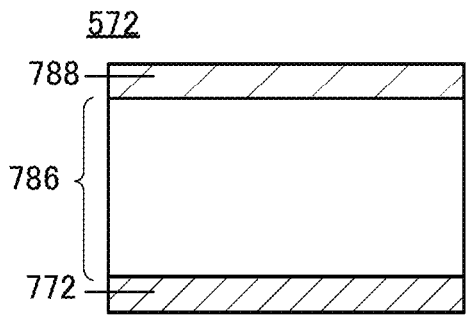
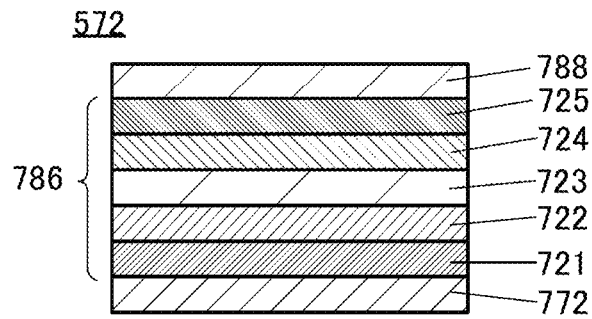
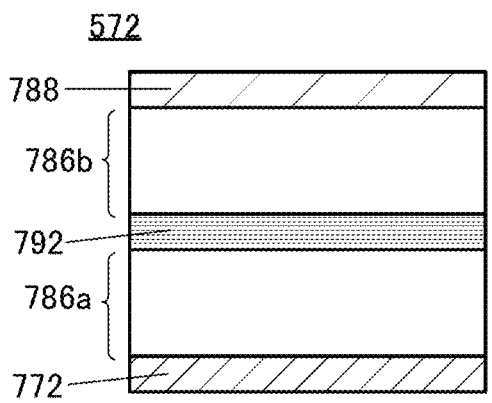
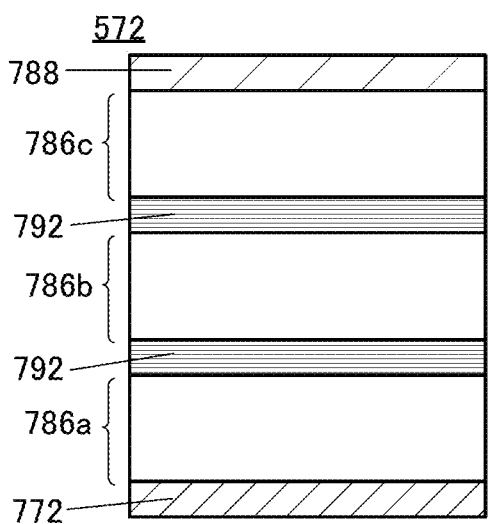
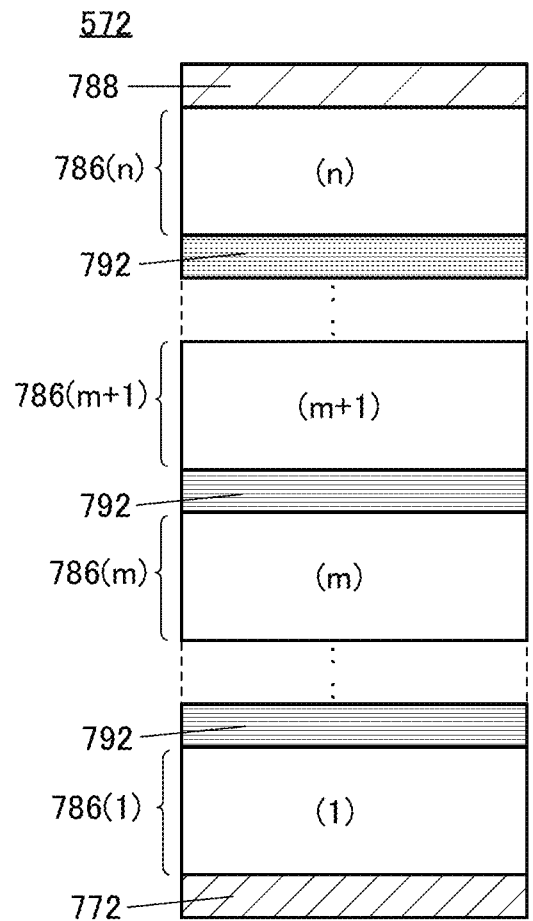

FIG. 27A
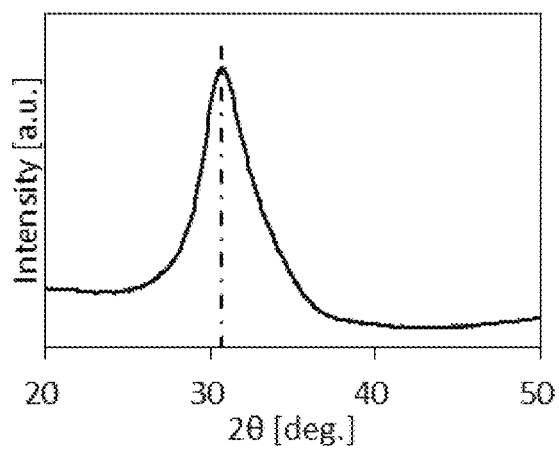
FIG. 27B
FIG. 27C
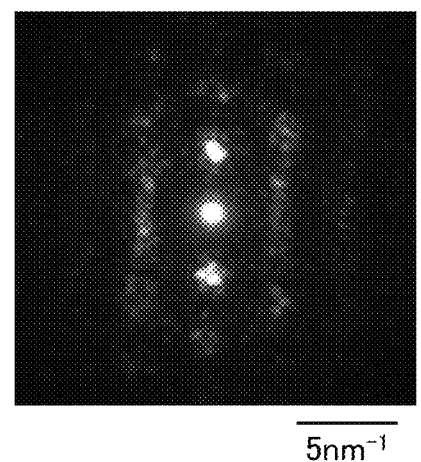

9100

9200

9101

9201

9102

9201

9201

DISPLAY APPARATUS AND ELECTRONIC DEVICE COMPRISING FIRST CAPACITOR AND SECOND CAPACITOR

This application is a 371 of international application PCT/IB2020/061798 filed on Dec. 11, 2020 which is incorporated herein by reference.

TECHNICAL FIELD

One embodiment of the present invention relates to a display apparatus and an electronic device.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility, μFE, or μ in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a transistor included in a large display apparatus. In addition, capital investment can be reduced because part of production equipment for transistors using polycrystalline silicon or amorphous silicon can be retrofitted and utilized. A transistor using a metal oxide has field-effect mobility higher than that in the case where amorphous silicon is used; thus, a high-performance display apparatus provided with a driver circuit can be achieved.

In addition, as display apparatuses for augmented reality (AR) or virtual reality (VR), wearable display apparatuses and stationary display apparatuses are becoming widespread. Examples of wearable display apparatuses include a head mounted display (HMD) and an eyeglass-type display apparatus. Examples of stationary display apparatuses include a head-up display (HUD).

In an electronic device including an imaging device, such as a digital camera, a viewfinder is used to check an image to be captured before capturing the image. An electronic viewfinder is used as the viewfinder. A display portion is provided in the electronic viewfinder, and an image obtained by an imaging device can be displayed as an image on the display portion. For example, Patent Document 2 discloses an electronic viewfinder that can provide a good visibility state from a central portion of an image to a peripheral portion of the image.

REFERENCES

Patent Documents

[Patent Document 1] Japanese Published Patent Application No. 2014-7399

[Patent Document 2] Japanese Published Patent Application No. 2012-42569

SUMMARY OF THE INVENTION

Problems to be Solved by the Invention

With a display apparatus whose display portion is close to a user, such as an HMD, the user is likely to perceive pixels and strongly feels granularity, whereby the sense of immersion or realistic feeling of AR and VR might be diminished. Therefore, a high-resolution display apparatus that has minute pixels is required so that pixels are not perceived by the user. However, the area of each pixel decreases as the resolution increases, which might reduce the number of elements such as transistors and capacitors that can be provided in the pixel. Thus, the pixel in a high-resolution display apparatus is desired to be formed with a small number of elements.

When light emitted from a display apparatus is seen, sometimes a phenomenon occurs in which the light that has been seen appears to remain even after the light goes out (also referred to as an afterimage phenomenon). When the afterimage phenomenon occurs, an image that has been displayed is perceived by a user as an afterimage, which causes a decrease in display quality. In particular, a moving image is greatly affected by the afterimage phenomenon and thus might have a significant decrease in display quality.

In view of the above, an object of one embodiment of the present invention is to provide a high-resolution display apparatus. Another object of one embodiment of the present invention is to provide a display apparatus with few afterimages. Another object of one embodiment of the present invention is to provide a display apparatus with high display quality. Another object of one embodiment of the present invention is to provide a display apparatus with low power consumption. Another object of one embodiment of the present invention is to provide a display apparatus with a narrow bezel. Another object of one embodiment of the present invention is to provide a small-size display apparatus. Another object of one embodiment of the present invention is to provide a novel display apparatus.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention is a display apparatus including a pixel portion including a plurality of pixels, a first wiring, a first scan line, a second scan line, a third scan line, and a signal line. The pixels each include a light-emitting device, a first transistor, a second transistor, a third transistor, a fourth transistor, and a first capacitor. One electrode of the light-emitting device is electrically connected to one of a source and a drain of the first transistor, one of a source and a drain of the second transistor, and one electrode of the first capacitor. A gate of the second transistor is electrically connected to the other electrode of the first capacitor, one of a source and a drain of the third transistor, and one of a source and a drain of the fourth transistor. The other of the source and the drain of the first transistor and the other of the source and the drain of the fourth transistor are each electrically connected to the first wiring having a function of supplying a first potential. A gate of the first transistor is electrically connected to the first scan line. A gate of the third transistor is electrically connected to the second scan line. A gate of the fourth transistor is electrically connected to the third scan line. The other of the source and the drain of the third transistor is electrically connected to the signal line. One frame period of each of the pixels includes a period in which the first transistor and the fourth transistor are each in a conduction state.

The display apparatus preferably includes a second capacitor. One electrode of the second capacitor is electrically connected to the gate of the second transistor, and the other electrode of the second capacitor is electrically connected to the other of the source and the drain of the second transistor.

One embodiment of the present invention is a display apparatus including a pixel portion including a plurality of pixels, a first wiring, a first scan line, a second scan line, a third scan line, and a signal line. The pixels each include a light-emitting device, a first transistor, a second transistor, a third transistor, a fourth transistor, and a first capacitor. One electrode of the light-emitting device is electrically connected to one of a source and a drain of the first transistor, one of a source and a drain of the second transistor, one of a source and a drain of the fourth transistor, and one electrode of the first capacitor. A gate of the second transistor is electrically connected to the other electrode of the first capacitor, one of a source and a drain of the third transistor, and the other of the source and the drain of the fourth transistor. The other of the source and the drain of the first transistor is electrically connected to the first wiring. A gate of the first transistor is electrically connected to the first scan line. A gate of the third transistor is electrically connected to the second scan line. A gate of the fourth transistor is electrically connected to the third scan line. The other of the source and the drain of the third transistor is electrically connected to the signal line. One frame period of each of the pixels includes a period in which the first transistor and the third transistor are each in a non-conduction state and the fourth transistor is in a conduction state.

One embodiment of the present invention is a display apparatus including a pixel portion including a plurality of pixels, a first wiring, a second wiring, a first scan line, a second scan line, a third scan line, and a signal line. The pixels each include a light-emitting device, a first transistor, a second transistor, a third transistor, a fourth transistor, and a first capacitor. One electrode of the light-emitting device is electrically connected to one of a source and a drain of the first transistor, one of a source and a drain of the second transistor, one of a source and a drain of the fourth transistor, and one electrode of the first capacitor. A gate of the second transistor is electrically connected to the other electrode of the first capacitor and one of a source and a drain of the third transistor. The other of the source and the drain of the first transistor is electrically connected to the first wiring. The other of the source and the drain of the fourth transistor is electrically connected to the second wiring. A gate of the first transistor is electrically connected to the first scan line. A gate of the third transistor is electrically connected to the second scan line. A gate of the fourth transistor is electrically connected to the third scan line. The other of the source and the drain of the third transistor is electrically connected to the signal line. One frame period of each of the pixels includes a period in which the first transistor and the third transistor are each in a non-conduction state and the fourth transistor is in a conduction state.

One embodiment of the present invention is a display apparatus including a pixel portion including a plurality of pixels, a first wiring, a first scan line, a second scan line, a third scan line, and a signal line. The pixels each include a light-emitting device, a first transistor, a second transistor, a third transistor, a fourth transistor, and a first capacitor. One electrode of the light-emitting device is electrically connected to one of a source and a drain of the fourth transistor. The other of the source and the drain of the fourth transistor is electrically connected to one of a source and a drain of the first transistor, one of a source and a drain of the second transistor, and one electrode of the first capacitor. A gate of the second transistor is electrically connected to the other electrode of the first capacitor and one of a source and a drain of the third transistor. The other of the source and the drain of the first transistor is electrically connected to the first wiring. A gate of the first transistor is electrically connected to the first scan line. A gate of the third transistor is electrically connected to the second scan line. A gate of the fourth transistor is electrically connected to the third scan line. The other of the source and the drain of the third transistor is electrically connected to the signal line. One frame period of each of the pixels includes a period in which the first transistor, the third transistor, and the fourth transistor are each in a non-conduction state.

One embodiment of the present invention is a display apparatus including a pixel portion including a plurality of pixels, a first wiring, a first scan line, a second scan line, a third scan line, and a signal line. The pixels each include a light-emitting device, a first transistor, a second transistor, a third transistor, a fourth transistor, and a first capacitor. One electrode of the light-emitting device is electrically connected to one of a source and a drain of the first transistor, one of a source and a drain of the second transistor, and one electrode of the first capacitor. A gate of the second transistor is electrically connected to the other electrode of the first capacitor and one of a source and a drain of the third transistor. The other of the source and the drain of the second transistor is electrically connected to one of a source and a drain of the fourth transistor. The other of the source and the drain of the first transistor is electrically connected to the first wiring. A gate of the first transistor is electrically connected to the first scan line. A gate of the third transistor is electrically connected to the second scan line. A gate of the fourth transistor is electrically connected to the third scan line. The other of the source and the drain of the third transistor is electrically connected to the signal line. One frame period of each of the pixels includes a period in which the first transistor, the third transistor, and the fourth transistor are each in a non-conduction state.

In the display apparatus, the second transistor preferably includes a back gate. The back gate is electrically connected to the one of the source and the drain of the second transistor.

In the display apparatus, the second transistor preferably includes a back gate. The back gate is electrically connected to the gate of the second transistor.

In the display apparatus, the other electrode of the light-emitting device is preferably electrically connected to a third wiring. The first potential is supplied to the first wiring. A third potential is supplied to the third wiring, and the third potential is preferably lower than the first potential.

In the display apparatus, the light-emitting device is preferably an organic light-emitting diode.

The display apparatus includes a first driver circuit portion, and it is preferable that the first driver circuit portion include a region overlapping with the pixel portion and be electrically connected to the signal line.

The display apparatus preferably includes a first layer and a second layer over the first layer. The first layer includes the first driver circuit portion and a second driver circuit portion, and the second layer includes the pixel portion. The second driver circuit portion is electrically connected to the first scan line.

In the display apparatus, the first transistor, the second transistor, the third transistor, and the fourth transistor each preferably include a metal oxide in a channel formation region. The metal oxide contains indium, zinc, and an element M (one or more selected from aluminum, titanium, gallium, germanium, yttrium, zirconium, lanthanum, cerium, tin, neodymium, and hafnium).

One embodiment of the present invention is an electronic device including the display apparatus and a camera.

Effect of the Invention

One embodiment of the present invention can provide a high-resolution display apparatus. Another embodiment of the present invention can provide a display apparatus with few afterimages. Another embodiment of the present invention can provide a display apparatus with high display quality. Another embodiment of the present invention can provide a display apparatus with low power consumption. Another embodiment of the present invention can provide a display apparatus with a narrow bezel. Another embodiment of the present invention can provide a small-size display apparatus. Another embodiment of the present invention can provide a novel display apparatus.

Note that the description of these effects does not preclude the existence of other effects. One embodiment of the present invention does not have to have all of these effects. Other effects can be derived from the description of the specification, the drawings, the claims, and the like.

BRIEF DESCRIPTION OF THE DRAWINGS

FIG. 11A and FIG. 11B are diagrams illustrating layout examples of a pixel.

FIG. 22A to FIG. 22E are diagrams illustrating structure examples of a light-emitting device.

FIG. 27A is a table showing classifications of crystal structures of IGZO. FIG. 27B is a graph showing an XRD spectrum of a CAAC-IGZO film. FIG. 27C is an image showing a nanobeam electron diffraction pattern of a CAAC-IGZO film.

MODE FOR CARRYING OUT THE INVENTION

Figure 1A:
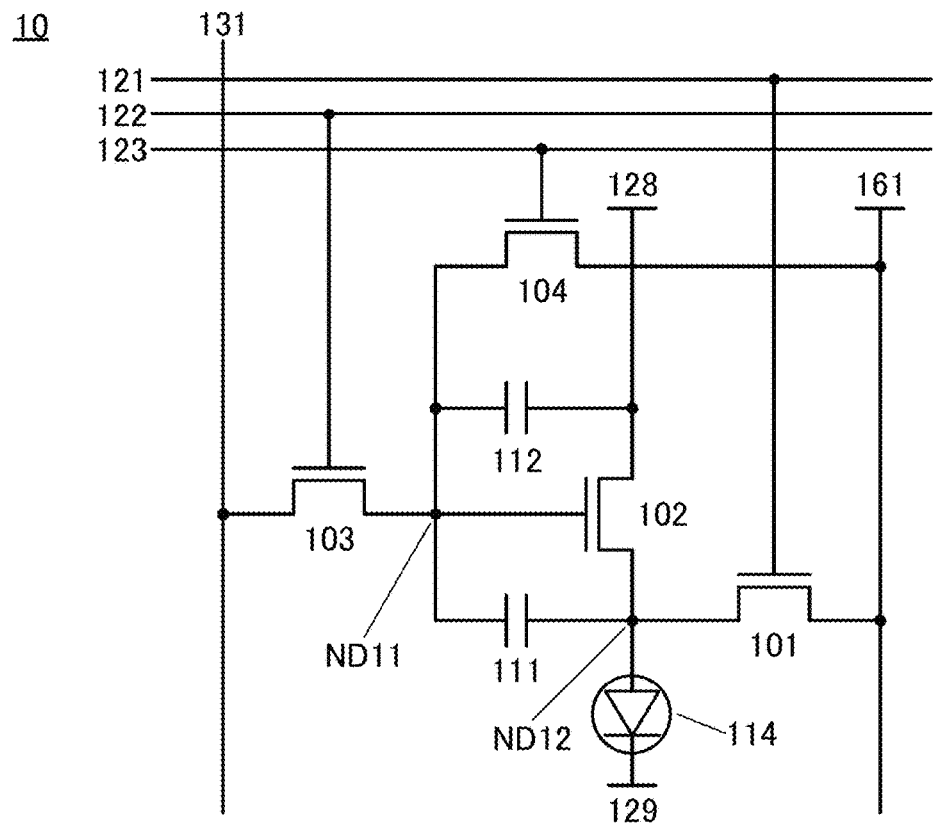
FIG. 1A and FIG. 1B are circuit diagrams illustrating configuration examples of a pixel.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the description of the embodiments below.

In each drawing described in this specification, the size, the layer thickness, or the region of each component is exaggerated for clarity in some cases.

Ordinal numbers such as "first", "second", and "third" used in this specification are used in order to avoid confusion among components and do not limit the components numerically.

In this specification and the like, terms for describing arrangement such as "over" and "under" are used for convenience to describe the positional relationship between components with reference to drawings. The positional relationship between components is changed as appropriate in accordance with a direction in which the components are described. Thus, without limitation to terms described in this specification, the description can be changed appropriately depending on the situation.

In this specification and the like, functions of a source and a drain of a transistor are sometimes switched from each other depending on the polarity of the transistor, the case where the direction of current flow is changed in circuit operation, or the like. Therefore, the terms "source" and "drain" can be used interchangeably.

In this specification and the like, the terms "electrode", "wiring", "terminal", and the like do not functionally limit those components. For example, an "electrode" is sometimes used as part of a "wiring", and vice versa. Furthermore, the term "electrode" or "wiring" can also mean the case where a plurality of "electrodes" or "wirings" are formed in an integrated manner, for example. For another example, a "terminal" is sometimes used as part of a "wiring" or an "electrode", and vice versa. Furthermore, the term "terminal" can also mean the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" depending on the case, for example.

In this specification and the like, the resistance value of a "resistor" is sometimes determined depending on the length of a wiring. Alternatively, a resistor includes a case where it can be formed by connection between a conductor used for a wiring and another conductor with a low efficiency different from that of the conductive layer through a contact. Alternatively, the resistance value is sometimes determined by doping a semiconductor with an impurity.

In this specification and the like, "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit. In addition, the expression "directly connected" includes the case where a wiring is formed in different conductive layers through a contact. Note that a wiring may be formed of conductors that contain one or more of the same elements or may be formed of conductors that contain different elements.

In this specification and the like, the term "film" and the term "layer" can be interchanged with each other. For example, in some cases, the term "conductive layer" and the term "insulating layer" can be interchanged with the term "conductive film" and the term "insulating film", respectively.

Unless otherwise specified, off-state current in this specification and the like refers to drain current of a transistor in an off state (also referred to as a non-conduction state or a cutoff state). Unless otherwise specified, an off state refers to a state where the voltage $V_{gs}$ between its gate and source is lower than the threshold voltage Vth in an n-channel transistor (higher than Vth in a p-channel transistor).

In the drawings, the size, the layer thickness, or the region is exaggerated for clarity in some cases. Therefore, they are not limited to the illustrated scale. Note that the drawings are schematic illustrations, and embodiments of the present invention are not limited to shapes or values illustrated in the drawings. For example, in an actual manufacturing process, a layer, a resist mask, or the like might be unintentionally reduced in size by treatment such as etching, which might not be reflected in the drawings for easy understanding. In the drawings, the same portions or portions having similar functions and materials are denoted by the same reference numerals in different drawings, and explanation thereof is not repeated in some cases. Furthermore, the same hatch pattern is used for the portions having similar functions and materials, and the portions are not especially denoted by reference numerals in some cases.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when an OS transistor is described, it can also be referred to as a transistor including an oxide or an oxide semiconductor.

Note that in this specification and the like, a pixel refers to one element whose brightness can be controlled, for example. Therefore, for example, one pixel expresses one color element by which brightness is expressed. Accordingly, in the case of a color display apparatus having color elements of R (red), G (green), and B (blue), a minimum unit of an image is composed of three pixels of an R pixel, a G pixel, and a B pixel. In this case, each of the RGB pixels may be referred to as a subpixel, and RGB subpixels may be collectively referred to as a pixel.

Embodiment 1

In this embodiment, a display apparatus of one embodiment of the present invention will be described.

The display apparatus of one embodiment of the present invention includes a pixel portion. The pixel portion includes a plurality of pixels, and the pixels each include a light-emitting device and a driving transistor that controls the amount of current flowing to the light-emitting device. The display apparatus of one embodiment of the present invention can have a period during which the light-emitting device is in a non-lighting state in one frame period. When the period is provided to perform black display, afterimages can be reduced and display quality can be improved.

In the display apparatus of one embodiment of the present invention, a potential "Vdata" corresponding to image data is supplied from a source driver to each pixel. In addition, a current flows to the light-emitting device through the driving transistor, and the luminance of the light-emitting device is controlled by the amount of the current. That is, the display apparatus can express gray levels of an image by the level of the potential "Vdata" supplied to the pixel.

As the resolution of the display apparatus increases, the area of each pixel becomes smaller, the light-emitting device becomes smaller, and a current needed for light emission of the light-emitting device becomes smaller. That is, as the resolution of the display apparatus increases, a current flowing from the driving transistor to the light-emitting device becomes smaller and a voltage needed to operate the driving transistor also becomes lower. However, when the range of the potential "Vdata" supplied to the pixel is reduced, a potential for one gray level becomes small, that is, a potential difference between gray levels becomes small, which makes the gray level control difficult in some cases.

The display apparatus of one embodiment of the present invention has a function of applying, to the driving transistor, a potential lower than the potential "Vdata" supplied to the pixel. Accordingly, a multi-tone image can be displayed without reducing the range of the potential "Vdata", leading to higher display quality.

<Pixel Configuration Example 1>

FIG. 1A illustrates a configuration example of a pixel 10 that can be used in a display apparatus of one embodiment of the present invention. The pixel 10 includes a light-emitting device 114, a transistor 101, a transistor 102, a transistor 103, a transistor 104, and a capacitor 111.

One electrode of the light-emitting device 114 is electrically connected to one of a source and a drain of the transistor 101, one of a source and a drain of the transistor 102, and one electrode of the capacitor 111. A gate of the transistor 102 is electrically connected to the other electrode of the capacitor 111, one of a source and a drain of the transistor 103, and one of a source and a drain of the transistor 104.

The other of the source and the drain of the transistor 101 and the other of the source and the drain of the transistor 104 are each electrically connected to a wiring 161. A gate of the transistor 101 is electrically connected to a wiring 121. A gate of the transistor 103 is electrically connected to a wiring 122. A gate of the transistor 104 is electrically connected to a wiring 123. The other of the source and the drain of the transistor 103 is electrically connected to a wiring 131.

The wiring 161 has a function of supplying "Vref" that is a specific potential (hereinafter, also referred to as a first potential or a reference potential). The wiring 121, the wiring 122, and the wiring 123 have functions of scan lines for controlling the operations of the transistor 101, the transistor 103, and the transistor 104, respectively. Scan signals supplied to the scan lines are signals for controlling the conduction state or non-conduction state (on or off) of the transistor 101, the transistor 103, and the transistor 104 functioning as switches in the pixel 10. The wiring 131 has a function of a data line supplying the potential "Vdata" corresponding to image data.

The other of the source and the drain of the transistor 102 is electrically connected to a wiring 128. The wiring 128 preferably has a function of supplying a specific potential. The other electrode of the light-emitting device 114 is electrically connected to a wiring 129. The wiring 128 and the wiring 129 can each function as a wiring (power supply line) supplied with a power supply potential. For example, the wiring 128 can function as a high potential power supply line for supplying a potential higher than that of the wiring 129. The wiring 129 can function as a low potential power supply line for supplying a potential lower than that of the wiring 128.

The transistor 102 functions as a driving transistor that controls the amount of current flowing to the light-emitting device 114. The transistor 103 functions as a selection transistor that selects a pixel. The transistor 101 and the transistor 104 each function as a switch for writing the specific potential (reference potential) "Vref" to the pixel 10.

Examples of the light-emitting device 114 include self-light-emitting devices such as a light-emitting diode (LED), an organic light-emitting diode (OLED), a light-emitting diode in which quantum dots are used in a light-emitting layer (QLED: Quantum-dot Light Emitting Diode), and a semiconductor laser.

The display apparatus of one embodiment of the present invention can have a period during which the light-emitting device is in a non-lighting state in one frame period. When the period is provided to perform black display, afterimages can be reduced and display quality can be improved.

The pixel 10 preferably further includes a capacitor 112. One electrode of the capacitor 112 is electrically connected to the gate of the transistor 102. The other electrode of the capacitor 112 is electrically connected to the other of the source and the drain of the transistor 102. When the pixel 10 includes the capacitor 112, a potential lower than the potential "Vdata" supplied to the pixel 10 can be applied to the transistor 102 functioning as the driving transistor. Accordingly, a multi-tone image can be displayed without reducing the range of the potential "Vdata", leading to higher display quality.

Here, a wiring to which the gate of the transistor 102, the one of the source and the drain of the transistor 103, the other electrode of the capacitor 111, and the other electrode of the capacitor 112 are connected is referred to as a node ND11. The node ND11 has a function of retaining a potential of the gate of the transistor 103 functioning as the driving transistor. The current flowing to the light-emitting device 114 can be controlled with the potential of the node ND11 to control the emission luminance of the light-emitting device 114. A wiring to which the one of the source and the drain of the transistor 101, the one of the source and the drain of the transistor 102, and the one electrode of the capacitor 111 are connected is referred to as a node ND12. The node ND12 has a function of retaining a potential of the one of the source and the drain of the transistor 102 functioning as the driving transistor.

In the pixel 10 illustrated in FIG. 1A, the gate and the source of the transistor 102 functioning as the driving transistor are electrically connected to each other through the capacitor 111. The gate and the drain of the transistor 102 are electrically connected to each other through the capacitor 112. The potential of the node ND11 is retained by the capacitor (the capacitor 111) between the gate and the source of the transistor 102 and the capacitor (the capacitor 112) between the gate and the drain of the transistor 102.

When the transistor 103 is brought into a conduction state, a potential supplied to the wiring 131 can be written to the node ND11. In addition, when the transistor 104 is brought into a conduction state, a potential supplied to the wiring 161 can be written to the node ND11. When the transistor 103 and the transistor 104 are brought into a non-conduction state, the potential written to the node ND11 can be retained.

When the transistor 101 is brought into a conduction state, data supplied to the wiring 161 can be written to the node ND12. When the transistor 101 is brought into a non-conduction state, the data written to the node ND12 can be retained.

A transistor having an extremely low off-state current is preferably used as at least one of the transistor 101, the transistor 102, the transistor 103, and the transistor 104. In particular, when transistors having an extremely low off-state current are used as the transistor 101, the transistor 103, and the transistor 104, the potentials of the node ND11 and the node ND12 can be retained for a long time. As the transistor, a transistor using a metal oxide in a channel formation region (hereinafter an OS transistor) can be suitably used, for example.

It is further preferable that OS transistors be used as all of the transistor 101, the transistor 102, the transistor 103, and the transistor 104. An OS transistor may be used as a transistor other than the transistor 101, the transistor 102, the transistor 103, and the transistor 104. In the case of operating within a range where the amount of leakage current is acceptable, a transistor containing silicon in a channel formation region (hereinafter a Si transistor) may be used. Alternatively, an OS transistor and a Si transistor may be used together. Examples of the Si transistor include a transistor containing amorphous silicon and a transistor containing crystalline silicon (microcrystalline silicon, low-temperature polysilicon, or single crystal silicon). Note that the transistors illustrated in FIG. 1A are all n-channel transistors, but p-channel transistors can also be used.

As a semiconductor material used for an OS transistor, a metal oxide whose energy gap is greater than or equal to 2 eV, preferably greater than or equal to 2.2 eV, further preferably greater than or equal to 2.5 eV can be used. A typical example is an oxide semiconductor containing indium, and a CAAC-OS (C-Axis Aligned Crystalline Oxide Semiconductor) or a CAC-OS (Cloud-Aligned Composite Oxide Semiconductor), each of which will be described later, can be used, for example. A CAAC-OS has a stable crystal structure and is suitable for a transistor that is required to have high reliability, for example. A CAC-OS has high mobility and is suitable for a transistor that operates at high speed, for example.

Since the semiconductor layer of an OS transistor has a large energy gap, the OS transistor can exhibit extremely low off-state current characteristics of several yA/μm (y is $10^{-24}$), which is an off-state current per micrometer of a channel width. An OS transistor has features such that impact ionization, an avalanche breakdown, a short-channel effect, and the like do not occur, which are different from those of a Si transistor, and thus enables formation of a highly reliable circuit. Moreover, variations in electrical characteristics due to crystallinity unevenness, which are caused in Si transistors, are less likely to occur in OS transistors.

The semiconductor layer included in the OS transistor can be, for example, a film represented by an In-M-Zn-based oxide that contains indium, zinc, and an element M (M is one or more of aluminum, titanium, gallium, germanium, yttrium, zirconium, lanthanum, cerium, tin, neodymium, and hafnium).

In the case where the oxide semiconductor included in the semiconductor layer is an In-M-Zn-based oxide, it is preferable that the atomic ratio of the metal elements in a sputtering target used for forming a film of the In-M-Zn oxide satisfy In≥M and Zn≥M. The atomic ratio of the metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=10:1:3, In:M:Zn=10:1:6, or In:M:Zn=10:1:8. Note that the atomic ratio in the formed semiconductor layer may vary from the above atomic ratio of metal elements in the sputtering target in a range of ±40%.

An oxide semiconductor with a low carrier concentration is used for the semiconductor layer. For example, an oxide semiconductor with a carrier concentration lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$ and higher than or equal to $1\times10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, the carrier concentration, the impurity concentration, the defect density, the atomic ratio of a metal element to oxygen, the interatomic distance, the density, and the like of the semiconductor layer are preferably set to appropriate values.

When the oxide semiconductor included in the semiconductor layer contains silicon or carbon, which is one of Group 14 elements, the number of oxygen vacancies is increased and the semiconductor layer becomes n-type. Thus, the concentration of silicon or carbon in the semiconductor layer (the concentration obtained by secondary ion mass spectrometry) is $2\times10^{18}$ atoms/cm$^3$ or lower, preferably $2\times10^{17}$ atoms/cm$^3$ or lower.

An alkali metal and an alkaline earth metal might generate carriers when bonded to a component contained in an oxide semiconductor, in which case the off-state current of the transistor might increase. Therefore, the concentration of an alkali metal or an alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor included in the semiconductor layer, electrons serving as carriers are generated in the oxide semiconductor and the carrier concentration increases; hence, the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor included in the semiconductor layer, hydrogen reacts with oxygen bonded to a metal atom contained in the oxide semiconductor to be water, and thus sometimes causes an oxygen vacancy in the oxide semiconductor. When the channel formation region in the oxide semiconductor includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect that is an oxygen vacancy into which hydrogen has entered can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor, which is obtained by secondary ion mass spectrometry (SIMS), is lower than $1\times10^{20}$ atoms/cm³, preferably lower than $1\times10^{19}$ atoms/cm³, further preferably lower than $5\times10^{18}$ atoms/cm³, still further preferably lower than $1\times10^{18}$ atoms/cm³. When an oxide semiconductor with sufficiently reduced impurities such as hydrogen is used for a channel formation region of a transistor, stable electrical characteristics can be given.

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (of the CAC-OS, an In—Ga—Zn oxide may be particularly referred to as CAC-IGZO) has a composition in which materials are separated into indium oxide (hereinafter $InO_{X1}$, where X1 is a real number greater than 0) or indium zinc oxide (hereinafter $In_{X2}Zn_{Y2}O_{Z2}$, where X2, Y2, and Z2 are real numbers greater than 0), and gallium oxide (hereinafter $GaO_{X3}$, where X3 is a real number greater than 0) or gallium zinc oxide (hereinafter $Ga_{X4}Zn_{Y4}O_{Z4}$, where X4, Y4, and Z4 are real numbers greater than 0), for instance, to form a mosaic pattern, and $InO_{X1}$ or $In_{X2}Zn_{Y2}O_{Z2}$ forming the mosaic pattern is evenly distributed in the film (this composition is also referred to as a cloud-like composition).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1\leq x0\leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that sometimes a clear boundary cannot be observed between the region containing $GaO_{X3}$ as a main component and the region containing $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under conditions where a substrate is not heated, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

For example, it can be confirmed by EDX mapping obtained using energy dispersive X-ray spectroscopy (EDX) that the CAC-OS in the In—Ga—Zn oxide has a composition in which regions containing $GaO_{X3}$ as a main component and regions containing $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are phase-separated to form a mosaic pattern.

Here, a region containing $In_{X2}Zn_{Y2}O_{Z2}$ or $InO_{X1}$ as a main component is a region whose conductivity is higher than that of a region containing $GaO_{X3}$ or the like as a main component. In other words, when carriers flow through the regions containing $In_{X2}Zn_{Y2}O_{Z2}$ or $InO_{X1}$ as a main component, the conductivity of an oxide semiconductor is exhibited. Accordingly, when the regions containing $In_{X2}Zn_{Y2}O_{Z2}$ or $InO_{X1}$ as a main component are distributed in an oxide semiconductor like a cloud, high field-effect mobility (μ) can be achieved.

By contrast, a region containing $GaO_{X3}$ or the like as a main component is a region whose insulating property is higher than that of a region containing $In_{X2}Zn_{Y2}O_{Z2}$ or $InO_{X1}$ as a main component. In other words, when the regions containing $GaO_{X3}$ or the like as a main component are distributed in an oxide semiconductor, a leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using a CAC-OS has high reliability. Thus, the CAC-OS is suitable as a constituent material of a variety of semiconductor devices.

Figure 1B:
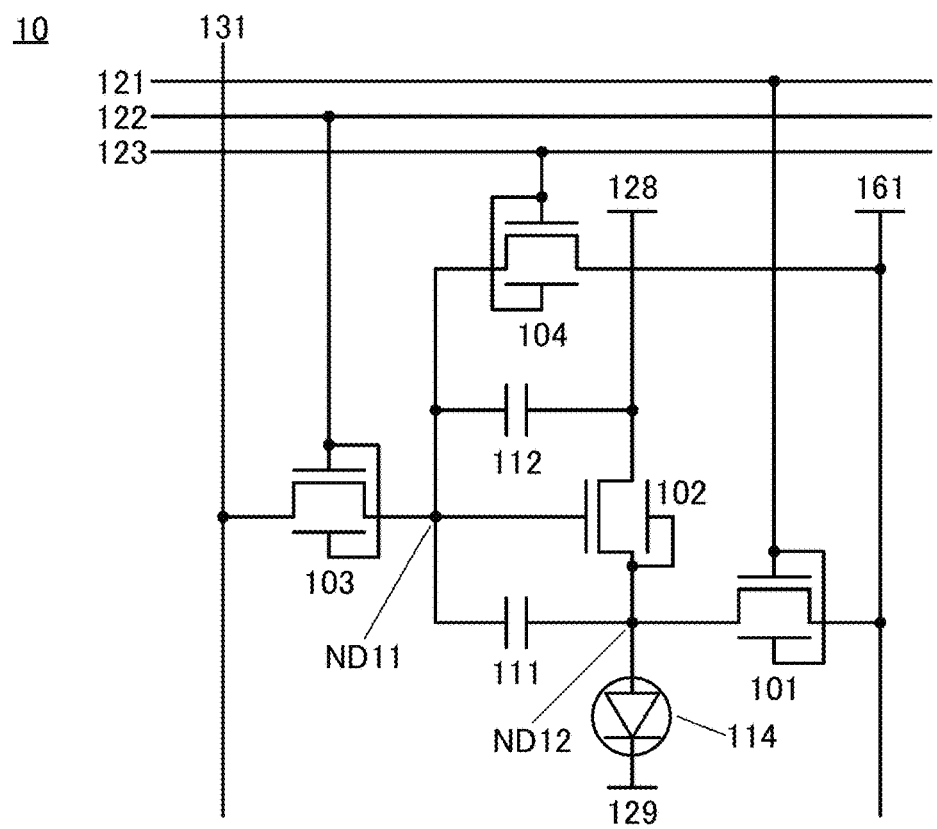

FIG. 1B illustrates a configuration different from that of the pixel 10 illustrated in FIG. 1A.

As illustrated in FIG. 1B, the transistor 101, the transistor 102, the transistor 103, and the transistor 104 may each include a back gate. In particular, the transistor 102 functioning as the driving transistor of the light-emitting device 114 preferably includes a back gate. FIG. 1B illustrates a configuration in which the back gate of the transistor 102 is electrically connected to one of the source and the drain of the transistor 102, offering an effect of improving of the saturation in transistor characteristics. In the illustrated structure, the back gates of the transistor 101, the transistor 103, and the transistor 104 are electrically connected to their respective gates (referred to as front gates in some cases), offering an effect of increasing the on-state current.

The back gate of the transistor 102 may be electrically connected to the front gate. Such a structure has an effect of increasing the on-state current of the transistor 102. The back gate may be electrically connected to a wiring capable of supplying a constant potential so that the threshold voltage of the transistor can be controlled. Note that although all of the transistors include back gates in FIG. 1B, one or more transistors without a back gate may be included.

Figure 2:
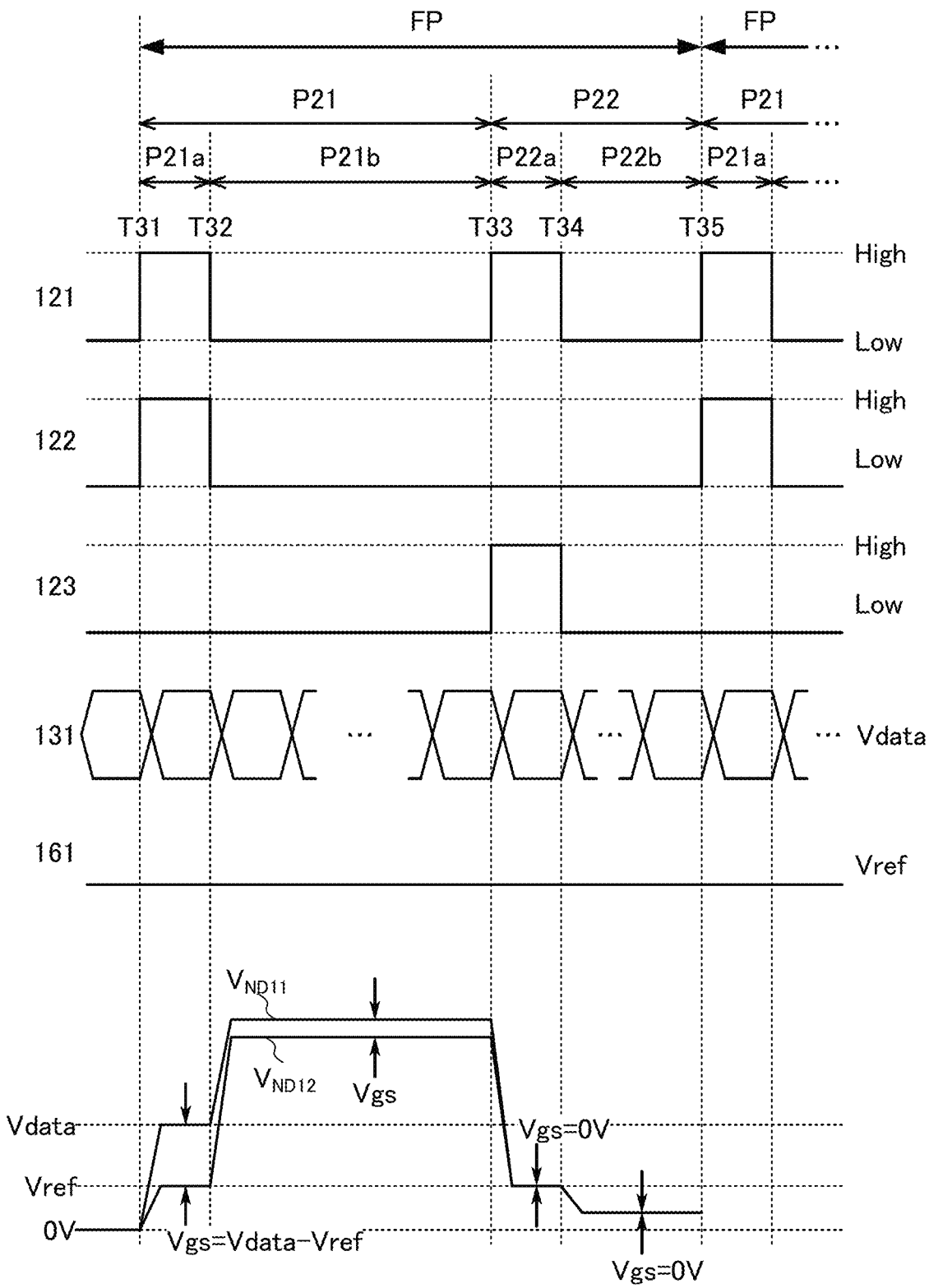
FIG. 2 is a timing chart showing the operation of a pixel circuit.

An operation example of the pixel 10 will be described using a timing chart shown in FIG. 2. FIG. 2 also shows changes in a potential $V_{ND11}$ of the node ND11 and a potential $V_{ND12}$ of the node ND12.

In the following description, a high potential is represented by "High" and a low potential is represented by "Low". A potential corresponding to image data is represented by "Vdata", and the potential of the wiring 161 is represented by "Vref". As "Vref", 0 V, a GND potential, or a specific reference potential can be used, for example. In addition, the potential of the wiring 128 is represented by "Vano". For example, "Vano" is preferably set to a potential at which the transistor 102 operates in a saturation region when luminance of the light-emitting device 114 is maximum. In addition, the potential of the wiring 129 is represented by "Vcath". "Vcath" is preferably a potential at which the light-emitting device 114 does not emit light at the time when the potential of the node ND12 is minimum.

First, at Time T31, the potential of the wiring 121 is set to "High", the potential of the wiring 122 is set to "High", the potential of the wiring 123 is set to "Low", the potential of the wiring 131 is set to "Vdata", and the potential of the wiring 161 is set to "Vref", so that the transistor 101 and the transistor 103 are brought into a conduction state, and the potential "Vdata" of the wiring 131 is written to the node ND11 and the potential "Vref" of the wiring 161 is written to the node ND12.

At this time, when a difference between potentials applied to both terminals of the capacitor 111 is V1, the potential difference V1 can be expressed by Formula (1). Similarly, when a difference between potentials applied to both terminals of the capacitor 112 is V2, the potential difference V2 can be expressed by Formula (2). A voltage Vgs between the gate and the source of the transistor 102 is a difference between the potential $V_{ND11}$ of the node ND11 and the potential $V_{ND12}$ of the node ND12, and the voltage Vgs can be expressed by Formula (3).

$$V1 = V\text{data} - V\text{ref} \quad (1)$$

$$V2 = V\text{ano} - V\text{data} \quad (2)$$

$$Vgs = V\text{data} - V\text{ref} \quad (3)$$

Next, at Time T32, the potential of the wiring 121 is set to "Low", the potential of the wiring 122 is set to "Low", and the potential of the wiring 123 is set to "Low", so that the transistor 101 and the transistor 103 are brought into a non-conduction state. The voltage Vgs between the gate and the source of the transistor 102 becomes a voltage retained in the capacitor 111 and the capacitor 112, and a current corresponding to the voltage Vgs flows to the light-emitting device 114. Accordingly, the light-emitting device 114 is turned on. The luminance of the light-emitting device 114 can be controlled by the amount of the current flowing to the light-emitting device 114.

At this time, the potential $V_{ND12}$ of the node ND12 increases until the current flowing through the light-emitting device 114 and the current flowing through the transistor 102 become equal to each other. In addition, with the increasing potential $V_{ND12}$ of the node ND12, the potential $V_{NDn11}$ of the node ND11 also increases through the capacitor 111. In the pixel 10 of one embodiment of the present invention, the amount of increase in the potential $V_{ND11}$ of the node ND11 can be made small owing to the capacitor 112. Accordingly, the difference between the potential $V_{ND11}$ of the node ND11 and the potential $V_{ND12}$ of the node ND12 is made small. That is, the voltage Vgs between the gate and the source of the transistor 102 can be made small.

The potential $V_{ND12}$ of the node ND12 is determined depending on the operating points of the transistor 102 and the light-emitting device 114. When the potential $V_{ND12}$ of the node ND12 changes from Vref to V0, the capacitance of the capacitor 111 is $C_{11}$, and the capacitance of the capacitor 112 is $C_{112}$, the potential $V_{ND11}$ of the node ND11 can be expressed by Formula (4). The voltage Vgs between the gate and the source of the transistor 102 can be expressed by Formula (5). As shown in Formula (5), by changing the ratio of the capacitance $C_{111}$ of the capacitor 111 to the capacitance $C_{112}$ of the capacitor 112, the voltage Vgs between the gate and the source of the transistor 102 can be changed.

$$V_{ND11} = V\text{data} + (C_{111}/(C_{111}+C_{112})) \times (V0 - V\text{ref}) \quad (4)$$

$$Vgs = V\text{data} - (C_{111}/(C_{111}+C_{112})) \times V\text{ref} - (C_{112}/(C_{111}+C_{112})) \times V0 \quad (5)$$

Period P21*a* between Time T31 and Time T32 is a period in which data for making the light-emitting device 114 emit light is written, and Period P21*b* between Time T32 and Time T33 is a period during which the light-emitting device 114 emits light. Period P21 between Time T31 and Time T33, i.e., a period combining Period P21*a* and Period P21*b*, can be referred to as a lighting period or a light-emitting period. Note that in this specification and the like, a ratio of Period P21 to one frame period FP is referred to as duty (Duty) in some cases. The duty is a ratio of the period in which data for making the light-emitting device 114 emit light is written and the period during which the light-emitting device 114 emits light, to the one frame period FP.

Note that a configuration may be employed in which the light-emitting device 114 emits light during Period P21*a*. Alternatively, a configuration may be employed in which the light-emitting device 114 does not emit light during Period P21*a*. In the case of employing the configuration in which the light-emitting device 114 does not emit light during Period P21*a*, the potential "Vcach" of the wiring 129 and the potential "Vref" of the wiring 161 can be set such that a difference "Vref–Vcath" between the potential of the wiring 129 and the potential of the wiring 161 does not exceed the threshold voltage of the light-emitting device 114.

Next, at Time T33, the potential of the wiring 121 is set to "High", the potential of the wiring 122 is set to "Low", and the potential of the wiring 123 is set to "High", so that the transistor 101 and the transistor 104 are brought into a conduction state and the transistor 101 and the transistor 104 are brought into a conduction state. The potential "Vref" of the wiring 131 is written to the node ND11 and the potential "Vref" of the wiring 131 is written to the node ND12, so that the potential $V_{ND11}$ of the node ND11 and the potential $V_{ND12}$ of the node ND12 become equal to each other.

Accordingly, the voltage Vgs between the gate and the source of the transistor 102 becomes 0 V, whereby the light-emitting device 114 can be turned off to display black (hereinafter also referred to as black display or black insertion).

Then, at Time T34, the potential of the wiring 121 is set to "Low", the potential of the wiring 122 is set to "Low", and the potential of the wiring 123 is set to "Low", so that the transistor 101, the transistor 103, and the transistor 104 are brought into a non-conduction state. The light-emitting device 114 remains in a non-lighting state.

Then, the one frame operation is completed at Time T35. Time T35 corresponds to Time T31 of next frame, and the next frame operation starts from Time T35.

Period P22*a* between Time T33 and Time T34 is a period in which data for turning off the light-emitting device 114 is written, and Period P22*b* between Time T34 and Time T35 is a period during which the light-emitting device 114 is in a non-lighting state. Period P22 between Time T33 and Time T35, i.e., a period combining Period P22*a* and Period P22*b*, can be referred to as a non-lighting period or a non-light-emitting period.

The display apparatus of one embodiment of the present invention can reduce afterimages by having the non-lighting period (Period P22) to perform black display in one frame period, thereby improving the display quality.

<Pixel Configuration Example 2>

Figure 3A:
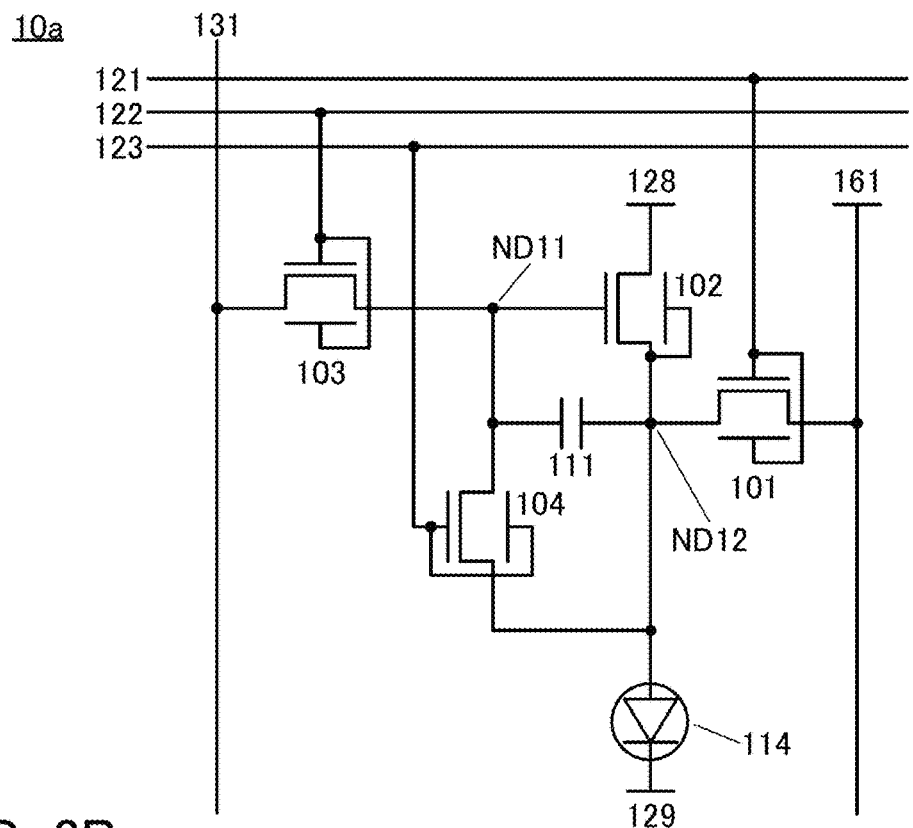
FIG. 3A is a circuit diagram illustrating a configuration example of a pixel.

FIG. 3A illustrates a configuration different from that of the pixel 10 illustrated in FIG. 1B.

A pixel 10*a* illustrated in FIG. 3A is different from the pixel 10 illustrated in FIG. 1B in that the capacitor 112 is not provided, the one of the source and the drain of the transistor 104 is electrically connected to the one electrode of the light-emitting device 114 not through the capacitor 111, and the other of the source and the drain of the transistor 104 is electrically connected to the gate of the transistor 102. Note that the description of the pixel 10 illustrated in FIG. 1B can be referred to for the connection relationship among the light-emitting device 114, the transistor 101, the transistor 102, the transistor 103, and the capacitor 111 and connection relationship between these elements and the wirings; thus, the detailed description thereof is omitted.

Figure 3B:
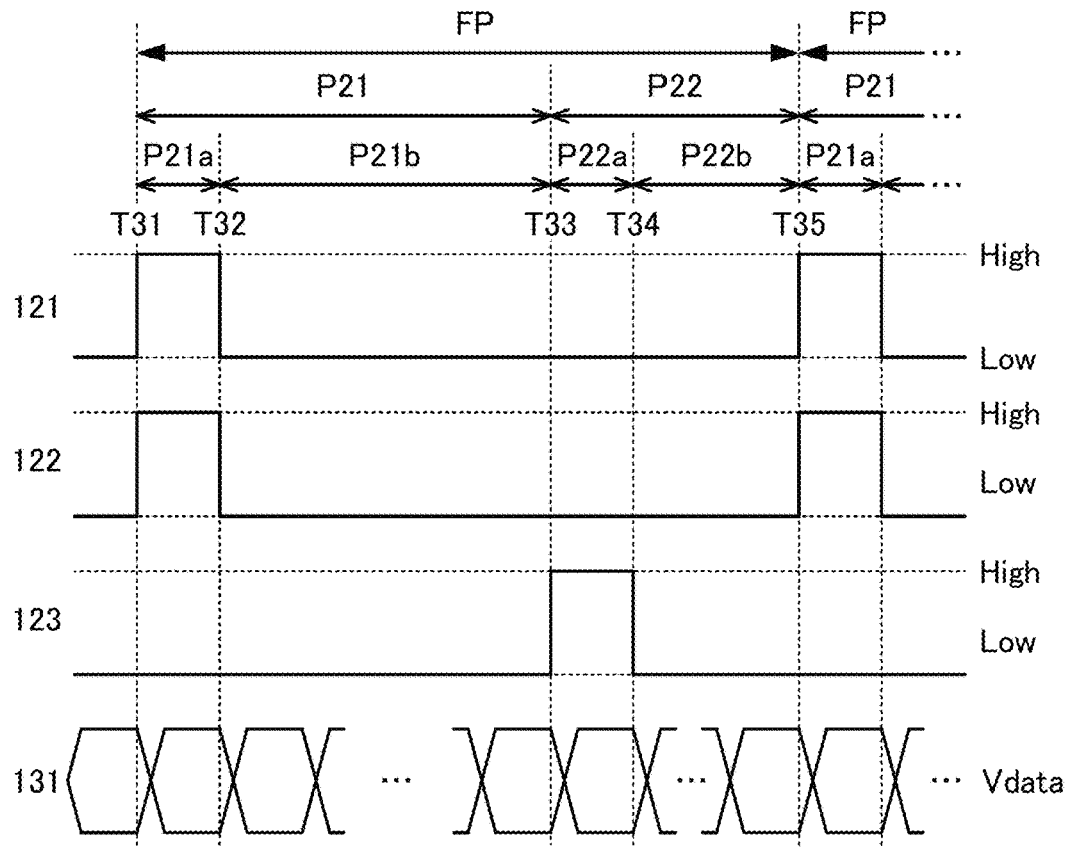
FIG. 3B is a timing chart showing the operation of a pixel circuit.

An operation example of the pixel 10*a* will be described using a timing chart shown in FIG. 3B. Since the description of FIG. 2 can be referred to for the wiring 161, the wiring 161 is omitted in FIG. 3B.

First, at Time T31, the potential of the wiring 121 is set to "High", the potential of the wiring 122 is set to "High", the potential of the wiring 123 is set to "Low", the potential of the wiring 131 is set to "Vdata", and the potential of the wiring 161 is set to "Vref", so that the transistor 101 and the transistor 103 are brought into a conduction state, and the potential "Vdata" of the wiring 131 is written to the node ND11 and the potential "Vref" of the wiring 161 is written to the node ND12.

Next, at Time T32, the potential of the wiring 121 is set to "Low", the potential of the wiring 122 is set to "Low", and the potential of the wiring 123 is set to "Low", so that the transistor 101 and the transistor 103 are brought into a non-conduction state. The voltage Vgs between the gate and the source of the transistor 102 becomes a voltage retained in the capacitor 111, and a current corresponding to the voltage Vgs flows to the light-emitting device 114. Accordingly, the light-emitting device 114 is turned on. The luminance of the light-emitting device 114 can be controlled by the amount of the current flowing to the light-emitting device 114.

Next, at Time T33, the potential of the wiring 121 is set to "Low", the potential of the wiring 122 is set to "Low", and the potential of the wiring 123 is set to "High", so that the transistor 101 and the transistor 103 are in a non-conduction state and the transistor 104 is brought into a conduction state. When the transistor 104 is brought into a conduction state, the node ND11 and the node ND12 are electrically connected to each other through the transistor 104, so that the potential $V_{ND11}$ of the node ND11 and the potential $V_{ND12}$ of the node ND12 become equal to each other. That is, the voltage Vgs between the gate and the source of the transistor 102 becomes 0 V, whereby the light-emitting device 114 is turned off to perform black display.

Then, at Time T34, the potential of the wiring 121 is set to "Low", the potential of the wiring 122 is set to "Low", and the potential of the wiring 123 is set to "Low", so that the transistor 101, the transistor 103, and the transistor 104 are brought into a non-conduction state. The light-emitting device 114 remains in a non-lighting state.

<Pixel Configuration Example 3>

Figure 4A:
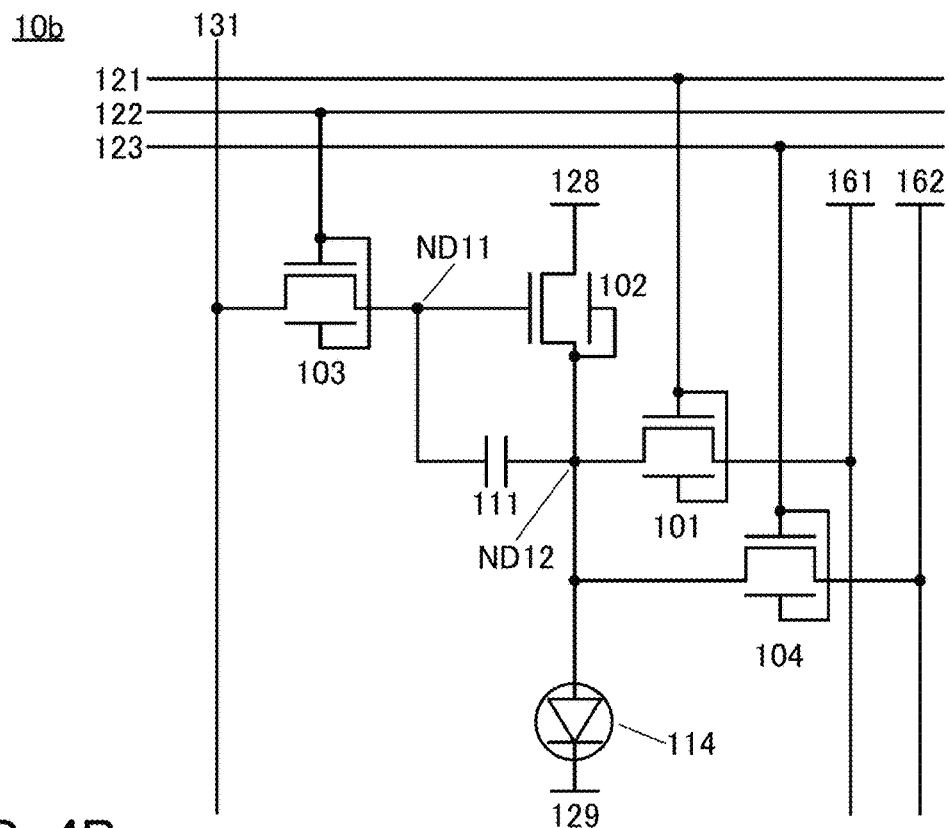
FIG. 4A is a circuit diagram illustrating a configuration example of a pixel.

FIG. 4A illustrates a configuration different from that of the pixel 10 illustrated in FIG. 1B.

A pixel 10b illustrated in FIG. 4A is different from the pixel 10 illustrated in FIG. 1B in that the capacitor 112 is not provided, a wiring 162 is provided, the one of the source and the drain of the transistor 104 is electrically connected to the one electrode of the light-emitting device 114 not through the capacitor 111, and the other of the source and the drain of the transistor 104 is electrically connected to the wiring 162. Note that the description of the pixel 10 illustrated in FIG. 1B can be referred to for the connection relationship among the light-emitting device 114, the transistor 101, the transistor 102, the transistor 103, and the capacitor 111 and connection relationship between these elements and the wirings; thus, the detailed description thereof is omitted.

The wiring 162 has a function of supplying a specific potential (hereinafter also referred to as a second potential). As the potential of the wiring 162, 0 V, a GND potential, or a specific reference potential can be used, for example.

Figure 4B:
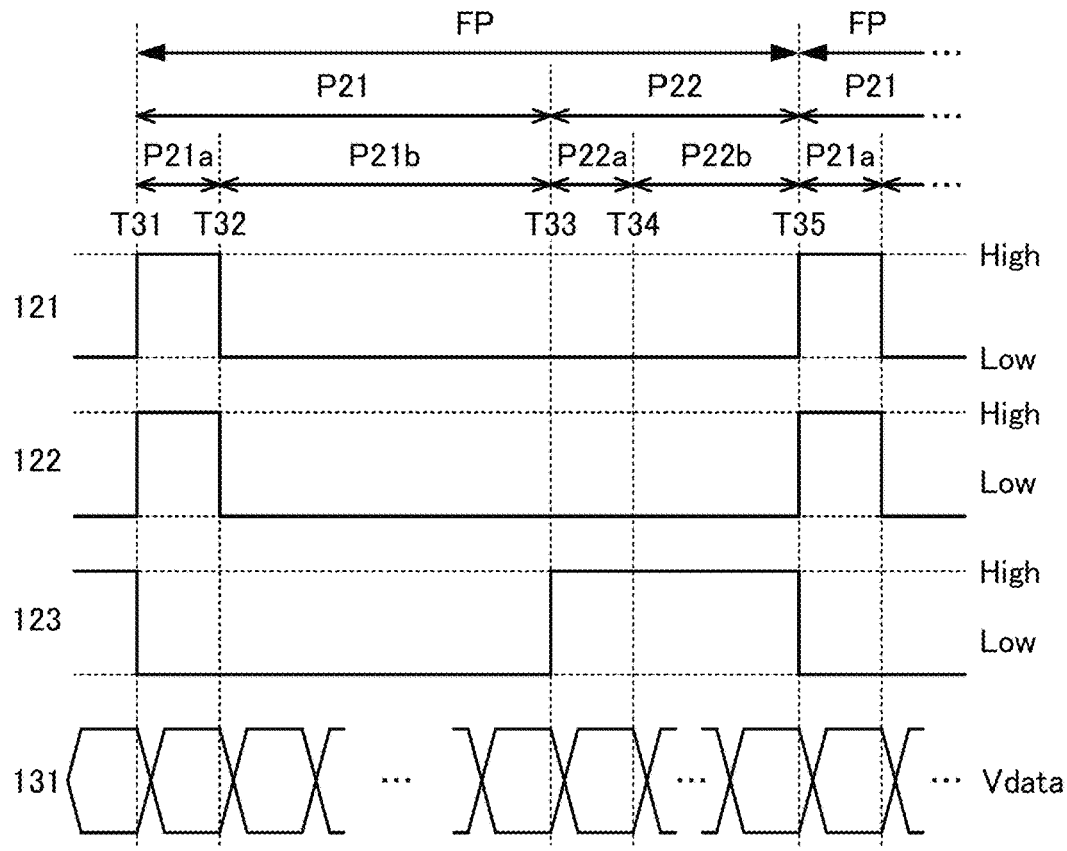
FIG. 4B is a timing chart showing the operation of a pixel circuit.

An operation example of the pixel 10b will be described using a timing chart shown in FIG. 4B. Since the description of FIG. 2 can be referred to for the wiring 161, the wiring 161 is omitted in FIG. 4B.

First, at Time T31, the potential of the wiring 121 is set to "High", the potential of the wiring 122 is set to "High", the potential of the wiring 123 is set to "Low", the potential of the wiring 131 is set to "Vdata", and the potential of the wiring 161 is set to "Vref", so that the transistor 101 and the transistor 103 are brought into a conduction state, and the potential "Vdata" of the wiring 131 is written to the node ND11 and the potential "Vref" of the wiring 161 is written to the node ND12.

Next, at Time T32, the potential of the wiring 121 is set to "Low", the potential of the wiring 122 is set to "Low", and the potential of the wiring 123 is set to "Low", so that the transistor 101 and the transistor 103 are brought into a non-conduction state. The voltage Vgs between the gate and the source of the transistor 102 becomes a voltage retained in the capacitor 111, and a current corresponding to the voltage Vgs flows to the light-emitting device 114 to turn on the light-emitting device 114. The luminance of the light-emitting device 114 can be controlled by the amount of the current flowing to the light-emitting device 114.

Then, at Time T33, the potential of the wiring 121 is set to "Low", the potential of the wiring 122 is set to "Low", and the potential of the wiring 123 is set to "High", so that the transistor 101 and the transistor 103 are in a non-conduction state and the transistor 104 is brought into a conduction state. The potential of the wiring 162 is preferably a potential at which the light-emitting device 114 does not emit light. When the potential of the wiring 162 is set to a potential at which the light-emitting device 114 does not emit light, a current flowing through the transistor 102 flows to the wiring 162 through the transistor 104, so that the light-emitting device 114 is turned off to perform black display. The wiring 162 has a function of supplying a current to flow through the transistor 102 in Period P22. Note that in the period during which the potential of the wiring 123 is "High", the light-emitting device 114 is in a non-lighting state.

Although FIG. 4A illustrates a configuration in which the other of the source and the drain of the transistor 101 is electrically connected to the wiring 161 and the other of the source and the drain of the transistor 104 is electrically connected to the wiring 162, one embodiment of the present invention is not limited thereto. The wiring 162 is not necessarily provided, and the other of the source and the drain of the transistor 101 and the other of the source and the drain of the transistor 104 may both be electrically connected to the wiring 161.

<Pixel Configuration Example 4>

Figure 5A:
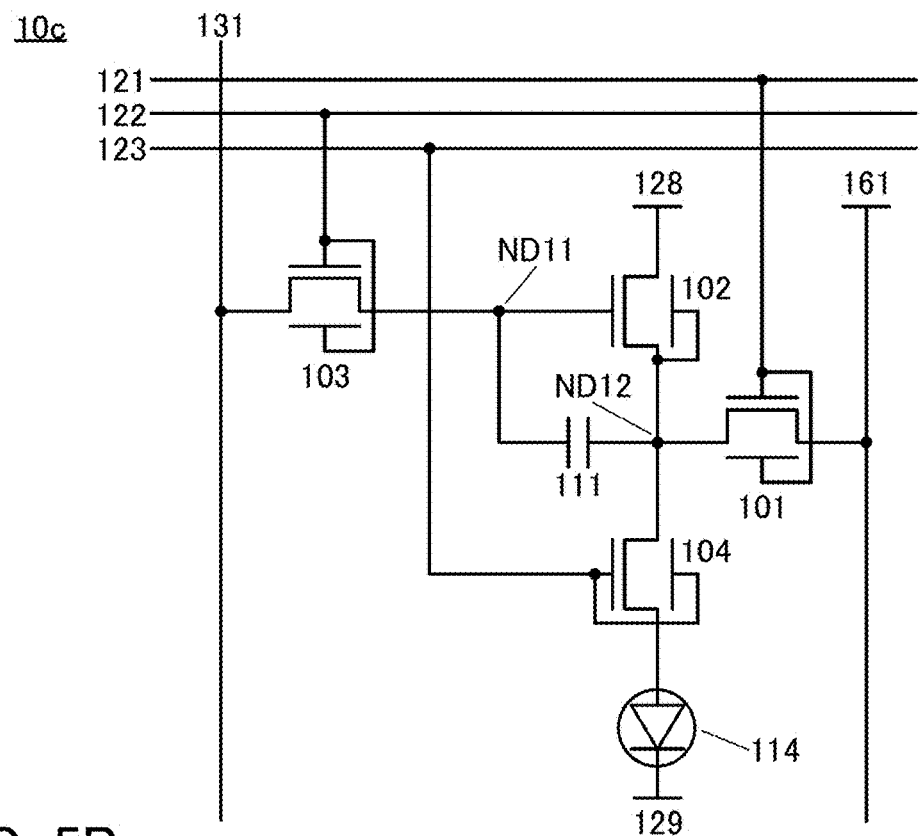
FIG. 5A and FIG. 5B are circuit diagrams illustrating configuration examples of pixels.
Figure 5B:
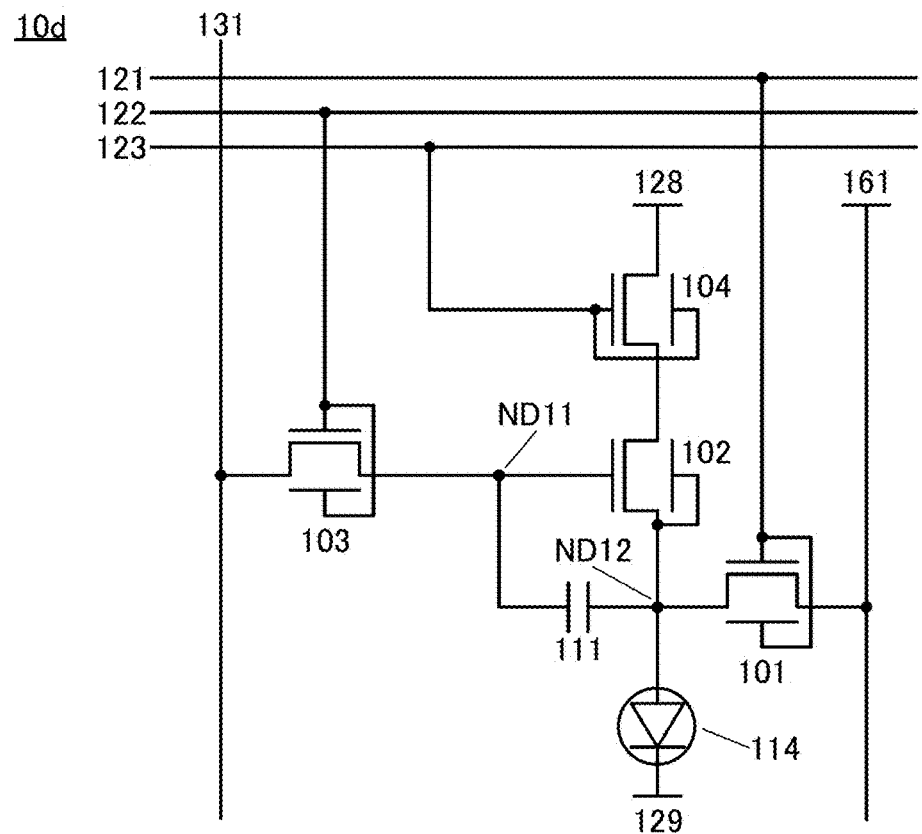

FIG. 5A and FIG. 5B each illustrate a configuration different from that of the pixel 10 illustrated in FIG. 1B.

A pixel 10c illustrated in FIG. 5A is different from the pixel 10 illustrated in FIG. 1B in that the capacitor 112 is not provided, the one of the source and the drain of the transistor 104 is electrically connected to the one electrode of the light-emitting device 114 not through the capacitor 111, and the other of the source and the drain of the transistor 104 is electrically connected to the one of the source and the drain of the transistor 101.

A pixel 10d illustrated in FIG. 5B is different from the pixel 10 illustrated in FIG. 1B in that the capacitor 112 is not provided, the one of the source and the drain of the transistor 104 is electrically connected to other of the source and the drain of the transistor 102, and the other of the source and the drain of the transistor 104 is electrically connected to the wiring 128.

Note that the description of the pixel 10 illustrated in FIG. 1B can be referred to for the connection relationship among the light-emitting device 114, the transistor 101, the transistor 102, the transistor 103, and the capacitor 111 and connection relationship between these elements and the wirings; thus, the detailed description thereof is omitted.

Figure 6:
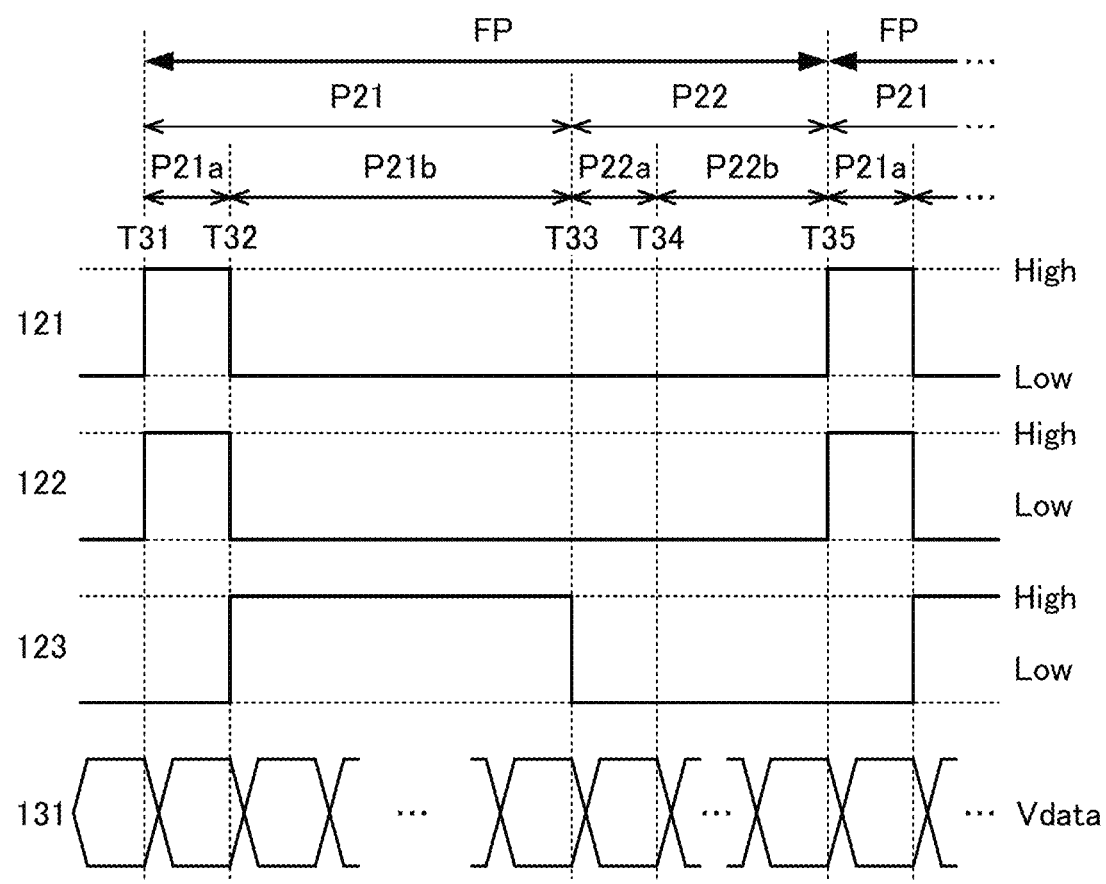
FIG. 6 is a timing chart showing the operation of a pixel circuit.

An operation example of the pixel 10c and the pixel 10d will be described using a timing chart shown in FIG. 6. Since the description of FIG. 2 can be referred to for the wiring 161, the wiring 161 is omitted in FIG. 6.

First, at Time T31, the potential of the wiring 121 is set to "High", the potential of the wiring 122 is set to "High", the potential of the wiring 123 is set to Low", the potential of the wiring 131 is set to "Vdata", and the potential of the wiring 161 is set to "Vref", so that the transistor 101 and the transistor 103 are brought into a conduction state, and the potential "Vdata" of the wiring 131 is written to the node ND11 and the potential "Vref" of the wiring 161 is written to the node ND12.

Then, at Time T32, the potential of the wiring 121 is set to "Low", the potential of the wiring 122 is set to "Low", and the potential of the wiring 123 is set to "High", so that the transistor 101 and the transistor 103 are brought into a non-conduction state and the transistor 104 is brought into a conduction state. The voltage Vgs between the gate and the source of the transistor 102 becomes a voltage retained in the capacitor 111, and a current corresponding to the voltage Vgs flows to the light-emitting device 114 to turn on the light-emitting device 114. The luminance of the light-emitting device 114 can be controlled by the amount of the current flowing to the light-emitting device 114.

Next, at Time T33, the potential of the wiring 121 is set to "Low", the potential of the wiring 122 is set to "Low", and the potential of the wiring 123 is set to "Low", so that the transistor 101, the transistor 103, and the transistor 104 are brought into a non-conduction state. When the transistor 104 is brought into a non-conduction state, a current does not flow to the light-emitting device 114, whereby the light-emitting device 114 can be turned off to display black (also referred to as black display or black insertion).

<Pixel Configuration Example 5>

Figure 7A:
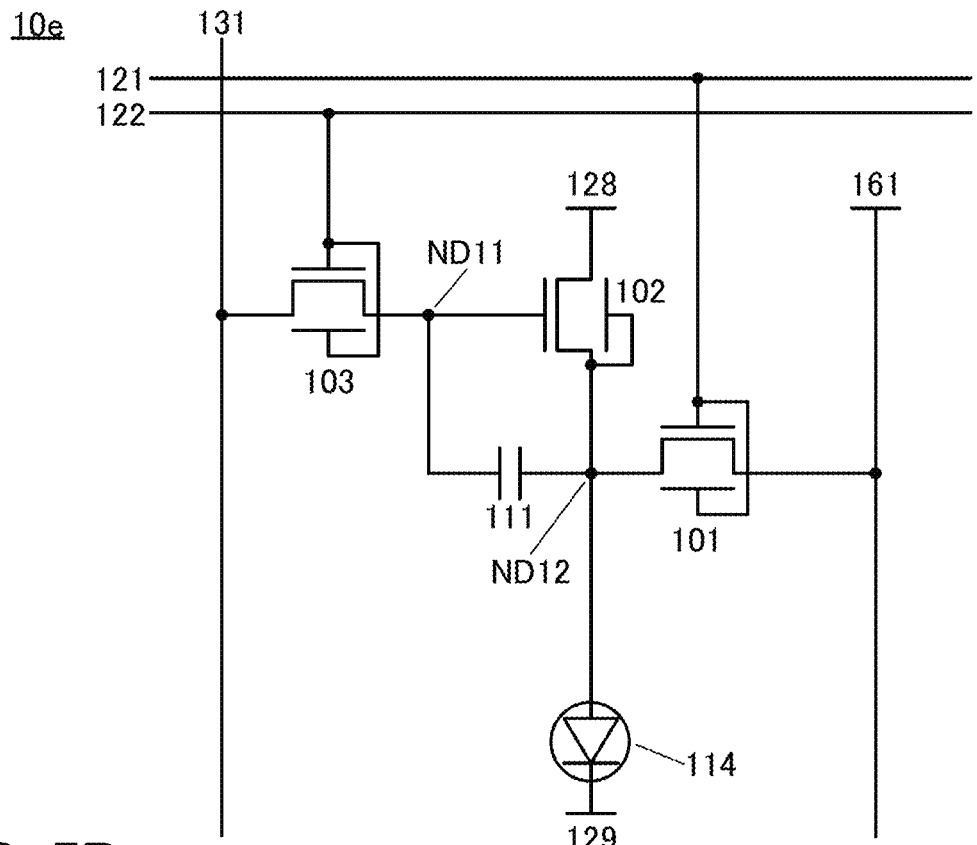
FIG. 7A is a circuit diagram illustrating a configuration example of a pixel.

FIG. 7A illustrates a configuration different from that of the pixel 10 illustrated in FIG. 1B.

A pixel 10e illustrated in FIG. 7A is different from the pixel 10 illustrated in FIG. 1B in that the transistor 104, the capacitor 112, and the wiring 123 are not provided. Note that the description of the pixel 10 illustrated in FIG. 1B can be referred to for the connection relationship among the light-emitting device 114, the transistor 101, the transistor 102, the transistor 103, and the capacitor 111 and connection relationship between these elements and the wirings; thus, the detailed description thereof is omitted.

Figure 7B:
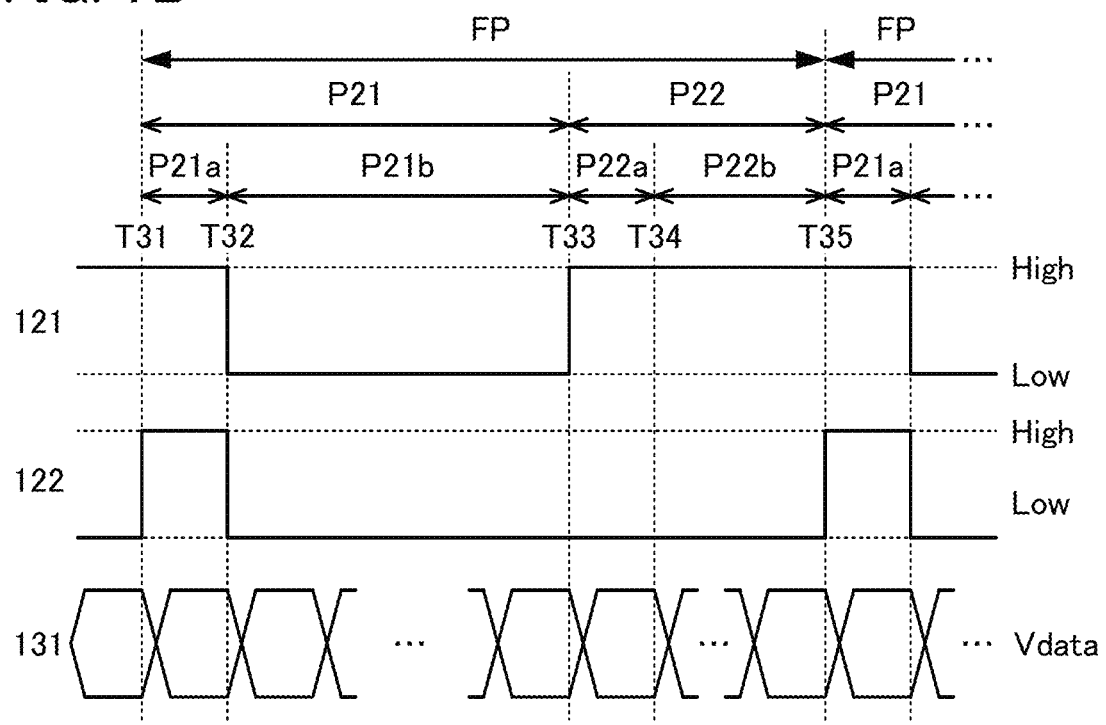
FIG. 7B is a timing chart showing the operation of a pixel circuit.

An operation example of the pixel 10e will be described using a timing chart shown in FIG. 7B. Since the description of FIG. 2 can be referred to for the wiring 161, the wiring 161 is omitted in FIG. 7B.

First, at Time T31, the potential of the wiring 121 is set to "High", the potential of the wiring 122 is set to "High", the potential of the wiring 131 is set to "Vdata", and the potential of the wiring 161 is set to "Vref", so that the transistor 101 and the transistor 103 are brought into a conduction state, and the potential "Vdata" of the wiring 131 is written to the node ND11 and the potential "Vref" of the wiring 161 is written to the node ND12.

Next, at Time T32, the potential of the wiring 121 is set to "Low" and the potential of the wiring 122 is set to "Low", so that the transistor 101 and the transistor 103 are brought into a non-conduction state. The voltage Vgs between the gate and the source of the transistor 102 becomes a voltage retained in the capacitor 111, and a current corresponding to the voltage Vgs flows to the light-emitting device 114 to turn on the light-emitting device 114. The luminance of the light-emitting device 114 can be controlled by the amount of the current flowing to the light-emitting device 114.

Then, at Time T33, the potential of the wiring 121 is set to "High" and the potential of the wiring 122 is set to "Low", so that the transistor 101 is brought into a conduction state and the transistor 103 is in a non-conduction state. The potential "Vref" of the wiring 161 is written to the node ND12, so that the light-emitting device 114 is turned off to perform black display. The potential "Vcach" of the wiring 129 and the potential "Vref" of the wiring 161 are set such that the difference "Vref-Vcath" between the potential of the wiring 129 and the potential of the wiring 161 does not exceed the threshold voltage of the light-emitting device 114. Note that in the period during which the potential of the wiring 121 is "High", the light-emitting device is in a non-lighting state.

The pixel 10e illustrated in FIG. 7A includes a smaller number of transistors, capacitors, and wirings than the pixel 10 to the pixel 10d described above, and thus can be favorably used for a high-resolution display apparatus with small pixels.

<Operation Example of Display Apparatus>

Operation examples of a display apparatus of one embodiment of the present invention will be described with reference to FIG. 8A to FIG. 8C.

The display apparatus of one embodiment of the present invention includes a plurality of pixels arranged in a matrix of m rows and n columns (each of m and n is independently an integer of 1 or more). The pixel 10, the pixel 10a, the pixel 10b, the pixel 10c, the pixel 10d, or the pixel 10e described above can be used as the pixel.

Figure 8A:
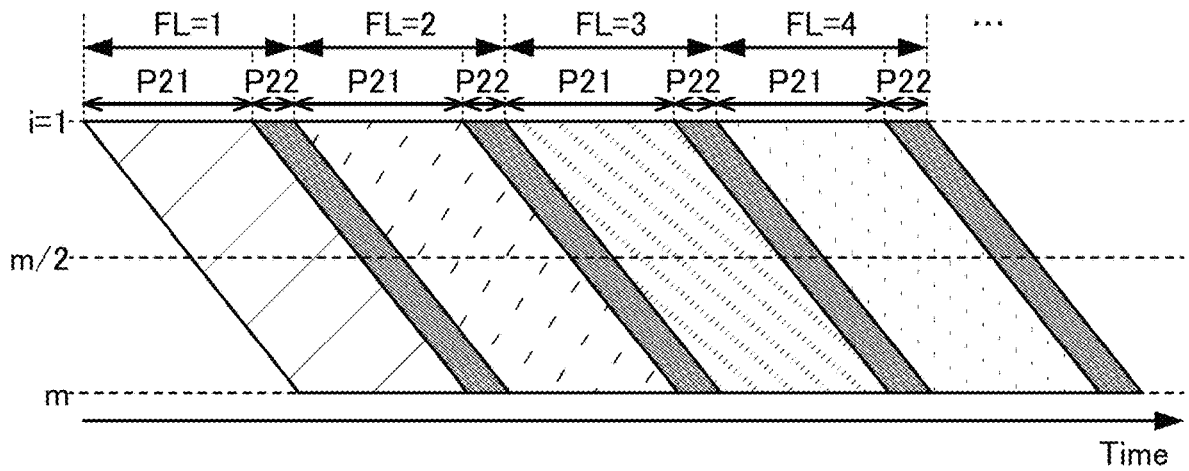
FIG. 8A to FIG. 8C are diagrams showing operations of a display apparatus.
Figure 8B:
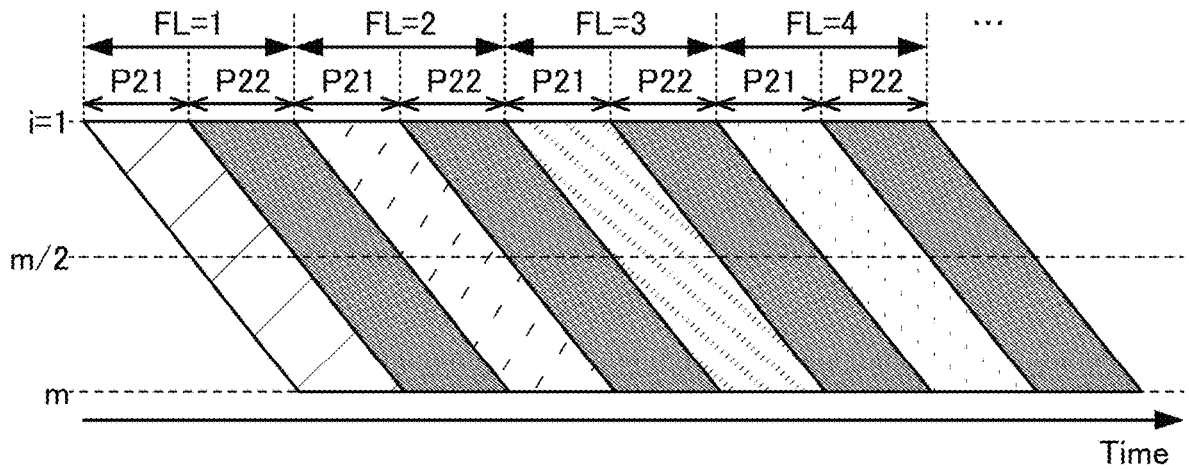
Figure 8C:
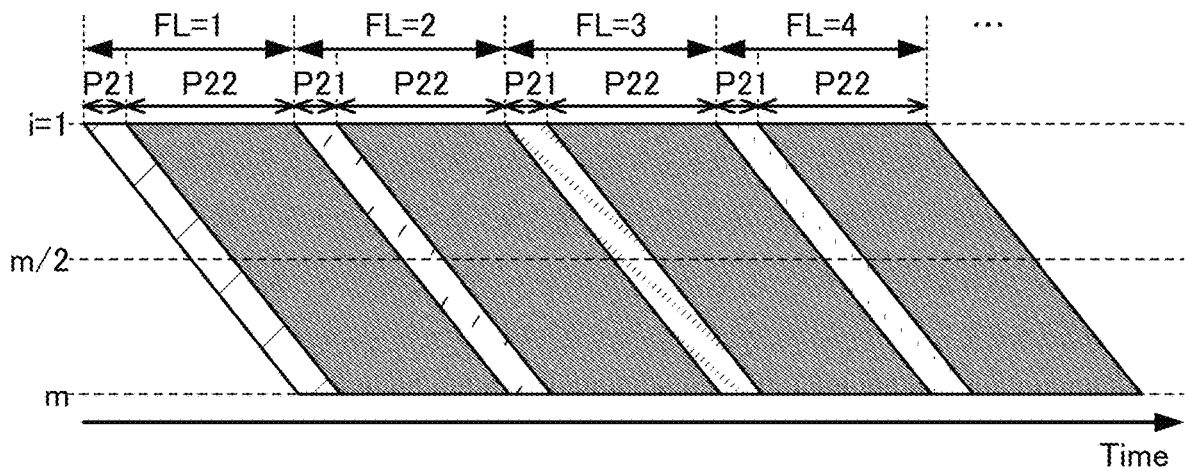

FIG. 8A shows a schematic diagram showing the operation of the display apparatus. In FIG. 8A, the vertical axis represents a pixel row number i (i is an integer greater than or equal to 1 and less than or equal to m) and the horizontal axis represents time (Time). In FIG. 8A, a first frame (FL=1) to a fourth frame (FL=4) are extracted to be shown.

The display apparatus of one embodiment of the present invention can have Period P22 to perform black display in one frame period. In addition, as shown in FIG. 8A, a configuration can be employed in which black display is performed row by row. Note that in this specification and the like, the method of driving pixels row by row is referred to as line sequential driving in some cases. By performing black display by the line sequential driving, the display apparatus of one embodiment of the present invention can have a long selection period for one row (also referred to as one horizontal period) for writing image data compared with the case where all pixels perform black display at once. This enables accurate image data writing to the pixels, and thus can improve the display quality of the display apparatus. For example, insufficient writing of the image data can be prevented even in high-speed operation at a high frame frequency.

The duty can be a given value. FIG. 8A shows a configuration example in which the duty is 80%. FIG. 8B shows a configuration example in which the duty is 50%. FIG. 8C shows a configuration example in which the duty is 20%. When the duty is made high, the proportion of the lighting period is increased and the luminance of the display apparatus can be increased. When the duty is made low, the proportion of the non-lighting period with black display is increased and afterimages can be further reduced.

<Pixel Configuration Example 6>

Figure 9A:
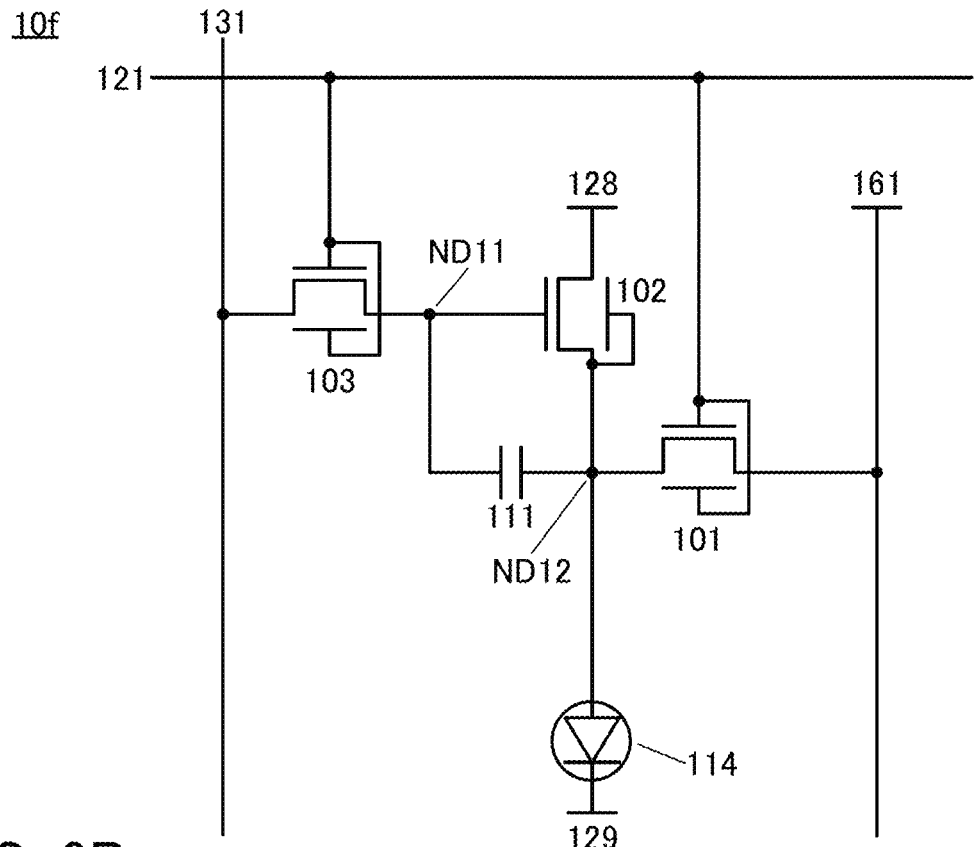
FIG. 9A is a circuit diagram illustrating a configuration example of a pixel.

FIG. 9A illustrates a configuration different from that of the pixel 10 illustrated in FIG. 1B.

A pixel 10f illustrated in FIG. 9A is different from the pixel 10 illustrated in FIG. 1B in that the transistor 104, the capacitor 112, the wiring 122, and the wiring 123 are not provided and the gate of the transistor 103 is electrically connected to the wiring 121. In the pixel 10f, the gate of the transistor 101 and the gate of the transistor 102 are each electrically connected to the wiring 121.

The pixel 10f illustrated in FIG. 9A includes a smaller number of transistors, capacitors, and wirings than the pixel 10 to the pixel 10e described above, and thus can be favorably used for a high-resolution display apparatus with small pixels.

Figure 9B:
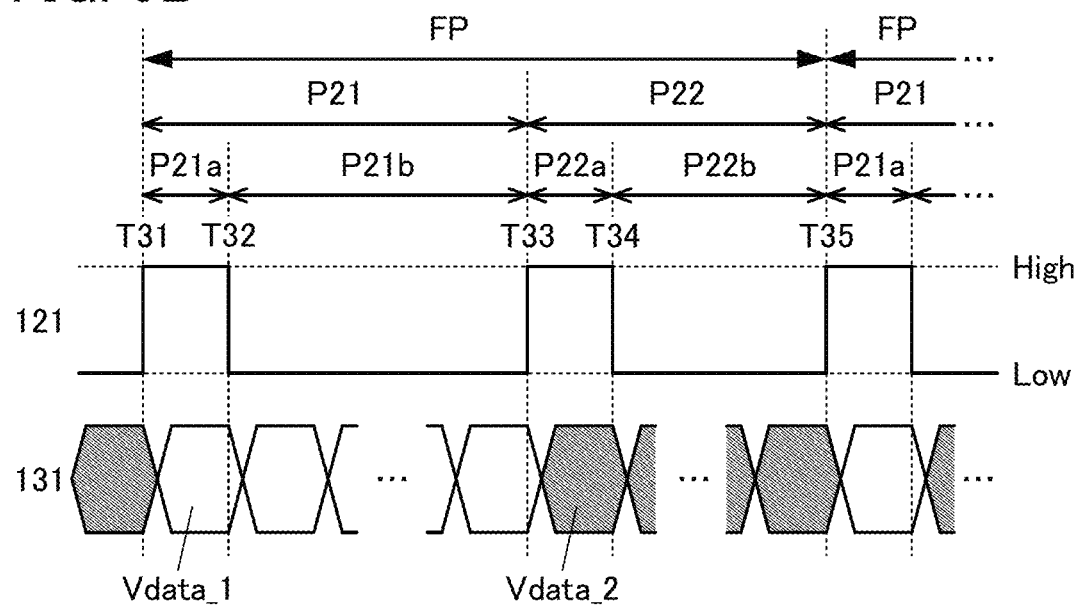
FIG. 9B is a diagram showing the operation of a display apparatus.

An operation example of the pixel 10f will be described using a timing chart shown in FIG. 9B. Since the description of FIG. 2 can be referred to for the wiring 161, the wiring 161 is omitted in FIG. 9B.

First, at Time T31, the potential of the wiring 121 is set to "High", the potential of the wiring 131 is set to "Vdata_1", and the potential of the wiring 161 is set to "Vref", so that the transistor 101 and the transistor 103 are brought into a conduction state, and the potential "Vdata_1" of the wiring 131 is written to the node ND11 and the potential "Vref" of the wiring 161 is written to the node ND12. The potential "Vdata_1" of the wiring 131 is a potential corresponding to image data.

Next, at Time T32, the potential of the wiring 121 is set to "Low", so that the transistor 101 and the transistor 103 are brought into a non-conduction state. The voltage Vgs between the gate and the source of the transistor 102 becomes a voltage retained in the capacitor 111, and a current corresponding to the voltage Vgs flows to the light-emitting device 114 to turn on the light-emitting device 114. The luminance of the light-emitting device 114 can be controlled by the amount of the current flowing to the light-emitting device 114.

Then, at Time T33, the potential of the wiring 121 is set to "High" and the potential of the wiring 131 is set to "Vdata_2", so that the transistor 101 and the transistor 103 are brought into a conduction state, and the potential "Vdata_2" of the wiring 131 is written to the node ND11 and the potential "Vref" of the wiring 161 is written to the node ND12. When the potential "Vdata_2" is set to a potential corresponding to black image data, which is the lowest gray level, for example, the light-emitting device 114 can be turned off to perform black display.

Then, at Time T34, the potential of the wiring 121 is set to "Low", so that the transistor 101 and the transistor 103 are brought into a non-conduction state. The light-emitting device 114 remains in a non-lighting state.

Note that the potential of the wiring 131 is preferably "Vdata_1" in Period P21 and the potential of the wiring 131 is preferably "Vdata_2" in Period P22.

Figure 10:
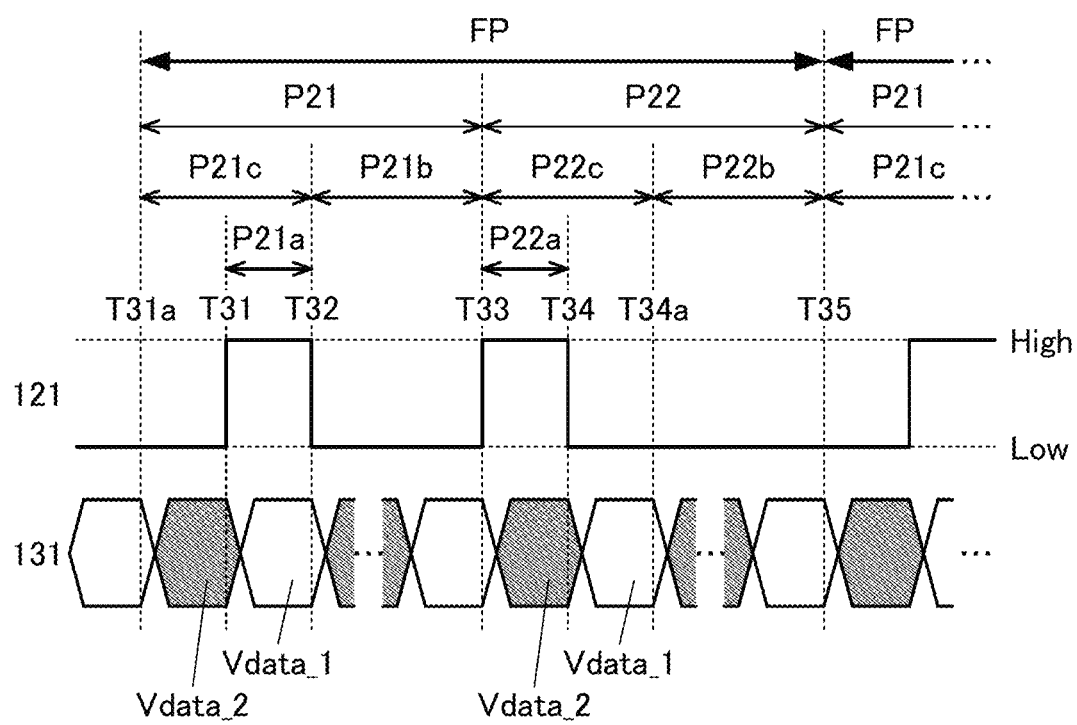
FIG. 10 is a diagram showing the operation of a display apparatus.

An operation example of the pixel 10f which is different from that shown in the timing chart in FIG. 9B will be described. FIG. 10 shows an example of the timing chart of the pixel 10f. The potential "Vdata_1" and the potential "Vdata_2" are alternately supplied to the wiring 131. Since the description of FIG. 2 can be referred to for the wiring 161, the wiring 161 is omitted in FIG. 10.

Period P21c between Time T31a and Time T32 is a period (one horizontal period) for selecting a row to which data for making the light-emitting device 114 emit light is written. In addition, Period P21c is divided into a period in which the potential "Vdata_1" is supplied from the wiring 131 and a period in which the potential "Vdata_2" is supplied therefrom.

At Time T31a, the potential of the wiring 121 is set to "Low", so that the transistor 101 and the transistor 103 are brought into a non-conduction state and the light-emitting device 114 does not emit light.

Next, at Time T31, the potential of the wiring 121 is set to "High", the potential of the wiring 131 is set to "Vdata_1", and the potential of the wiring 161 is set to "Vref", so that the transistor 101 and the transistor 103 are brought into a conduction state, and the potential "Vdata_1" of the wiring 131 is written to the node ND11 and the potential "Vref" of the wiring 161 is written to the node ND12.

Then, at Time T32, the potential of the wiring 121 is set to "Low", so that the transistor 101 and the transistor 103 are brought into a non-conduction state. The voltage Vgs between the gate and the source of the transistor 102 becomes a voltage retained in the capacitor 111, and a current corresponding to the voltage Vgs flows to the light-emitting device 114 to turn on the light-emitting device 114. The luminance of the light-emitting device 114 can be controlled by the amount of the current flowing to the light-emitting device 114. Period P21a between Time T31 and Time T32 is a period in which data for making the light-emitting device 114 emit light is written.

Period P22c between Time T33 and Time T34a is a period for selecting a row to which data for turning off the light-emitting device 114 is written. In addition, Period P22c is divided into a period in which the potential "Vdata_1" is supplied from the wiring 131 and a period in which the potential "Vdata_2" is supplied therefrom.

Next, at Time T33, the potential of the wiring 121 is set to "High" and the potential of the wiring 131 is set to "Vdata_2", so that the transistor 101 and the transistor 103 are brought into a conduction state, and the potential "Vdata_2" of the wiring 131 is written to the node ND11 and the potential "Vref" of the wiring 161 is written to the node ND12, whereby the light-emitting device 114 is turned off to perform black display.

Then, at Time T34, the potential of the wiring 121 is set to "Low", so that the transistor 101 and the transistor 103 are brought into a non-conduction state. The light-emitting device 114 remains in a non-lighting state.

<Pixel Layout Example>

A layout example of the pixel 10 will be described below. FIG. 11A and FIG. 11B illustrate layout examples of the pixel 10 illustrated in FIG. 1B.

FIG. 11A illustrates the transistor 101, the transistor 102, the transistor 103, the transistor 104, the capacitor 111, the capacitor 112, the wiring 121, the wiring 122, the wiring 123, the wiring 128, the wiring 131, and the wiring 161. Note that the light-emitting device 114 and the wiring 129 are omitted in FIG. 11A for clarity of the drawing.

FIG. 11B illustrates a structure in which a pixel electrode 53 is provided in addition to the structure of FIG. 11A. The pixel electrode 53 is electrically connected to the light-emitting device 114. The light-emitting device 114 can be provided over the pixel electrode 53.

In FIG. 11B, the pixel electrode 53 is provided to overlap elements included in the pixel 10, such as the transistor 101 and the capacitor 111, or part of wirings. Such a structure is effective particularly when a top-emission light-emitting device is used. When the transistor 101 and the like are provided below the pixel electrode 53 in this manner, the aperture ratio can be high even if the area occupied by the pixel 10 is reduced.

As illustrated in FIG. 111B, it is preferable that the pixel electrode 53 do not overlap the wiring 131 functioning as a signal line. When the pixel electrode 53 and the wiring 131 do not overlap each other, a change in the potential of the wiring 131 can be prevented from affecting the potential of the pixel electrode 53. Note that in the case where the pixel electrode 53 needs to be placed to overlap the wiring 131, the percentage of their overlapping area to the area of the pixel electrode 53 is 10% or less, preferably 5% or less.

<Subpixel Configuration Example>

FIG. 12A, FIG. 12B, FIG. 13A, and FIG. 13B each illustrate a configuration example of a subpixel applicable to the display apparatus of one embodiment of the present invention.

Figure 12A:
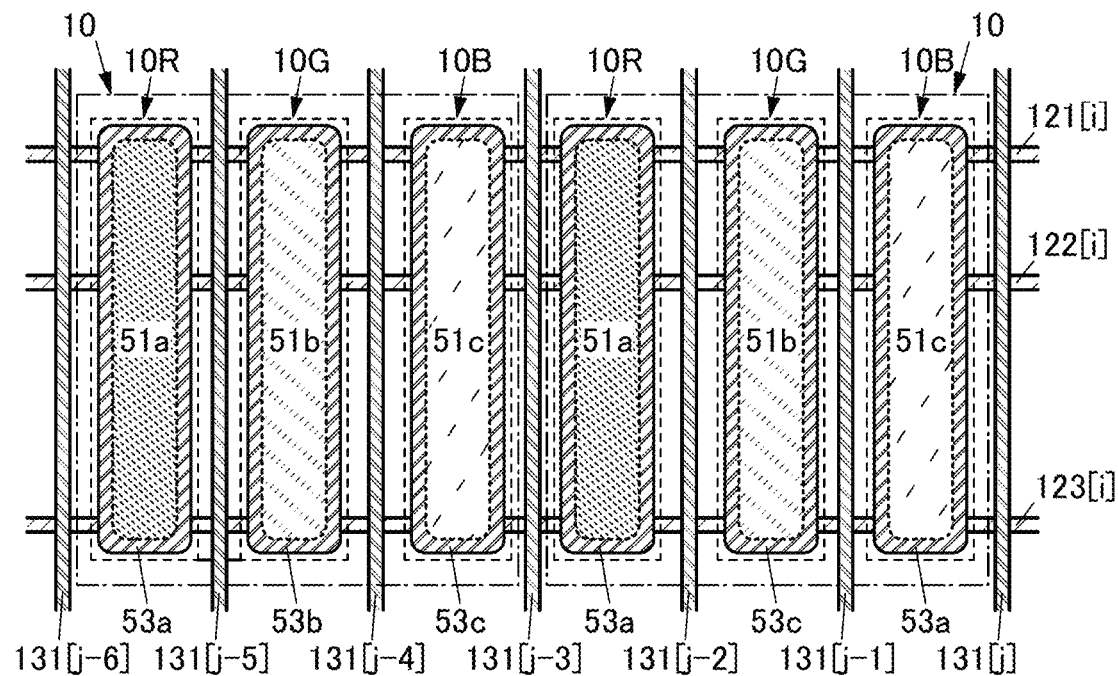
FIG. 12A and FIG. 12B are schematic diagrams illustrating configuration examples of pixels.

In the illustrated example, the pixel 10 illustrated in FIG. 12A includes a subpixel 10R emitting red light, a subpixel 10G emitting green light, and a subpixel 10B emitting blue light, and these three subpixels constitute one pixel 10. The pixel 10 illustrated in FIG. 12A has a rectangular shape where subpixels have long sides in the extending direction of the wiring 131 and are arranged in stripe in the extending direction of the wiring 121, the wiring 122, and the wiring 123.

Figure 12B:
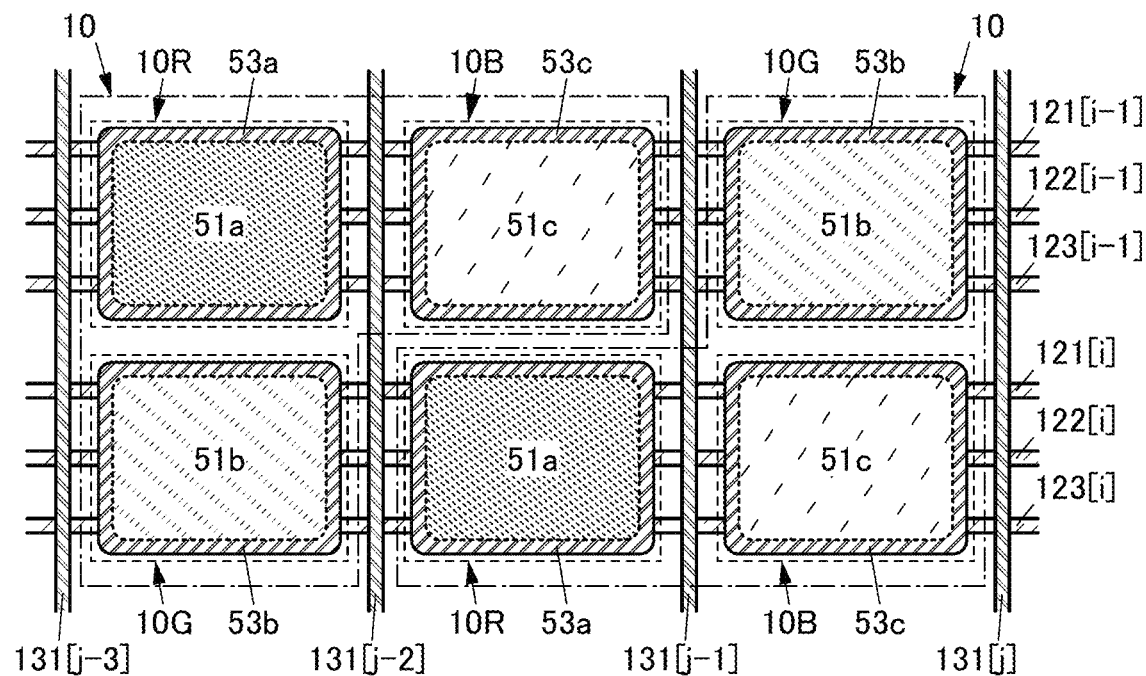

FIG. 12B illustrates subpixels arranged in a matrix of two rows and three columns (two pixels 10), the wiring 121, the wiring 122, the wiring 123, and the wiring 131. Note that in FIG. 12A and FIG. 12B, the wiring 121, the wiring 122, and the wiring 123 in an i-th row are referred to as a wiring 121[i], a wiring 122[i], and a wiring 123[i], respectively. The wiring 121, the wiring 122, and the wiring 123 in an (i−1)-th row are referred to as a wiring 121[i−1], a wiring 122[i−1], and a wiring 123[i−1], respectively. The wirings 131 in a (j−6)-th column to a j-th column are referred to as a wiring 131[j−6] to a wiring 131[j], respectively.

The subpixel 10R includes a pixel electrode 53a, and a display region 51a in the subpixel 10R is positioned on the inner side of the pixel electrode 53a. The subpixel 10G includes a pixel electrode 53b, and a display region 51b of the subpixel 10G is positioned on the inner side of the pixel electrode 53b. The subpixel 10B includes a pixel electrode 53c, and a display region 51c of the subpixel 10B is positioned on the inner side of the pixel electrode 53c. Note that FIG. 12B illustrates an example where the pixel electrode 53a, the pixel electrode 53b, and the pixel electrode 53c have the same area; however, they may have different areas. In addition, the display region 51a, the display region 51b, and the display region 51c may have different areas.

In the pixels 10 in the example illustrated in FIG. 12B, positions of the subpixels of the same color are not aligned in the extending direction of the wiring 121 and the wiring 122. In other words, in the pixel 10, the subpixels of the same color are arranged in a zig-zag manner in the extending direction of the wiring 121 and the wiring 122.

Figure 13A:
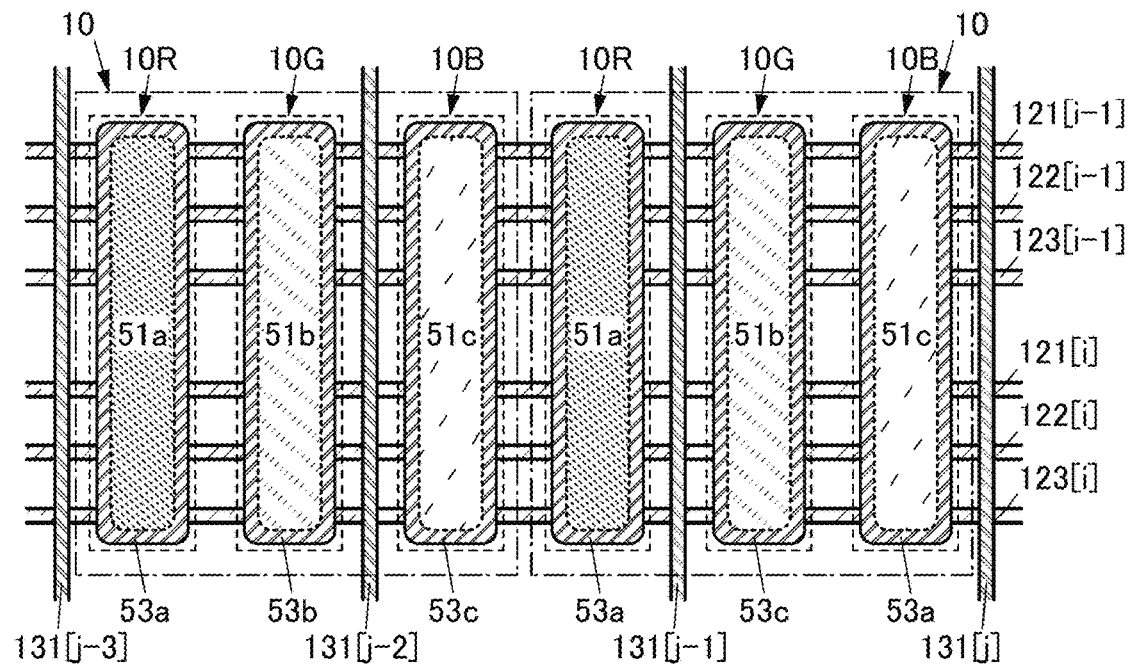
FIG. 13A and FIG. 13B are schematic diagrams illustrating configuration examples of pixels.

The pixel 10 in FIG. 13A has a rectangular shape where subpixels have long sides in the extending direction of the wiring 131 and are arranged in stripe in the extending direction of the wiring 121 and the wiring 122. In addition, an example in which the subpixel 10R, the subpixel 10G, and the subpixel 10B are aligned in the extending direction of the wiring 121 and the wiring 122 is illustrated.

Figure 13B:
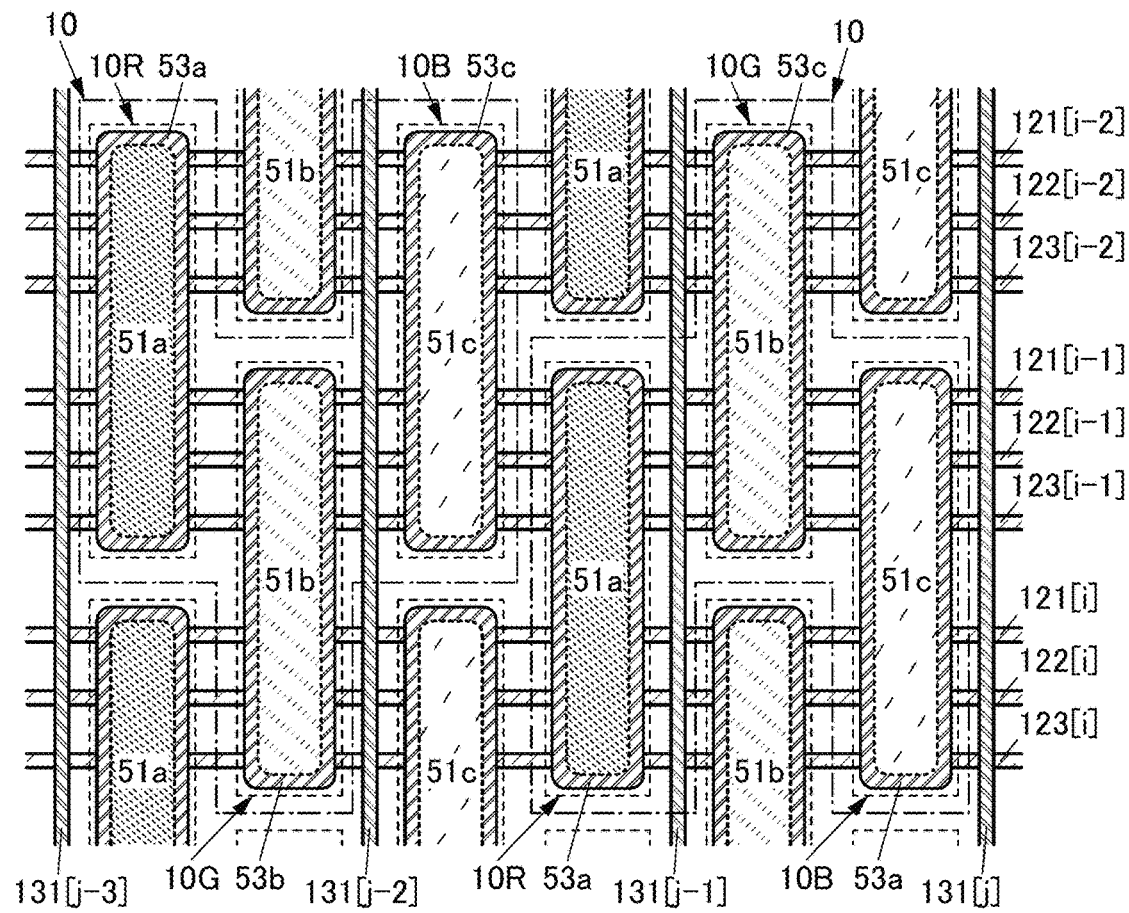

In the example of the pixels 10 illustrated in FIG. 13B, subpixels are arranged in stripe and positions of the subpixels of the same color are not aligned in the extending direction of the wiring 121 and the wiring 122. In other words, in the pixel 10, the subpixels of the same color are arranged in a zig-zag manner in the extending direction of the wiring 121 and the wiring 122.

Although the colors of light emitted by the subpixels are three, a combination of red (R), green (G), and blue (B) in the example illustrated in FIG. 12A, FIG. 12B, FIG. 13A, and FIG. 13B, the combination of the colors and the number of the colors are not limited thereto. Four colors of red (R), green (G), blue (B), and white (W), or four colors of red (R), green (G), blue (B), and yellow (Y) may be possible for the combination of light emitted from the subpixels. Color elements used for the subpixels are not limited to the above, and may be combined with cyan (C), magenta (M), or the like.

In this specification and the like, a blue wavelength range is greater than or equal to 400 nm and less than 490 nm, and blue light has at least one emission spectrum peak in the wavelength range. A green wavelength range is greater than or equal to 490 nm and less than 580 nm, and green light has at least one emission spectrum peak in the wavelength range. A red wavelength range is greater than or equal to 580 nm and less than or equal to 680 nm, and red light has at least one emission spectrum peak in the wavelength range.

<Structure Example 1 of Display Apparatus>

A display apparatus of one embodiment of the present invention will be described below in detail.

Figure 14:
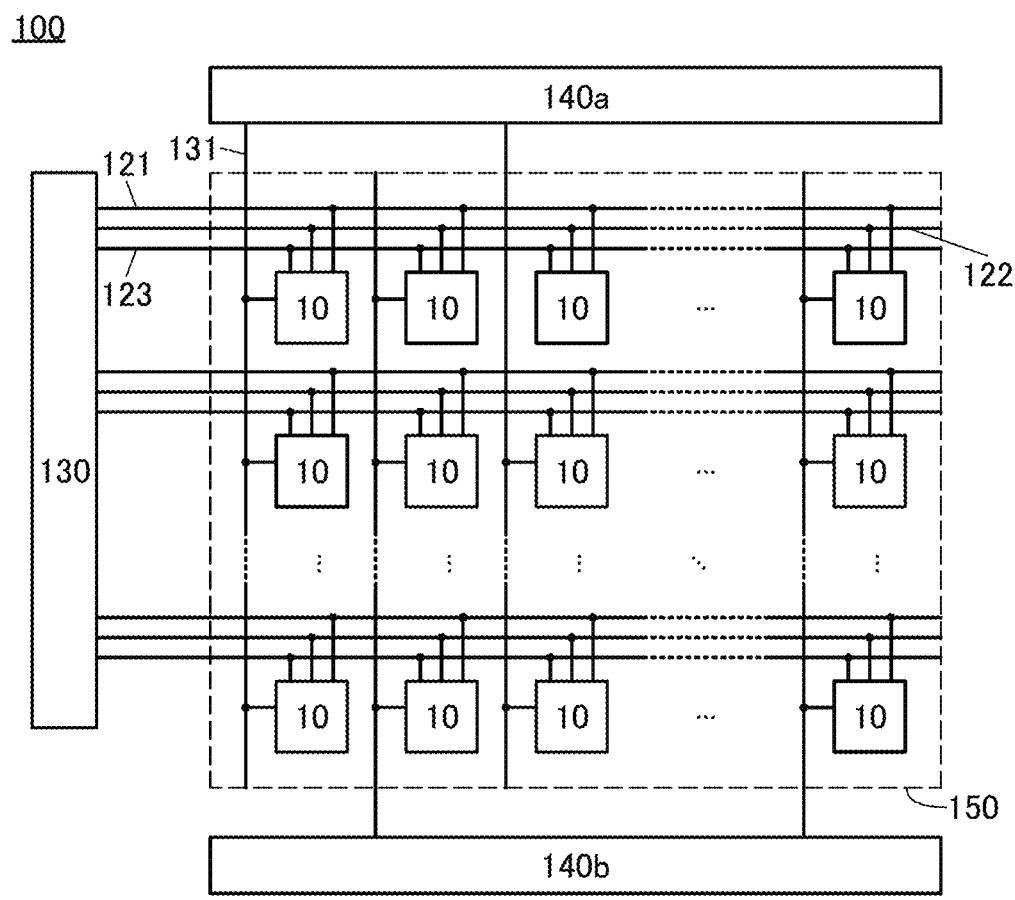
FIG. 14 is a block diagram illustrating a structure example of a display apparatus.

FIG. 14 shows a block diagram illustrating a structure example of a display apparatus 100. The display apparatus 100 includes a pixel portion 150 including a plurality of pixels 10, a driver circuit portion 130, a driver circuit portion 140a, a driver circuit portion 140b, the wiring 121, the wiring 122, the wiring 123, and the wiring 131.

The pixel portion 150 includes the plurality of pixels 10, and the pixels 10 can be arranged in a matrix. The driver circuit portion 130 is electrically connected to the pixels 10 through the wiring 121. The driver circuit portion 130 is electrically connected to the pixels 10 through the wiring 122. The driver circuit portion 130 is electrically connected to the pixels 10 through the wiring 123. The driver circuit portion 130 functions as a gate line driver circuit (also referred to as a gate driver). The plurality of pixels 10 are each supplied with signals from the driver circuit portion 130 through the wiring 121 and the wiring 122, and the driving thereof is controlled. The driver circuit portion 140a and the driver circuit portion 140b are each electrically connected to the pixels 10 through the wiring 131. The driver circuit portion 140a and the driver circuit portion 140b each function as a source line driver circuit (also referred to as a source driver). The plurality of pixels 10 are each supplied with signals from the driver circuit portion 140a or the driver circuit portion 140b through the wiring 131, and the driving thereof is controlled. FIG. 14 illustrates an example where the pixels 10 in odd-numbered columns are electrically connected to the driver circuit portion 140a, and the pixels 10 in even-numbered columns are electrically connected to the driver circuit portion 140b.

The display apparatus of one embodiment of the present invention can operate at high speed by including a plurality of driver circuit portions serving as source drivers, even when having a large number of pixels. The display apparatus of one embodiment of the present invention can be favorably used as a high-resolution display apparatus with, for example, 1000 ppi or higher, 2000 ppi or higher, or 5000 ppi or higher.

Although FIG. 14 illustrates the example in which two driver circuit portions, the driver circuit portion 140a and the driver circuit portion 140b, are provided as the driver circuit portions serving as source drivers, one embodiment of the present invention is not limited thereto. Three or more driver circuit portions serving as source drivers may be provided. Alternatively, one driver circuit portion serving as a source driver may be provided.

Figure 15A:
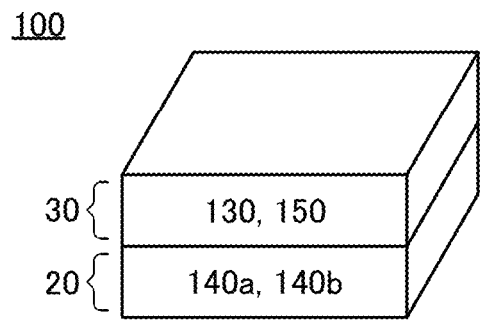
FIG. 15A is a schematic diagram illustrating a structure example of a display apparatus.

FIG. 15 shows a schematic diagram illustrating a structure example of the display apparatus 100. The display apparatus 100 has a stacked-layer structure of a first layer 20 and a second layer 30 over the first layer 20. Although FIG. 15A illustrates a structure in which the second layer 30 is provided over the first layer 20, one embodiment of the present invention is not limited thereto. The first layer 20 may be provided over the second layer 30. One or more of an interlayer insulating layer and a wiring layer may be provided between the first layer 20 and the second layer 30. Each of the interlayer insulating layer and the wiring layer provided between the first layer 20 and the second layer 30 may have a plurality of layers.

The first layer 20 includes the driver circuit portion 140a and the driver circuit portion 140b. The second layer 30 includes the driver circuit portion 130 and the pixel portion 150.

Figure 15B:
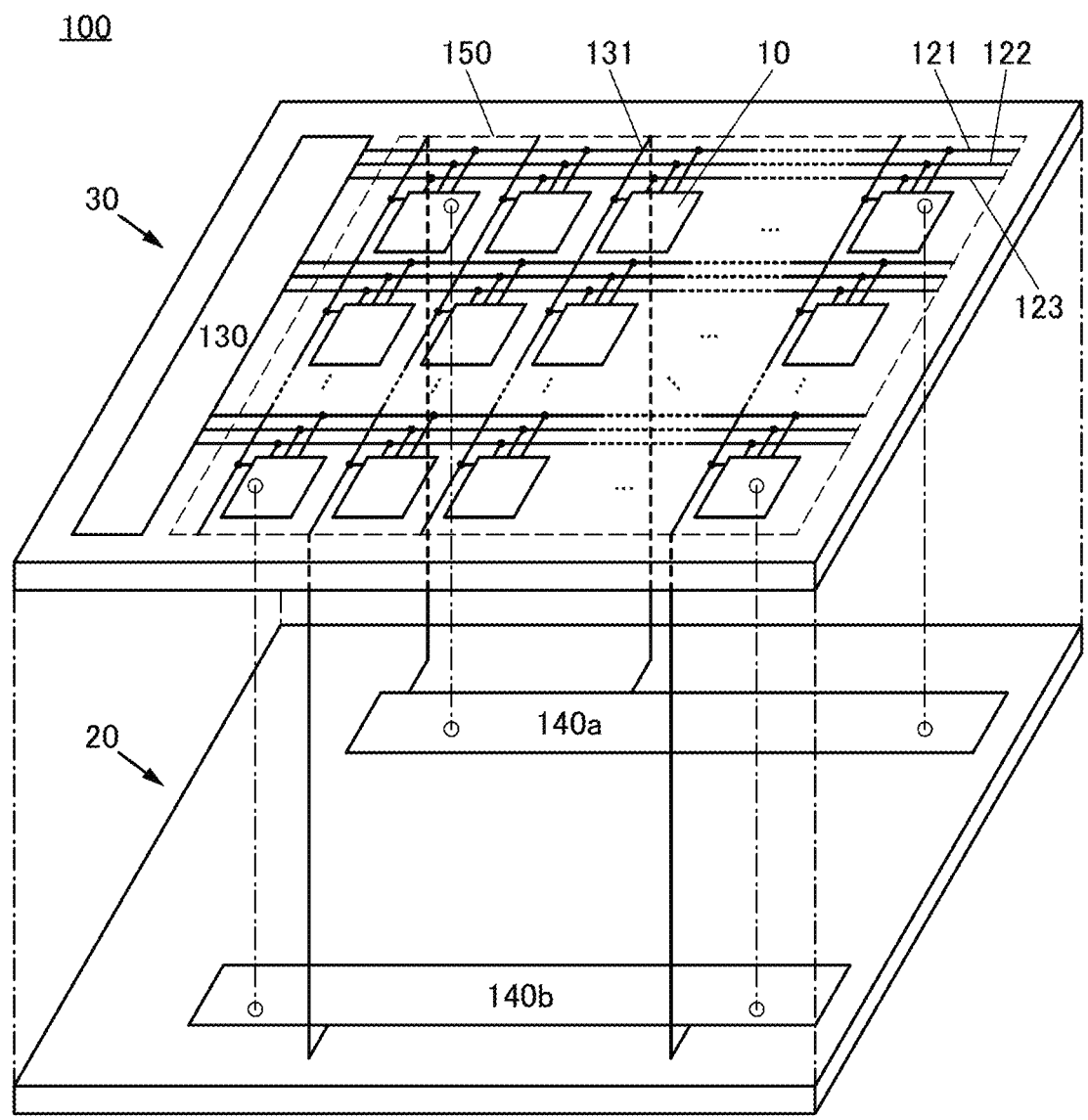
FIG. 15B is a block diagram illustrating the structure example of the display apparatus.

FIG. 15B illustrates a structure example of the first layer 20 and the second layer 30 illustrated in FIG. 15A. In FIG. 15B, the positional relationship between the first layer 20 and the second layer 30 is denoted by hollow circles and dashed-dotted lines, and the hollow circles in the first layer 20 and the hollow circles in the second layer 30, which are connected with the dashed-dotted lines, overlap each other. Note that the same representation is used in other diagrams. Note that in FIG. 15B, wirings other than the wiring 121, the wiring 122, the wiring 123, and the wiring 131 are omitted for clarity of the drawing.

In the display apparatus 100, each of the driver circuit portion 140a and the driver circuit portion 140b provided in the first layer 20 preferably includes a region overlapped by the pixel portion 150. The pixel portion 150 is stacked to include a region overlapping the driver circuit portion 140a and the driver circuit portion 140b, which enables reduction of the area of a bezel where the pixel portion 150 is not provided. Thus, the bezel of the display apparatus 100 can be narrowed. When the bezel of the display apparatus 100 is narrowed, the display apparatus 100 can be downsized.

Although FIG. 15B illustrates an example in which the first layer 20 and the second layer 30 have substantially the same size, summary of the present invention is not limited thereto. The first layer 20 and the second layer 30 may have different sizes. For example, the first layer 20 may be larger than the second layer 30. Alternatively, the first layer 20 may be smaller than the second layer 30.

The display apparatus 100 can be manufactured in such a manner that the second layer 30 is formed over the first layer 20 after the first layer 20 is formed. By forming the second layer 30 over the first layer 20, the alignment accuracy of the first layer 20 and the second layer 30 can be improved. Thus, the productivity of the display apparatus 100 can be improved.

The display apparatus 100 may be manufactured in such a manner that the first layer 20 and the second layer 30 are formed and then the first layer 20 and the second layer 30 are bonded to each other. In the case where the display apparatus 100 is manufactured in such a manner that the first layer 20 and the second layer 30 are bonded to each other, the first layer 20 and the second layer 30 may have different sizes. Thus, the first layer 20 and the second layer 30 can be formed without being influenced by each other's size. For example, the display apparatus 100 can be manufactured in such a manner that the plurality of first layers 20 are formed over the formation substrate of the first layers 20 and separated into individual first layers 20, and then the first layers 20 are bonded to the second layers 30. The same applies to the second layer 30; the display apparatus 100 may be manufactured in such a manner that the plurality of second layers 30 are formed over the formation substrate of the second layers 30 and separated into individual second layers 30, and then the second layers 30 are bonded to the first layers 20. That is, the productivity of the display apparatus 100 can be improved along with the improvement in the productivities of the first layer 20 and the second layer 30.

<Structure Example 2 of Light-Emitting Apparatus>

Figure 16A:
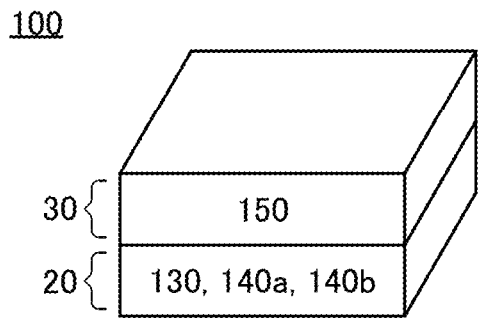
FIG. 16A is a schematic diagram illustrating a structure example of a display apparatus.
Figure 16B:
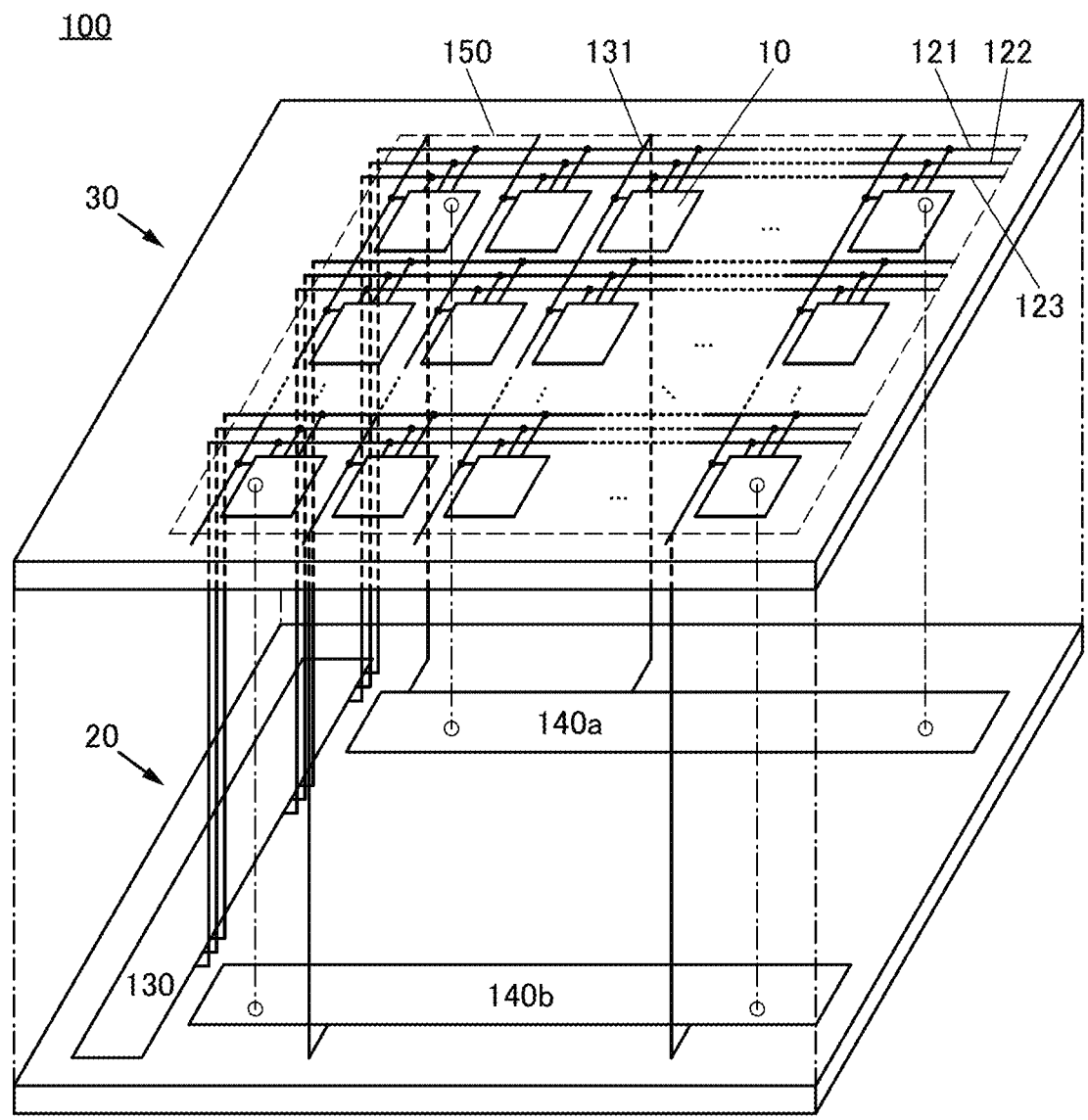
FIG. 16B is a block diagram illustrating the structure example of the display apparatus.

FIG. 16A and FIG. 16B illustrate a structure example different from that of the display apparatus 100 illustrated in FIG. 15A and FIG. 15B. The display apparatus 100 illustrated in FIG. 16A and FIG. 16B is different from the display apparatus 100 illustrated in FIG. 15A and FIG. 15B mainly in that the first layer 20 includes the driver circuit portion 130. When the driver circuit portion 130 is provided in the first layer 20 in which the driver circuit portion 140a and the driver circuit portion 140b are provided, manufacturing steps of the driver circuit portion 130, the driver circuit portion 140a, and the driver circuit portion 140b can be common, whereby the productivity can be increased.

Although FIG. 16B illustrates the example in which the pixel portion 150 does not include a region overlapping the driver circuit portion 130, one embodiment of the present invention is not limited thereto. The pixel portion 150 may include a region overlapping the driver circuit portion 130. The pixel portion 150 may include a region overlapping each of the driver circuit portion 130, the driver circuit portion 140a, and the driver circuit portion 140b. Such a structure enables the narrow bezel of the display apparatus 100. When the bezel of the display apparatus 100 is narrowed, the display apparatus 100 can be downsized.

<Cross-Sectional Structure Example 1 of Display Apparatus>

Figure 17:
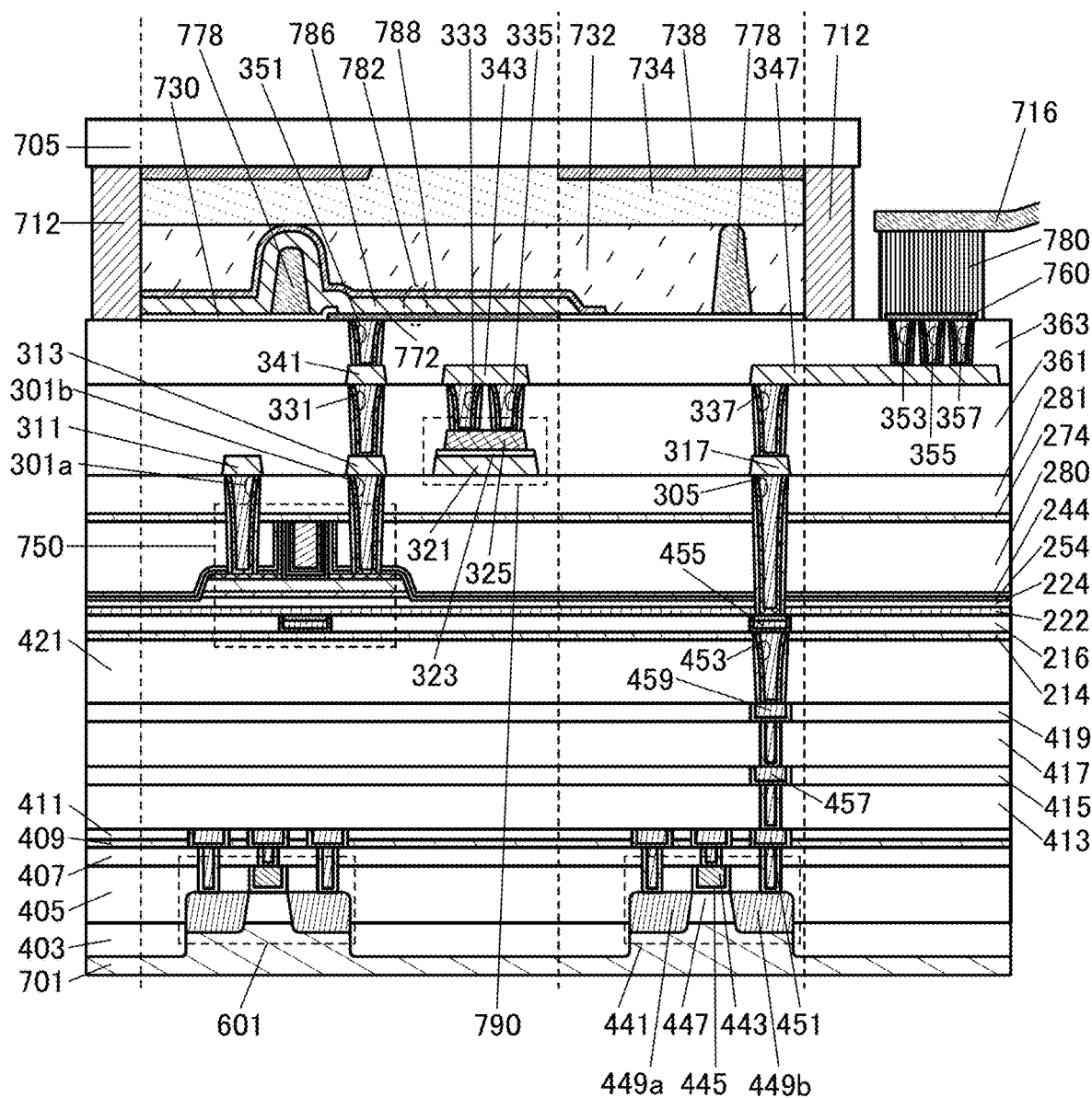
FIG. 17 is a cross-sectional view illustrating a structure example of a display apparatus.

FIG. 17 shows a cross-sectional view illustrating a structure example of the display apparatus 100. The display apparatus 100 includes a substrate 701 and a substrate 705, and the substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 and the transistor 601 can be transistors provided in the first layer 20. For example, in the display apparatus 100 illustrated in FIG. 15A and FIG. 15B, the transistor 441 and the transistor 601 can be transistors provided in the driver circuit portion 140a or the driver circuit portion 140b. For example, in the display apparatus 100 illustrated in FIG. 16A and FIG. 16B, the transistor 441 and the transistor 601 can be transistors provided in the driver circuit portion 130, the driver circuit portion 140a, or the driver circuit portion 140b.

The transistor 441 is formed of a conductor 443 having a function of a gate electrode, an insulator 445 having a function of a gate insulator, and part of the substrate 701 and includes a semiconductor region 447 including a channel formation region, a low-resistance region 449a having a function of one of a source region and a drain region, and a low-resistance region 449b having a function of the other of the source region and the drain region. The transistor 441 can be either a p-channel transistor or an n-channel transistor.

The transistor 441 is electrically isolated from other transistors by an element isolation layer 403. FIG. 17 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 17, the semiconductor region 447 has a projecting shape. Moreover, the conductor 443 is provided to cover the side surface and the top surface of the semiconductor region 447 with the insulator 445 therebetween. Note that FIG. 17 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator having a function of a mask for forming a projecting portion may be provided in contact with an upper portion of the projecting portion. Although FIG. 17 illustrates the structure in which the projecting portion is formed by processing part of the substrate 701, a semiconductor having a projecting shape may be formed by processing an SOI substrate.

Note that the structure of the transistor 441 illustrated in FIG. 17 is an example; the structure of the transistor 441 is not limited thereto and can be changed as appropriate in accordance with the circuit configuration, an operation method for the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 701, in addition to the element isolation layer 403, the transistor 441, and the transistor 601. A conductor 451 is embedded in the insulator 405, the insulator 407, the insulator 409, and the insulator 411. Here, the top surface of the conductor 451 and the top surface of the insulator 411 can be substantially level with each other.

An insulator 413 and an insulator 415 are provided over the conductor 451 and the insulator 411. A conductor 457 is embedded in the insulator 413 and the insulator 415. Here, the top surface of the conductor 457 and the top surface of the insulator 415 can be substantially level with each other.

An insulator 417 and an insulator 419 are provided over the conductor 457 and the insulator 415. A conductor 459 is embedded in the insulator 417 and the insulator 419. Here, the top surface of the conductor 459 and the top surface of the insulator 419 can be substantially level with each other.

An insulator 421 and an insulator 214 are provided over the conductor 459 and the insulator 419. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 244, an insulator 280, an insulator 274, and an insulator 281 are provided over the conductor 455 and the insulator 216. A conductor 305 is embedded in the insulator 222, the insulator 224, the insulator 254, the insulator 244, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display apparatus 100 from outside of the display apparatus 100 through the FPC 716.

As illustrated in FIG. 17, the low-resistance region 449*b* having a function of the other of the source region and the drain region of the transistor 441 is electrically connected to the FPC 716 through the conductor 451, the conductor 457, the conductor 459, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 17 illustrates three conductors, which are the conductor 353, the conductor 355, and the conductor 357, as conductors having a function of electrically connecting the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be a transistor provided in the second layer 30. For example, in each of the display apparatuses 100 illustrated in FIG. 15A, FIG. 15B, FIG. 16A, and FIG. 16B, the transistor 750 can be provided in the pixel portion 150. An OS transistor can be suitably used as the transistor 750. The OS transistor has a feature of extremely low off-state current. Consequently, the retention time for an image signal or the like can be increased, so that the frequency of the refresh operation can be reduced. Thus, power consumption of the display apparatus 100 can be reduced.

A conductor 301*a* and a conductor 301*b* are embedded in the insulator 254, the insulator 244, the insulator 280, the insulator 274, and the insulator 281. The conductor 301*a* is electrically connected to one of a source and a drain of the transistor 750, and the conductor 301*b* is electrically connected to the other of the source and the drain of the transistor 750. Here, the top surfaces of the conductor 301*a* and the conductor 301*b* and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 413, the insulator 415, the insulator 417, the insulator 419, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased planarity.

For example, in the display apparatus 100 illustrated in FIG. 15 and FIG. 16, the capacitor 790 can be the capacitor 111 or the capacitor 112 provided in the pixel portion 150.

As illustrated in FIG. 17, the capacitor 790 includes a lower electrode 321 and an upper electrode 325. An insulator 323 is provided between the lower electrode 321 and the upper electrode 325. In other words, the capacitor 790 has a stacked-layer structure in which the insulator 323 functioning as a dielectric is sandwiched between the pair of electrodes.

Although FIG. 17 illustrates the example in which the capacitor 790 is provided over the insulator 281, the capacitor 790 may be provided over an insulator different from the insulator 281.

In the example illustrated in FIG. 17, the conductor 301*a*, the conductor 301*b*, and the conductor 305 are formed in the same layer. In the illustrated example, the conductor 311, the conductor 313, the conductor 317, and the lower electrode 321 are formed in the same layer. In the illustrated example, the conductor 331, the conductor 333, the conductor 335, and the conductor 337 are formed in the same layer. In the illustrated example, the conductor 341, the conductor 343, and the conductor 347 are formed in the same layer. In the illustrated example, the conductor 351, the conductor 353, the conductor 355, and the conductor 357 are formed in the same layer. Forming a plurality of conductors in the same layer simplifies the manufacturing process of the display apparatus 100 and thus the manufacturing cost of the display apparatus 100 can be reduced. Note that these conductors may be formed in different layers or may contain different types of materials.

The display apparatus 100 illustrated in FIG. 17 includes a light-emitting device 782. The light-emitting device 782 includes a conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301*b*. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

Although not illustrated in FIG. 17, an optical member (optical substrate) such as a polarizing member, a retardation member, or an anti-reflection member can be provided in the display apparatus 100, for example.

On the substrate 705 side, a light-blocking layer 738 and an insulator 734 that is in contact with the light-blocking layer 738 are provided. The light-blocking layer 738 has a function of blocking light emitted from adjacent regions. Alternatively, the light-blocking layer 738 has a function of preventing external light from reaching the transistor 750 or the like.

In the display apparatus 100 illustrated in FIG. 17, an insulator 730 is provided over the insulator 363. Here, the insulator 730 can cover part of the conductor 772. Here, the light-emitting device 782 is a top-emission light-emitting device, which includes the conductor 788 with a light-transmitting property. Note that the light-emitting device 782 may have a bottom-emission structure in which light is emitted to the conductor 772 side or a dual-emission structure in which light is emitted towards both the conductor 772 and the conductor 788.

The light-blocking layer 738 is provided to have a region overlapping the insulator 730. The light-blocking layer 738 is covered with the insulator 734. A space between the light-emitting device 782 and the insulator 734 is filled with a sealing layer 732.

A component 778 is provided between the insulator 730 and the EL layer 786. Moreover, the component 778 is provided between the insulator 730 and the insulator 734.

Figure 18:
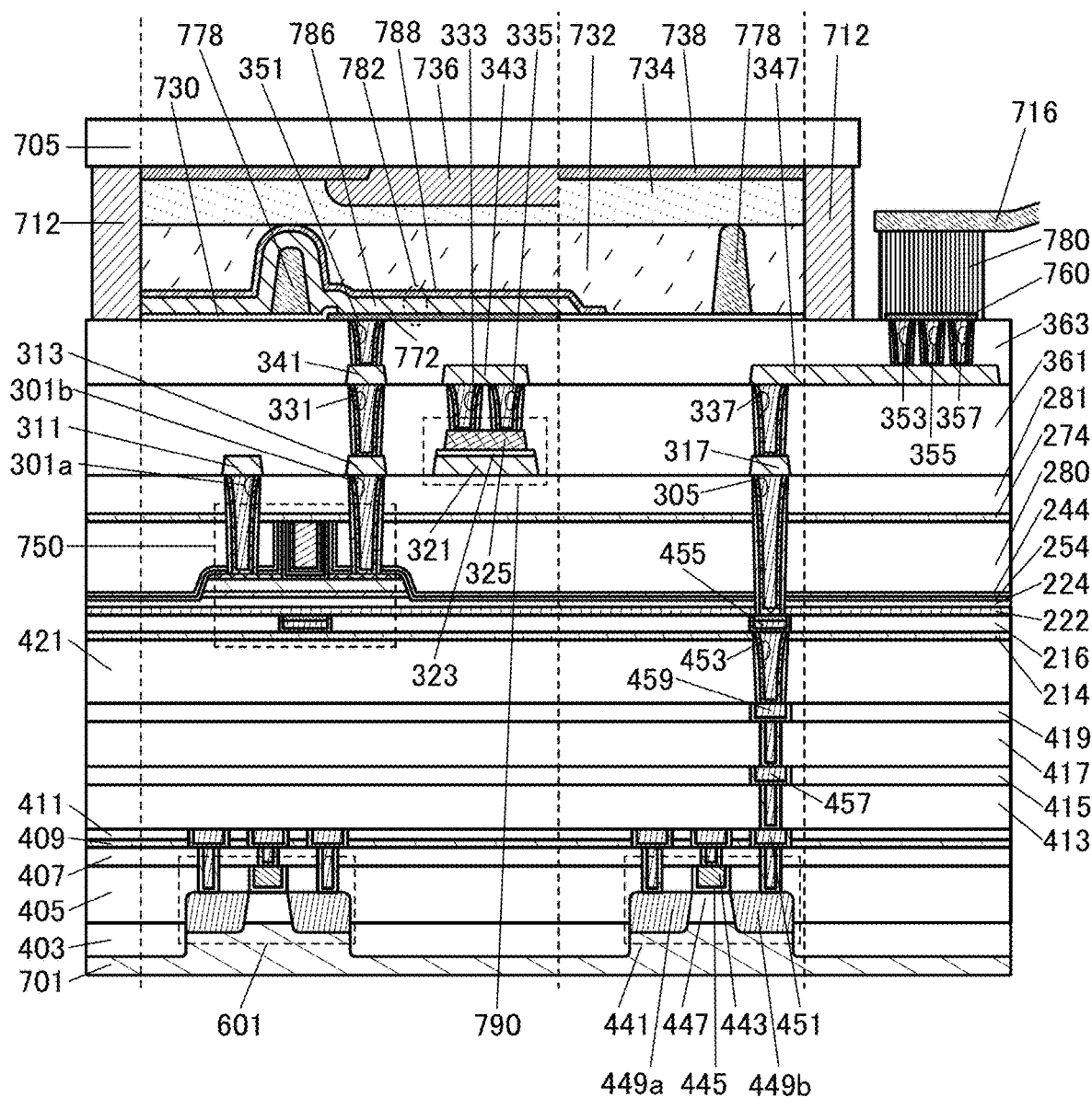
FIG. 18 is a cross-sectional view illustrating a structure example of a display apparatus.

FIG. 18 illustrates a variation example of the display apparatus 100 illustrated in FIG. 17. The display apparatus 100 illustrated in FIG. 18 is different from the display apparatus 100 illustrated in FIG. 17 in that a coloring layer 736 is provided. Note that the coloring layer 736 is provided to have a region overlapping the light-emitting device 782. Providing the coloring layer 736 can improve the color purity of light extracted from the light-emitting device 782. Thus, the display apparatus 100 can display high-quality images. Furthermore, all the light-emitting devices 782, for example, in the display apparatus 100 can be light-emitting devices that emit white light; hence, the EL layers 786 are not necessarily formed separately for each color, leading to higher resolution of the display apparatus 100.

The light-emitting device 782 can have a micro optical resonator (microcavity) structure. Thus, light of predetermined colors (e.g., RGB) can be extracted without a coloring layer, and the display apparatus 100 can perform color display. The structure without a coloring layer can prevent light absorption by the coloring layer. As a result, the display apparatus 100 can display high-luminance images, and the power consumption of the display apparatus 100 can be reduced. Note that a structure in which a coloring layer is not provided can be employed even when the EL layer 786 is formed into an island shape for each pixel or into a stripe shape for each pixel column, i.e., the EL layers 786 are formed separately for each color.

Figure 19:
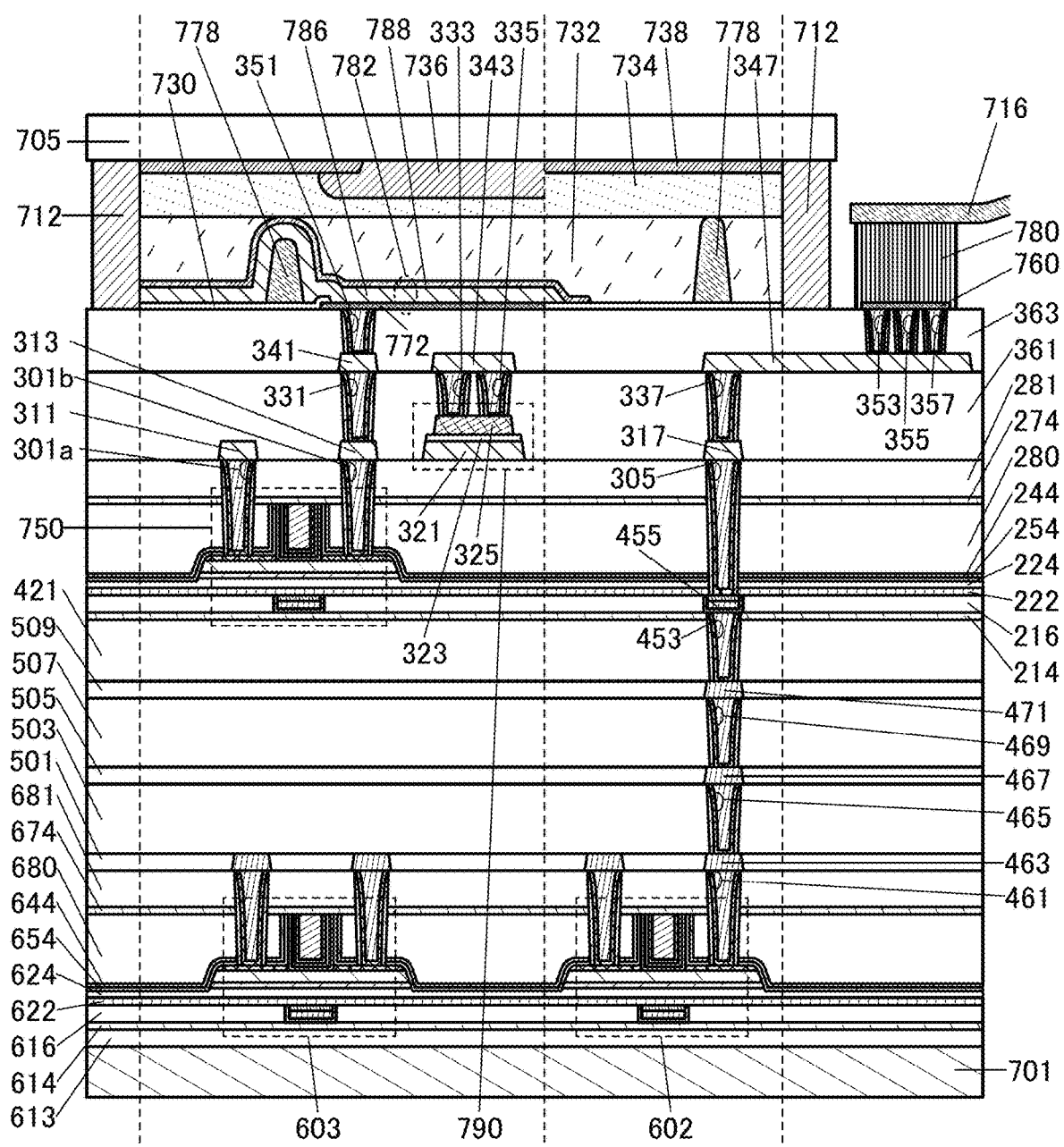
FIG. 19 is a cross-sectional view illustrating a structure example of a display apparatus.

Although FIG. 17 and FIG. 18 each illustrate a structure in which the transistor 441 and the transistor 601 are provided such that their channel formation regions are formed inside the substrate 701 and the transistor 750 is stacked over the transistor 441 and the transistor 601, one embodiment of the present invention is not limited thereto. FIG. 19 illustrates a variation example of FIG. 18. The display apparatus 100 illustrated in FIG. 19 is different from the display apparatus 100 illustrated in FIG. 18 mainly in that a transistor 602 and a transistor 603 that are OS transistors are provided in place of the transistor 441 and the transistor 601. An OS transistor can be used as the transistor 750. That is, the display apparatus 100 illustrated in FIG. 19 includes a stack of OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to those of the transistor 441 and the transistor 601 illustrated in FIG. 18 may be provided between the substrate 701 and the insulator 613.

That is, the transistor 602 and the transistor 603 can be transistors provided in the first layer 20. For example, in the display apparatus 100 illustrated in FIG. 15A and FIG. 15B, the transistor 602 and the transistor 603 can be transistors provided in the driver circuit portion 140a or the driver circuit portion 140b. For example, in the display apparatus 100 illustrated in FIG. 16A and FIG. 16B, the transistor 602 and the transistor 603 can be transistors provided in the driver circuit portion 130, the driver circuit portion 140a, or the driver circuit portion 140b.

The transistor 602 and the transistor 603 can be transistors having a structure similar to that of the transistor 750. Note that the transistor 602 and the transistor 603 may be OS transistors having a structure different from that of the transistor 750.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 is embedded in the insulator 654, the insulator 644, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

An insulator 503 is provided over the conductor 463 and the insulator 501. A conductor 465 is embedded in the insulator 503. Here, the top surface of the conductor 465 and the top surface of the insulator 503 can be substantially level with each other.

An insulator 505 is provided over the conductor 465 and the insulator 503. A conductor 467 is embedded in the insulator 505. Here, the top surface of the conductor 467 and the top surface of the insulator 505 can be substantially level with each other.

An insulator 507 is provided over the conductor 467 and the insulator 505. A conductor 469 is embedded in the insulator 507. Here, the top surface of the conductor 469 and the top surface of the insulator 507 can be substantially level with each other.

An insulator 509 is provided over the conductor 469 and the insulator 507. A conductor 471 is embedded in the insulator 509. Here, the top surface of the conductor 471 and the top surface of the insulator 509 can be substantially level with each other.

The insulator 421 and the insulator 214 are provided over the conductor 471 and the insulator 509. The conductor 453 is embedded in the insulator 421 and the insulator 214. Here, the top surface of the conductor 453 and the top surface of the insulator 214 can be substantially level with each other.

As illustrated in FIG. 19, one of a source and a drain of the transistor 602 is electrically connected to the FPC 716 through the conductor 461, the conductor 463, the conductor 465, the conductor 467, the conductor 469, the conductor 471, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, the insulator 501, the insulator 503, the insulator 505, the insulator 507, and the insulator 509 have a function of an interlayer film and may also have a function of a planarization film that covers unevenness thereunder.

When the display apparatus 100 has the structure illustrated in FIG. 19, all the transistors included in the display apparatus 100 can be OS transistors while the bezel and size of the display apparatus 100 are reduced. Accordingly, the transistors provided in the first layer 20 and the transistors provided in the second layer 30 can be manufactured using the same apparatus, for example. Consequently, the manufacturing cost of the display apparatus 100 can be reduced, making the display apparatus 100 inexpensive.

<Cross-Sectional Structure Example 2 of Display Apparatus>

Figure 20:
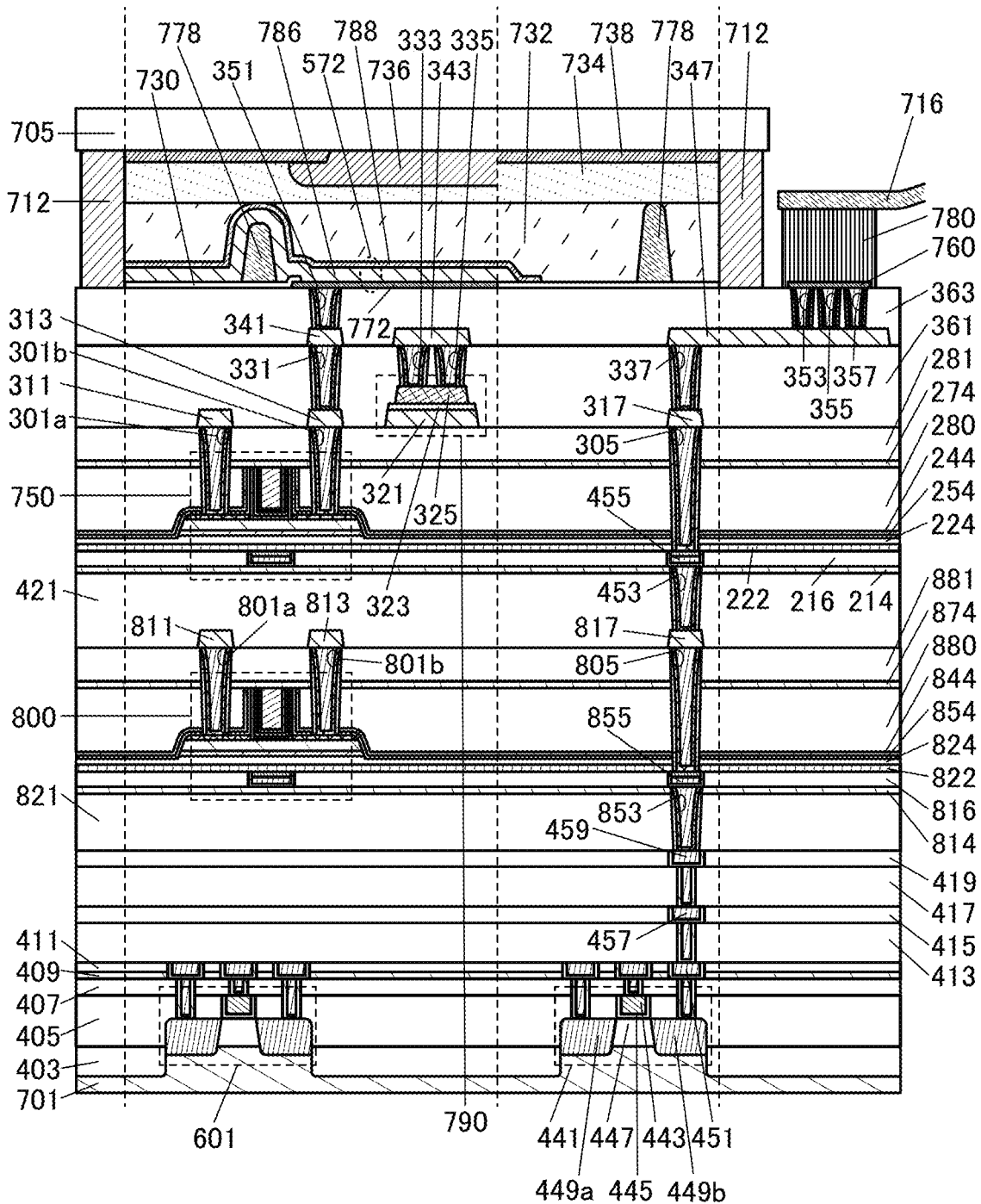
FIG. 20 is a cross-sectional view illustrating a structure example of a display apparatus.

FIG. 20 is a cross-sectional view illustrating a structure example of the display apparatus 100. The display apparatus 100 in FIG. 20 is different from the display apparatus 100 in FIG. 18 mainly in that a layer including a transistor 800 is interposed between the layer including the transistor 750 and the layer including the transistor 441 and the transistor 601. Although FIG. 20 illustrates a structure including a region where the transistor 601, the transistor 750, and the transistor 800 overlap each other, one embodiment of the present invention is not limited thereto. For example, a structure may be employed in which a region where the transistor 601 and the transistor 750 overlap each other is included and a region where the transistor 800, the transistor 601, and the transistor 750 overlap each other is not included. Alternatively, a structure may be employed in which a region where the transistor 601 and the transistor 800 overlap each other is included and a region where the transistor 750, the transistor 601, and the transistor 800 overlap each other is not included.

The first layer 20 illustrated in FIG. 15A and the like can have a stacked-layer structure of a first circuit layer and a second circuit layer over the first circuit layer. For example, the transistor 441 and the transistor 601 can be transistors provided in the first circuit layer. The transistor 800 can be a transistor provided in the second circuit layer. The transistor 750 can be a transistor provided in the second layer 30.

An insulator 821 and an insulator 814 are provided over the conductor 459 and the insulator 419. A conductor 853 is embedded in the insulator 821 and the insulator 814. Here, the top surface of the conductor 853 and the top surface of the insulator 814 can be substantially level with each other.

An insulator 816 is provided over the conductor 853 and the insulator 814. A conductor 855 is embedded in the insulator 816. Here, the top surface of the conductor 855 and the top surface of the insulator 816 can be substantially level with each other.

An insulator 822, an insulator 824, an insulator 854, an insulator 844, an insulator 880, an insulator 874, and an insulator 881 are provided over the conductor 855 and the insulator 816. A conductor 805 is embedded in the insulator 822, the insulator 824, the insulator 854, the insulator 844, the insulator 880, the insulator 874, and the insulator 881. Here, the top surface of the conductor 805 and the top surface of the insulator 881 can be substantially level with each other.

The insulator 421 and the insulator 214 are provided over the conductor 817 and the insulator 881.

As illustrated in FIG. 20, the low-resistance region 449b functioning as the other of the source region and the drain region of the transistor 441 is electrically connected to the FPC 716 through the conductor 451, the conductor 457, the conductor 459, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

The transistor 800 is provided over the insulator 814. The transistor 800 can be a transistor provided in the first layer 20. For example, in the display apparatus 100 illustrated in FIG. 15A and FIG. 15B, the transistor 800 can be a transistor provided in the driver circuit portion 140a or the driver circuit portion 140b. For example, in the display apparatuses 100 illustrated in FIG. 16A and FIG. 16B, the transistor 800 can be a transistor provided in the driver circuit portion 130, the driver circuit portion 140a, or the driver circuit portion 140b. The transistor 800 is preferably an OS transistor.

A conductor 801a and a conductor 801b are embedded in the insulator 854, the insulator 844, the insulator 880, the insulator 874, and the insulator 881. The conductor 801a is electrically connected to one of a source and a drain of the transistor 800, and the conductor 801b is electrically connected to the other of the source and the drain of the transistor 800. Here, the top surfaces of the conductor 801a and the conductor 801b and the top surface of the insulator 881 can be substantially level with each other.

The transistor 750 can be a transistor provided in the second layer 30. For example, in each of the display apparatuses 100 illustrated in FIG. 15A, FIG. 15B, FIG. 16A and FIG. 16B, the transistor 750 can be provided in the pixel portion 150. The transistor 750 is preferably an OS transistor.

Note that an OS transistor or the like may be provided between the layer where the transistor 441, the transistor 601, and the like are provided and the layer where the transistor 800 and the like are provided. In addition, an OS transistor or the like may be provided between the layer where the transistor 800 and the like are provided and the layer where the transistor 750 and the like are provided. Furthermore, an OS transistor or the like may be provided above the layer where the transistor 750 and the like are provided.

The insulator 405, the insulator 407, the insulator 409, the insulator 411, the insulator 413, the insulator 415, the insulator 417, the insulator 419, the insulator 821, the insulator 814, the insulator 880, the insulator 874, the insulator 881, the insulator 421, the insulator 214, the insulator 280, the insulator 274, the insulator 281, the insulator 361, and the insulator 363 have a function of an interlayer film and may also have a function of a planarization film that covers unevenness thereunder.

In the example illustrated in FIG. 20, the conductor 801a, the conductor 801b, and the conductor 805 are formed in the same layer. In the illustrated example, the conductor 811, the conductor 813, and the conductor 817 are formed in the same layer.

Figure 21:
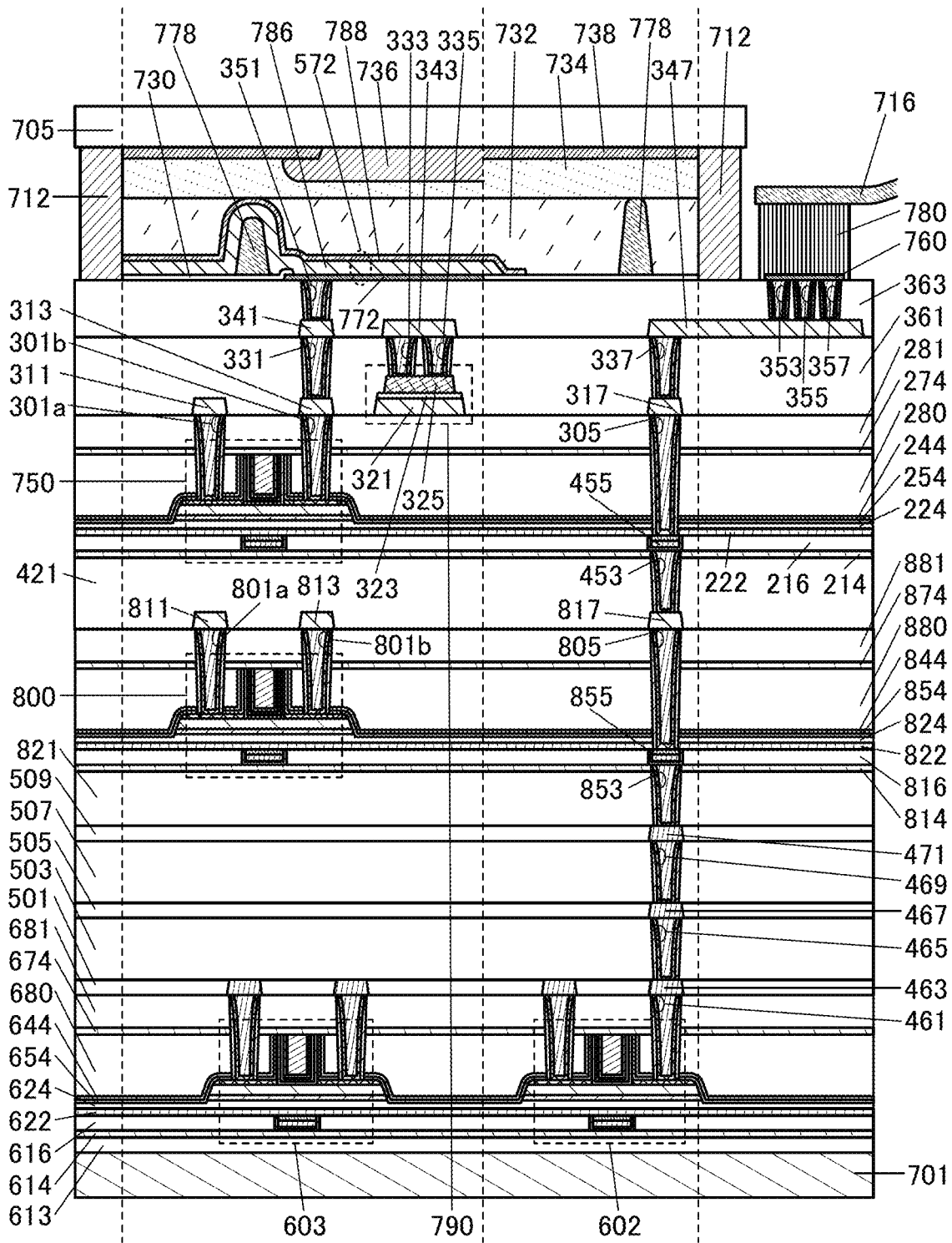
FIG. 21 is a cross-sectional view illustrating a structure example of a display apparatus.

Although FIG. 20 illustrates a structure where the transistor 441 and the transistor 601 are provided such that their channel formation regions are formed inside the substrate 701 and the transistor 800 and the transistor 750 are stacked over the transistor 441 and the transistor 601, one embodiment of the present invention is not limited thereto. FIG. 21 illustrates a variation example of FIG. 20. The display apparatus 100 illustrated in FIG. 21 is different from the display apparatus 100 illustrated in FIG. 20 in that the transistor 602 and the transistor 603 that are OS transistors are included in place of the transistor 441 and the transistor 601. That is, the display apparatus 100 illustrated in FIG. 21 includes a three-layer stack of OS transistors.

An OS transistor or the like may be provided between the layer where the transistor 602, the transistor 603, and the like are provided and the layer where the transistor 800 and the like are provided. In addition, an OS transistor or the like may be provided between the layer where the transistor 800 and the like are provided and the layer where the transistor 750 or the transistor 750 and the like are provided. Furthermore, an OS transistor or the like may be provided above the layer where the transistor 750 and the like are provided.

For example, the transistor 602 and the transistor 603 can be transistors provided in the first circuit layer of the first layer 20. The transistor 800 can be a transistor provided in the second circuit layer of the first layer 20. The transistor 750 can be a transistor provided in the second layer 30.

The insulator 821 and the insulator 814 are provided over the conductor 471 and the insulator 509. The conductor 853 is embedded in the insulator 821 and the insulator 814. Here, the top surface of the conductor 853 and the top surface of the insulator 814 can be substantially level with each other.

As illustrated in FIG. 21, one of the source and the drain of the transistor 602 is electrically connected to the FPC 716 through the conductor 461, the conductor 463, the conductor 465, the conductor 467, the conductor 469, the conductor 471, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

When the display apparatus 100 has a structure illustrated in FIG. 21, the display apparatus 100 with a narrow bezel and a small size can be obtained. When OS transistors are used as all of the transistors included in the display apparatus 100, different types of transistors do not need to be manufactured, whereby the manufacturing cost of the display apparatus 100 can be reduced and thus the display apparatus 100 can be inexpensive.

<Structure Example of Light-Emitting Device>

As a light-emitting device 572, an EL element utilizing electroluminescence can be used, for example. The EL element includes a layer containing a light-emitting compound (hereinafter also referred to as an EL layer) between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. Then, these carriers (electrons and holes) are recombined, which makes a light-emitting organic compound form an excited state and emit light when it returns from the excited state to a ground state. On the basis of such a mechanism, this light-emitting device is referred to as a current-excitation light-emitting device.

In this specification and the like, a voltage supplied to the display element such as a light-emitting device or a liquid crystal element refers to a difference between the potential applied to one electrode of the display element and the potential applied to the other electrode of the display element.

The EL layer may further contain a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), or the like in addition to the light-emitting compound.

The EL layer can be formed by an evaporation method (including a vacuum evaporation method), a transfer method, a printing method, an inkjet method, a coating method, or the like.

The inorganic EL elements are classified according to their device structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions.

In order that light emitted from the light-emitting device can be extracted, at least one of the pair of electrodes is transparent. A transistor and a light-emitting device are formed over a substrate; the light-emitting device can have any of a top emission structure in which light emission is extracted from the surface on the side opposite to the substrate, a bottom emission structure in which light emission is extracted from the surface on the substrate side, or a dual emission structure in which light emission is extracted from both surfaces.

FIG. 22A to FIG. 22E are diagrams illustrating structure examples of the light-emitting device 572. FIG. 22A illustrates the structure in which the EL layer 786 is interposed between the conductor 772 and the conductor 788 (single structure). As described above, the EL layer 786 contains a light-emitting material, for example, a light-emitting material of an organic compound.

FIG. 22B illustrates a stacked-layer structure of the EL layer 786. In the light-emitting device 572 with the structure illustrated in FIG. 22B, the conductor 772 has a function of an anode and the conductor 788 has a function of a cathode.

The EL layer 786 has a structure in which a hole-injection layer 721, a hole-transport layer 722, a light-emitting layer 723, an electron-transport layer 724, and an electron-injection layer 725 are stacked in this order over the conductor 772. Note that the order of the stacked layers is reversed when the conductor 772 has a function of a cathode and the conductor 788 has a function of an anode.

The light-emitting layer 723 contains a light-emitting material and a plurality of materials in appropriate combination, so that fluorescence or phosphorescence of a desired emission color can be obtained. The light-emitting layer 723 may have a stacked-layer structure having different emission colors. In that case, light-emitting substances and other substances can be different between the stacked light-emitting layers.

For example, when the light-emitting device 572 has a micro optical resonator (microcavity) structure with the conductor 772 and the conductor 788 illustrated in FIG. 22B serving as a reflective electrode and a transflective electrode, respectively, light emitted from the light-emitting layer 723 included in the EL layer 786 can be resonated between the electrodes and thus the light emitted through the conductor 788 can be intensified.

Note that when the conductor 772 of the light-emitting device 572 is a reflective electrode having a stacked-layer structure of a reflective conductive material and a light-transmitting conductive material (transparent conductive film), optical adjustment can be performed by controlling the thickness of the transparent conductive film. Specifically, when the wavelength of light from the light-emitting layer 723 is λ, the interelectrode distance between the conductor 772 and the conductor 788 is preferably adjusted to around mλ/2 (m is a natural number).

To amplify desired light (wavelength: λ) obtained from the light-emitting layer 723, the optical path length from the conductor 772 to a region where desired light is obtained in the light-emitting layer (light-emitting region) and the optical path length from the conductor 788 to the region where desired light is obtained in the light-emitting layer 723 (light-emitting region) are preferably adjusted to around (2m'+1) λ/4 (m' is a natural number). Here, the light-emitting region means a region where holes and electrons are recombined in the light-emitting layer 723.

By such optical adjustment, the spectrum of specific monochromatic light emitted from the light-emitting layer 723 can be narrowed and light emission with high color purity can be obtained.

In the above case, the optical path length between the conductor 772 and the conductor 788 can be, to be exact, the total thickness between a reflective region in the conductor 772 and a reflective region in the conductor 788. However, it is difficult to precisely determine the reflective region in the conductor 772 and the conductor 788; hence, it is assumed that the above effect is sufficiently obtained with given positions in the conductor 772 and the conductor 788 being supposed to be reflective regions. Furthermore, the optical path length between the conductor 772 and the light-emitting layer where desired light is obtained can be, to be exact, the optical path length between the reflective region in the conductor 772 and the light-emitting region where desired light is obtained in the light-emitting layer. However, it is difficult to precisely determine the reflective region in the conductor 772 and the light-emitting region where desired light is obtained in the light-emitting layer; thus, it is assumed that the above effect can be sufficiently obtained with a given position in the conductor 772 being supposed to be the reflective region and a given position in the light-emitting layer where desired light is obtained being supposed to be the light-emitting region.

The light-emitting device 572 illustrated in FIG. 22B has a microcavity structure, so that light (monochromatic light) with different wavelengths can be extracted even when the same EL layer is used. Thus, separate formation for obtaining different emission colors (e.g., RGB) is not necessary. Therefore, high resolution can be easily achieved. In addition, a combination with coloring layers is also possible. Furthermore, the emission intensity of light with a specific wavelength in the front direction can be increased, whereby power consumption can be reduced.

Note that the light-emitting device 572 illustrated in FIG. 22B does not necessarily have a microcavity structure. In that case, light of predetermined colors (e.g., RGB) can be extracted when the light-emitting layer 723 has a structure for emitting white light and coloring layers are provided. In addition, when the EL layers 786 are formed separately for obtaining different emission colors, light of predetermined colors can be extracted without providing coloring layers.

At least one of the conductor 772 and the conductor 788 can be a light-transmitting electrode (e.g., a transparent electrode or a transflective electrode). In the case where the light-transmitting electrode is a transparent electrode, the transparent electrode has a visible light transmittance higher than or equal to 40%. In the case where the electrode having a light-transmitting property is a transflective electrode, the visible light reflectance of the transflective electrode is higher than or equal to 20% and lower than or equal to 80%, preferably higher than or equal to 40% and lower than or equal to 70%. These electrodes preferably have a resistivity of $1\times10^{-2}$ Ωcm or lower.

When the conductor 772 or the conductor 788 is an electrode having reflectivity (reflective electrode), the visible light reflectance of the reflective electrode is higher than or equal to 40% and lower than or equal to 100%, preferably higher than or equal to 70% and lower than or equal to 100%. This electrode preferably has a resistivity lower than or equal to $1\times10^{-2}$ Ωcm.

The light-emitting device 572 may have a structure illustrated in FIG. 22C. FIG. 22C illustrates the light-emitting device 572 having a stacked-layer structure (tandem structure) in which two EL layers (an EL layer 786a and an EL layer 786b) are provided between the conductor 772 and the conductor 788, and a charge generation layer 792 is provided between the EL layer 786a and the EL layer 786b. When the light-emitting device 572 has the tandem structure, the current efficiency and external quantum efficiency of the light-emitting device 572 can be increased. Thus, the display apparatus 100 can display high-luminance images. In addition, the power consumption of the display apparatus 100 can be reduced. Here, the EL layer 786a and the EL layer 786b can have a structure similar to that of the EL layer 786 illustrated in FIG. 22B.

The charge generation layer 792 has a function of injecting electrons into one of the EL layer 786a and the EL layer 786b and injecting holes to the other of the EL layer 786a and the EL layer 786b when a voltage is supplied between the conductor 772 and the conductor 788. Accordingly, when a voltage is supplied such that the potential of the conductor 772 becomes higher than the potential of the conductor 788, electrons are injected into the EL layer 786a from the charge generation layer 792 and holes are injected into the EL layer 786b from the charge generation layer 792.

Note that in terms of light extraction efficiency, the charge generation layer 792 preferably transmits visible light (specifically, the visible light transmittance of the charge generation layer 792 is preferably 40% or higher). The conductivity of the charge generation layer 792 may be lower than the conductivity of the conductor 772 or the conductivity of the conductor 788.

The light-emitting device 572 may have a structure illustrated in FIG. 22D. FIG. 22D illustrates the light-emitting device 572 having a tandem structure in which three EL layers (the EL layer 786a, the EL layer 786b, and an EL layer 786c) are provided between the conductor 772 and the conductor 788, and the charge generation layer 792 is provided between the EL layer 786a and the EL layer 786b and between the EL layer 786b and the EL layer 786c. Here, the EL layer 786a, the EL layer 786b, and the EL layer 786c can have a structure similar to that of the EL layer 786 illustrated in FIG. 22B. When the light-emitting device 572 has the structure illustrated in FIG. 22D, the current efficiency and external quantum efficiency of the light-emitting device 572 can be further increased. As a result, the display apparatus 100 can display higher-luminance images. Moreover, the power consumption of the display apparatus 100 can be further reduced.

The light-emitting device 572 may have a structure illustrated in FIG. 22E. FIG. 22E illustrates the light-emitting device 572 having a tandem structure in which n EL layers (an EL layer 786(1) to an EL layer 786(n)) are provided between the conductor 772 and the conductor 788, and the charge generation layer 792 is provided between the EL layers 786. Here, the EL layer 786(1) to the EL layer 786(n) can have a structure similar to that of the EL layer 786 illustrated in FIG. 22B. Note that FIG. 22E illustrates the EL layer 786(1), the EL layer 786(m), and the EL layer 786(m+1), and the EL layer 786(n) among the EL layers 786. Here, m is an integer greater than or equal to 2 and less than n, and n is an integer greater than or equal to m. As n becomes larger, the current efficiency and external quantum efficiency of the light-emitting device 572 can be increased. Thus, the display apparatus 100 can display high-luminance images. In addition, the power consumption of the display apparatus 100 can be reduced.

Next, materials that can be used for the light-emitting device 572 will be described.

[Conductor 772 and Conductor 788]

For the conductor 772 and the conductor 788, any of the following materials can be used in an appropriate combination as long as the functions of the anode and the cathode can be fulfilled. For example, a metal, an alloy, an electrically conductive compound, a mixture of these, and the like can be appropriately used. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

[Hole-Injection Layer 721 and Hole-Transport Layer 722]

The hole-injection layer 721 injects holes to the EL layer 786 from the conductor 772, which is an anode, or the charge generation layer 792 and contains a material having a high hole-injection property. Here, the EL layer 786 includes the EL layer 786a, the EL layer 786b, the EL layer 786c, and the EL layer 786(1) to the EL layer 786(n).

Examples of the material having a high hole-injection property include transition metal oxides such as molybdenum oxide, vanadium oxide, ruthenium oxide, tungsten oxide, and manganese oxide. Alternatively, it is possible to use a phthalocyanine-based compound, an aromatic amine compound, a high molecular compound, or the like.

Alternatively, as the material having a high hole-injection property, a composite material containing a hole-transport material and an acceptor material (electron-accepting material) can be used. In this case, the acceptor material extracts electrons from the hole-transport material, so that holes are generated in the hole-injection layer 721 and the holes are injected into the light-emitting layer 723 through the hole-transport layer 722. Note that the hole-injection layer 721 may be formed to have a single-layer structure using a composite material containing a hole-transport material and an acceptor material (electron-accepting material), or a stacked-layer structure in which a layer containing a hole-transport material and another layer containing an acceptor material (electron-accepting material) are stacked.

The hole-transport layer 722 transports the holes, which are injected from the conductor 772 by the hole-injection layer 721, to the light-emitting layer 723. Note that the hole-transport layer 722 contains a hole-transport material. It is preferable that the HOMO level of the hole-transport material used for the hole-transport layer 722 be equal or close to the HOMO level of the hole-injection layer 721, in particular.

As the acceptor material for the hole-injection layer 721, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Alternatively, organic acceptors such as a quinodimethane derivative, a chloranil derivative, and a hexaazatriphenylene derivative can be used.

The hole-transport materials used for the hole-injection layer 721 and the hole-transport layer 722 are preferably substances with a hole mobility of greater than or equal to $10^{-6}$ cm$^2$/Vs. Note that other substances can also be used as long as they have a hole-transport property higher than an electron-transport property.

As the hole-transport material, a π-electron rich heteroaromatic compound (e.g., a carbazole derivative or an indole derivative), an aromatic amine compound, or the like is preferable.

Note that the hole-transport material is not limited to the above examples and one of or a combination of various known materials can be used as the hole-transport material for the hole-injection layer 721 and the hole-transport layer 722. Note that the hole-transport layer 722 may be formed of a plurality of layers. In other words, a first hole-transport layer and a second hole-transport layer may be stacked, for example.

[Light-Emitting Layer 723]

The light-emitting layer 723 is a layer containing a light-emitting substance. As the light-emitting substance, a substance whose emission color is blue, violet, bluish violet, green, yellowish green, yellow, orange, red, or the like is appropriately used. Here, when the light-emitting device 572 includes a plurality of EL layers as illustrated in FIG. 22C, FIG. 22D, and FIG. 22E, the use of different light-emitting substances for the light-emitting layers 723 in the EL layers enables different emission colors to be exhibited (e.g., it enables white light emission obtained by combining complementary emission colors). For example, when the light-emitting device 572 has the structure illustrated in FIG. 22C, the use of different light-emitting substances for the light-emitting layer 723 in the EL layer 786a and the light-emitting layer 723 in the EL layer 786b can achieve different emission colors of the EL layer 786a and the EL layer 786b. Note that a stacked-layer structure in which one light-emitting layer includes different light-emitting substances may be employed.

The light-emitting layer 723 may contain one or more kinds of organic compounds (a host material and an assist material) in addition to a light-emitting substance (guest material). As the one or more kinds of organic compounds, one or both of the hole-transport material and the electron-transport material can be used.

There is no particular limitation on the light-emitting substance that can be used for the light-emitting layer 723, and it is possible to use a light-emitting substance that converts singlet excitation energy into light in the visible light range or a light-emitting substance that converts triplet excitation energy into light in the visible light range. Examples of the light-emitting substance are given below.

As an example of the light-emitting substance that converts singlet excitation energy into light, a substance that exhibits fluorescence (fluorescent material) can be given; examples thereof include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. In particular, a pyrene derivative is preferable because it has a high emission quantum yield.

Examples of the light-emitting substance that converts triplet excitation energy into light emission include a substance that exhibits phosphorescence (phosphorescent material) and a thermally activated delayed fluorescence (TADF) material that exhibits thermally activated delayed fluorescence.

Examples of a phosphorescent material include an organometallic complex, a metal complex (platinum complex), and a rare earth metal complex. These substances exhibit different emission colors (emission peaks), and thus are appropriately selected as needed.

As the blue-light-emitting substance, a substance whose photoluminescence peak wavelength is greater than or equal to 430 nm and less than or equal to 470 nm, preferably greater than or equal to 430 nm and less than or equal to 460 nm can be used. As the green-light-emitting substance, a substance whose photoluminescence peak wavelength is greater than or equal to 500 nm and less than or equal to 540 nm, preferably greater than or equal to 500 nm and less than or equal to 530 nm can be used. As the red-light-emitting substance, a substance whose photoluminescence peak wavelength is greater than or equal to 610 nm and less than or equal to 680 nm, preferably greater than or equal to 620 nm and less than or equal to 680 nm can be used. Note that the photoluminescence may be measured with either a solution or a thin film.

With the parallel use of such compounds and the microcavity effect, the above chromaticity can be achieved more easily. Here, a transflective electrode (metal thin film portion) that is needed for obtaining the microcavity effect has a thickness of preferably greater than or equal to 20 nm and less than or equal to 40 nm. The thickness is further preferably greater than 25 nm and less than or equal to 40 nm. However, the thickness greater than 40 nm possibly reduces the efficiency.

As the organic compounds (the host material and the assist material) used in the light-emitting layer 723, one or more kinds of substances having an energy gap larger than the energy gap of the light-emitting substance (the guest material) can be used. Note that the hole-transport materials listed above and the electron-transport materials given below can be used as the host material and the assist material, respectively.

In the case where the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used.

In the case where the light-emitting substance is a phosphorescent material, an organic compound having triplet excitation energy (energy difference between a ground state and a triplet excited state) higher than triplet excitation energy of the light-emitting substance can be selected as the host material. In this case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, or the like.

When a plurality of organic compounds are used for the light-emitting layer 723, it is preferable to use compounds that form an exciplex in combination with a light-emitting substance. In this case, various organic compounds can be used in appropriate combination; to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (reverse intersystem crossing) using a little thermal energy and efficiently exhibit light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd).

Alternatively, it is possible to use a heterocyclic compound having a π-electron rich heteroaromatic ring and a π-electron deficient heteroaromatic ring. Note that a substance in which a π-electron rich heteroaromatic ring is directly bonded to a π-electron deficient heteroaromatic ring is particularly preferable, in which case both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound.

[Electron-Transport Layer 724]

The electron-transport layer 724 transports the electrons, which are injected from the conductor 788 by the electron-injection layer 725, to the light-emitting layer 723. Note that the electron-transport layer 724 contains an electron-transport material. The electron-transport material used for the electron-transport layer 724 is preferably a substance with an electron mobility of higher than or equal to $1\times10^{-6}$ cm²/Vs. Note that other substances can also be used as long as they have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

The electron-transport layer 724 is not limited to a single layer and may have a structure in which two or more layers each containing any of the above substances are stacked.

[Electron-Injection Layer 725]

The electron-injection layer 725 contains a substance having a high electron-injection property. The electron-injection layer 725 can be formed using an alkali metal, an alkaline earth metal, or a compound thereof, such as lithium fluoride (LiF), cesium fluoride (CsF), calcium fluoride (CaF$_2$), or lithium oxide (LiO$_x$). A rare earth metal compound such as erbium fluoride (ErF$_3$) can also be used. An electrode may also be used for the electron-injection layer 725. Examples of the electrode include a substance in which electrons are added at high concentration to calcium oxide-aluminum oxide. Any of the substances given above for forming the electron-transport layer 724 can also be used.

A composite material in which an organic compound and an electron donor (donor) are mixed may also be used for the electron-injection layer 725. Such a composite material is excellent in an electron-injection property and an electron-transport property because electrons are generated in the organic compound by the electron donor. The organic compound here is preferably a material excellent in transporting the generated electrons; specifically, for example, any of the above-described electron-transport materials used for the electron-transport layer 724 (e.g., a metal complex or a heteroaromatic compound) can be used. As the electron donor, a substance showing a property of donating electrons to an organic compound can be used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. A Lewis base such as magnesium oxide can be used. Furthermore, an organic compound such as tetrathiafulvalene (abbreviation: TTF) can be used.

[Charge Generation Layer 792]

The charge generation layer 792 has a function of injecting electrons into the EL layer 786 that is closer to the conductor 772 of the two EL layers 786 in contact with the charge generation layer 792 and injecting holes to the other EL layer 786 that is different from the conductor 788, when a voltage is applied between the conductor 772 and the conductor 788. For example, in the light-emitting device 572 with the structure illustrated in FIG. 22C, the charge generation layer 792 has a function of injecting electrons into the EL layer 786a and injecting holes into the EL layer 786b. Note that the charge generation layer 792 may have either a structure in which an electron acceptor (acceptor) is added to a hole-transport material or a structure in which an electron donor (donor) is added to an electron-transport material. Alternatively, both of these structures may be stacked. Forming the charge generation layer 792 by using any of the above materials can inhibit an increase in driving voltage of the display apparatus 100 including the stack of the EL layers.

When the charge generation layer 792 has a structure in which an electron acceptor is added to a hole-transport material, the electron acceptor can be 7,7,8,8-tetracyano-2,3,5,6-tetrafluoroquinodimethane (abbreviation: $F_4$-TCNQ), chloranil, or the like. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

When the charge generation layer 792 has a structure in which an electron donor is added to an electron-transport material, an alkali metal, an alkaline earth metal, a rare earth metal, or a metal that belongs to Group 2 or Group 13 of the periodic table, or an oxide or carbonate thereof can be used as the electron donor. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

For fabrication of the light-emitting device 572, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

Note that materials for the functional layers (the hole-injection layer, the hole-transport layer, the light-emitting layer, the electron-transport layer, and the electron-injection layer) included in the EL layer and the charge generation layer of the light-emitting device described in this embodiment are not limited to the above materials, and other materials can be used in combination as long as the functions of the layers are fulfilled. For example, a high molecular compound (e.g., an oligomer, a dendrimer, and a polymer), a middle molecular compound (a compound between a low molecular compound and a high molecular compound, with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

At least part of the structure examples, the drawings corresponding thereto, and the like described in this embodiment can be implemented in combination with the other structure examples, the other drawings, or the like as appropriate.

At least part of this embodiment can be implemented in combination with the other embodiments described in this specification as appropriate.

Embodiment 2

In this embodiment, transistors that can be used in the display apparatus of one embodiment of the present invention will be described.

<Structure Example 1 of Transistor>

Figure 23A:
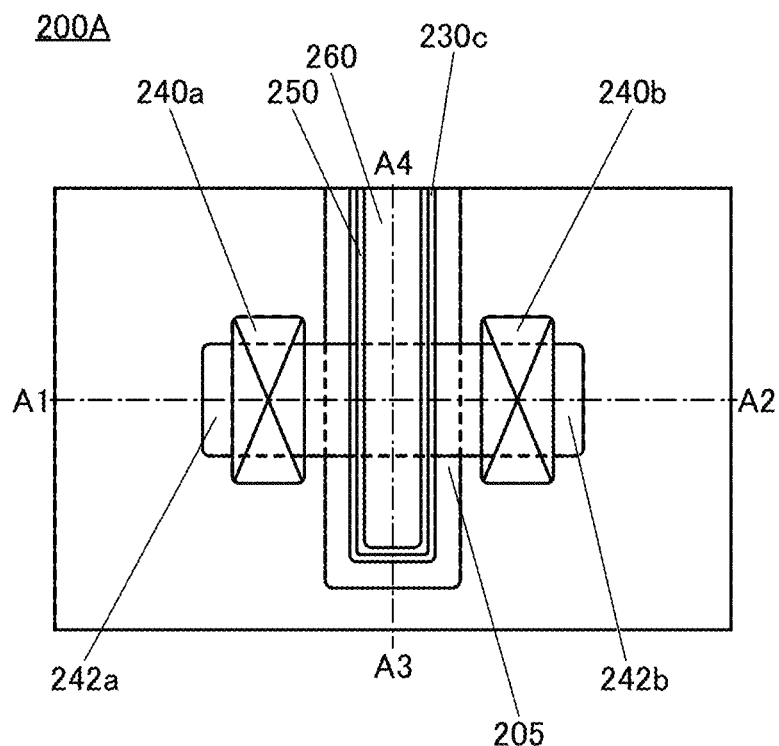
FIG. 23A is a top view illustrating a structure example of a transistor.
Figure 23C:
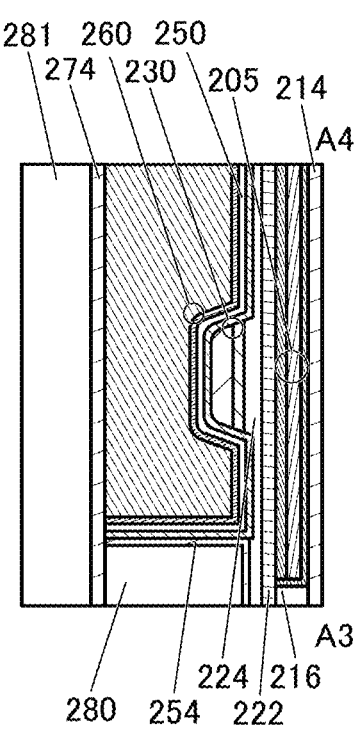
FIG. 23B and FIG. 23C are cross-sectional views illustrating the structure example of the transistor.
Figure 23B:
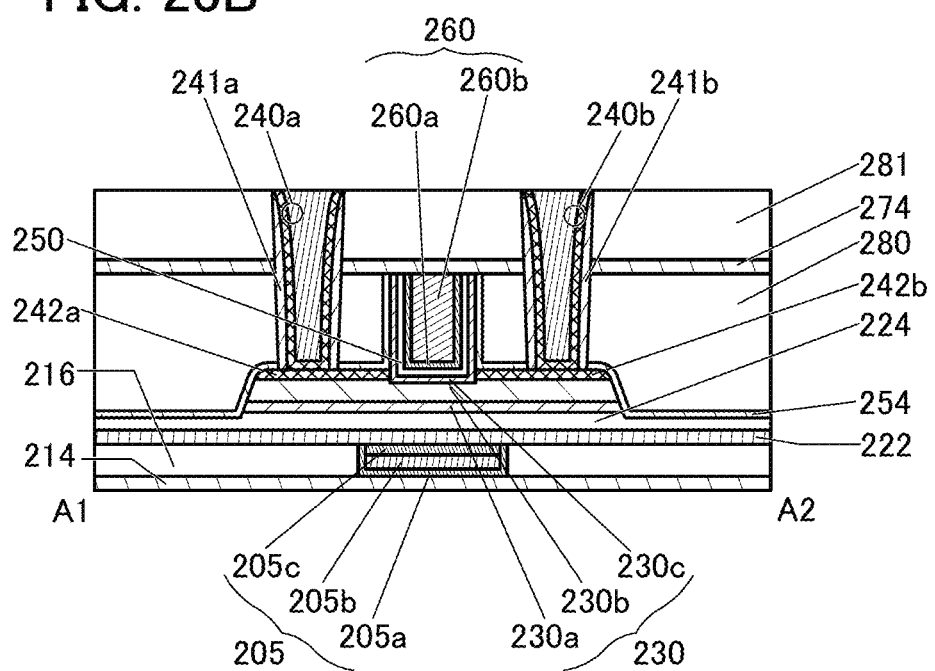

FIG. 23A, FIG. 23B, and FIG. 23C are a top view and cross-sectional views of a transistor 200A that can be used in the display apparatus of one embodiment of the present invention and the periphery of the transistor 200A. The transistor 200A can be used in the display apparatus of one embodiment of the present invention.

FIG. 23A is a top view of the transistor 200A. FIG. 23B and FIG. 23C are cross-sectional views of the transistor 200A. Here, FIG. 23B is a cross-sectional view of a portion indicated by the dashed-dotted line A1-A2 in FIG. 23A and is a cross-sectional view of the transistor 200A in the channel length direction. FIG. 23C is a cross-sectional view of a portion indicated by the dashed-dotted line A3-A4 in FIG. 23A and is a cross-sectional view of the transistor 200A in the channel width direction. Note that some components are omitted in the top view of FIG. 23A for clarity of the drawing.

As illustrated in FIG. 23B, the transistor 200A includes a metal oxide 230a placed over a substrate (not illustrated); a metal oxide 230b placed over the metal oxide 230a; a conductor 242a and a conductor 242b that are placed apart from each other over the metal oxide 230b; the insulator 280 that is placed over the conductor 242a and the conductor 242b and has an opening between the conductor 242a and the conductor 242b; a conductor 260 placed in the opening; an insulator 250 placed between the conductor 260 and each of the metal oxide 230b, the conductor 242a, the conductor 242b, and the insulator 280; and a metal oxide 230c placed between the insulator 250 and each of the metal oxide 230b, the conductor 242a, the conductor 242b, and the insulator 280. Here, as illustrated in FIG. 23B and FIG. 23C, preferably, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 200A illustrated in FIG. 23, side surfaces of the conductor 242a and the conductor 242b on the conductor 260 side are substantially perpendicular. Note that the transistor 200A illustrated in FIG. 23 is not limited thereto, and the angle formed between the side surfaces and the bottom surfaces of the conductor 242a and the conductor 242b may be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 23, the insulator 254 is preferably placed between the insulator 280 and each of the insulator 224, the metal oxide 230a, the metal oxide 230b, the conductor 242a, the conductor 242b, and the metal oxide 230c. Here, as illustrated in FIG. 23B and FIG. 23C, insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 200A, three layers of the metal oxide 230a, the metal oxide 230b, and the metal oxide 230c are stacked in and around the region where the channel is formed (hereinafter also referred to as channel formation region); however, the present invention is not limited thereto. For example, a two-layer structure of the metal oxide 230b and the metal oxide 230c or a stacked-layer structure of four or more layers may be employed. Although the conductor 260 is illustrated to have a stacked-layer structure of two layers in the transistor 200A, the present invention is not limited thereto. For example, the conductor 260 may have a single-layer structure or a stacked-layer structure of three or more layers. Furthermore, each of the metal oxide 230a, the metal oxide 230b, and the metal oxide 230c may have a stacked-layer structure of two or more layers.

For example, in the case where the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b each function as a source electrode or a drain electrode. As described above, the conductor 260 is formed to be embedded in the opening of the insulator 280 and the region interposed between the conductor 242a and the conductor 242b. Here, the positions of the conductor 260, the conductor 242a, and the conductor 242b are selected in a self-aligned manner with respect to the opening of the insulator 280. In other words, in the transistor 200A, the gate electrode can be placed between the source electrode and the drain electrode in a self-aligned manner. Thus, the conductor 260 can be formed without an alignment margin, resulting in a reduction in the area occupied by the transistor 200A. Accordingly, the display apparatus can have higher resolution. In addition, the display apparatus can have a narrow bezel.

As illustrated in FIG. 23, the conductor 260 preferably includes a conductor 260a provided on the inner side of the insulator 250 and a conductor 260b provided to be embedded on the inner side of the conductor 260a.

The transistor 200A preferably includes the insulator 214 placed over the substrate (not illustrated); the insulator 216 placed over the insulator 214; a conductor 205 placed to be embedded in the insulator 216; the insulator 222 placed over the insulator 216 and the conductor 205; and the insulator 224 placed over the insulator 222. The metal oxide 230a is preferably placed over the insulator 224.

The insulator 274 and the insulator 281 functioning as interlayer films are preferably placed over the transistor 200A. Here, the insulator 274 is preferably placed in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of at least one of oxygen (e.g., oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen contained in the insulator 280 and the insulator 281 into the insulator 224, the metal oxide 230, and the insulator 250 or excess oxygen into the insulator 224, the metal oxide 230a, the metal oxide 230b, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. In addition, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used as the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 23B, the metal oxide 230b in a region that is not overlapped by the conductor 242 sometimes has a smaller thickness than the metal oxide 230b in a region that is overlapped by the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230*b* in the vicinity of the interface with the conductive film. Removing the low-resistance region positioned between the conductor 242*a* and the conductor 242*b* on the top surface of the metal oxide 230*b* in the above manner can prevent formation of the channel in the region.

According to one embodiment of the present invention, a display apparatus that includes small-size transistors and has high resolution can be provided. A display apparatus that includes a transistor with a high on-state current and has high luminance can be provided. A display apparatus that includes a transistor operating at high speed and thus operates at high speed can be provided. A display apparatus that includes a transistor having stable electrical characteristics and is highly reliable can be provided. A display apparatus that includes a transistor with a low off-state current and has low power consumption can be provided.

The structure of the transistor 200A that can be used in the display apparatus of one embodiment of the present invention is described in detail.

The conductor 205 is placed to include a region overlapped by the metal oxide 230 and the conductor 260. Furthermore, the conductor 205 is preferably provided to be embedded in the insulator 216.

The conductor 205 includes the conductor 205*a*, the conductor 205*b*, and the conductor 205*c*. The conductor 205*a* is provided in contact with the bottom surface and a side wall of the opening provided in the insulator 216. The conductor 205*b* is provided to be embedded in a recessed portion formed in the conductor 205*a*. Here, the top surface of the conductor 205*b* is lower in level than the top surface of the conductor 205*a* and the top surface of the insulator 216. The conductor 205*c* is provided in contact with the top surface of the conductor 205*b* and the side surface of the conductor 205*a*. Here, the top surface of the conductor 205*c* is substantially level with the top surface of the conductor 205*a* and the top surface of the insulator 216. That is, the conductor 205*b* is surrounded by the conductor 205*a* and the conductor 205*c*.

Here, for the conductor 205*a* and the conductor 205*c*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom and an oxygen molecule).

When the conductor 205*a* and the conductor 205*c* are formed using a conductive material having a function of inhibiting diffusion of hydrogen, impurities such as hydrogen contained in the conductor 205*b* can be inhibited from diffusing into the metal oxide 230 through the insulator 224 and the like. When the conductor 205*a* and the conductor 205*c* are formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used.

For the conductor 205*b*, a conductive material containing tungsten, copper, or aluminum as its main component is preferably used. For example, tungsten is used for the conductor 205*b*.

The conductor 260 sometimes functions as a first gate (also referred to as top gate) electrode. The conductor 205 sometimes functions as a second gate (also referred to as bottom gate) electrode. In that case, by changing a potential applied to the conductor 205 not in synchronization with but independently of a potential applied to the conductor 260, $V_{th}$ of the transistor 200A can be controlled. In particular, by applying a negative potential to the conductor 205, Vth of the transistor 200A can be higher than 0 V and the off-state current can be made small. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 23C. In other words, the conductor 205 and the conductor 260 preferably overlap each other with the insulator placed therebetween, in a region outside the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

Furthermore, as illustrated in FIG. 23C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water or hydrogen to the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are less likely to pass). Alternatively, it is preferable to use an insulating material having a function of inhibiting diffusion of at least one of oxygen (e.g., an oxygen atom or an oxygen molecule) (an insulating material through which the oxygen is less likely to pass).

For example, aluminum oxide or silicon nitride is preferably used for the insulator 214. Accordingly, it is possible to inhibit diffusion of impurities such as water or hydrogen to the transistor 200A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 23C, the insulator 224 is sometimes thinner in a region that is not overlapped by neither the insulator 254 nor the metal oxide 230b than in the other regions. In the insulator 224, the region that is not overlapped by neither the insulator 254 nor the metal oxide 230b preferably has a thickness with which the above oxygen can be adequately diffused.

Like the insulator 214 and the like, the insulator 222 preferably functions as a barrier insulating film that inhibits the entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 200A from outside can be inhibited.

Furthermore, it is preferable that the insulator 222 have a function of inhibiting diffusion of at least one of oxygen (e.g., an oxygen atom and an oxygen molecule) (it is preferable that the oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. Moreover, the conductor 205 can be inhibited from reacting with oxygen contained in the insulator 224 or the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a. Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably greater than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In this case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably greater than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy level of the conduction band minimum at junction portions between the metal oxide 230a, the metal oxide 230b, and the metal oxide 230c is continuously varied or are continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, an In—Ga—Zn oxide, a Ga—Zn oxide, gallium oxide, or the like may be used as the metal oxide 230a and the metal oxide 230c, in the case where the metal oxide 230b is an In—Ga—Zn oxide. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] can be used. As the metal oxide 230b, a metal oxide with In:Ga:Zn=4:2:3 [atomic ratio] or 3:1:2 [atomic ratio] can be used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element contained in the metal oxide 230c to the insulator 250 side can be expected. Specifically, the metal oxide 230c has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 230c having a stacked-layer structure allows a highly reliable display apparatus to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to be overlapped by the opening of the insulator 280. Accordingly, the conductor 260 can be formed in a self-aligned manner between the conductor 242a and the conductor 242b.

The insulator 250 functions as a gate insulator. The insulator 250 is preferably placed in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 is illustrated to have a two-layer structure in FIG. 23, the conductor 260 may have a single-layer structure or a stacked-layer structure of three or more layers.

The conductor 260*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of at least one of oxygen (e.g., an oxygen atom and an oxygen molecule).

When the conductor 260*a* has a function of inhibiting diffusion of oxygen, it is possible to inhibit reduction of the conductivity due to oxidation of the conductor 260*b* by oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260*b*. The conductor 260 also functions as a wiring and thus is preferably formed using a conductor having high conductivity. For example, a conductive material containing tungsten, copper, or aluminum as its main component can be used. The conductor 260*b* may have a stacked-layer structure, for example, a stacked-layer structure of titanium or titanium nitride and the above conductive material.

As illustrated in FIG. 23A and FIG. 23C, the side surface of the metal oxide 230 is covered with the conductor 260 in a region where the metal oxide 230*b* is not overlapped by the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 200A can be increased and the frequency characteristics can be improved.

The insulator 254, like the insulator 214 and the like, preferably functions as a barrier insulating film that inhibits the entry of impurities such as water or hydrogen into the transistor 200A from the insulator 280 side. The insulator 254 preferably has lower hydrogen permeability than the insulator 224, for example. Furthermore, as illustrated in FIG. 23B and FIG. 23C, the insulator 254 is preferably in contact with the side surface of the metal oxide 230*c*, the top and side surfaces of the conductor 242*a*, the top and side surfaces of the conductor 242*b*, side surfaces of the metal oxide 230*a* and the metal oxide 230*b*, and the top surface of the insulator 224. Such a structure can inhibit the entry of hydrogen contained in the insulator 280 into the metal oxide 230 through the top surfaces or side surfaces of the conductor 242*a*, the conductor 242*b*, the metal oxide 230*a*, the metal oxide 230*b*, and the insulator 224.

Furthermore, it is preferable that the insulator 254 have a function of inhibiting diffusion of at least one of oxygen (e.g., an oxygen atom and an oxygen molecule) (it is preferable that the oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward diffusion of oxygen, oxygen can be prevented from diffusing from the metal oxide 230 into the insulator 280. Moreover, with the insulator 222 having a function of inhibiting downward diffusion of oxygen, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit the entry of impurities such as hydrogen from outside of the transistor 200A, resulting in favorable electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen to be released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 240*a* and the conductor 240*b* are placed in openings formed in the insulator 281, the insulator 274, the insulator 280, and the insulator 254. The conductor 240*a* and the conductor 240*b* are placed to face each other with the conductor 260 therebetween. Note that the top surfaces of the conductor 240*a* and the conductor 240*b* may be on the same plane as the top surface of the insulator 281.

The insulator 241*a* is provided in contact with the inner walls of the openings in the insulator 281, the insulator 274, the insulator 280, and the insulator 254, and the first conductor of the conductor 240*a* is formed in contact with the side surface of the insulator 241*a*. The conductor 242*a* is positioned on at least part of the bottom portion of the opening, and the conductor 240*a* is in contact with the conductor 242*a*. Similarly, the insulator 241*b* is provided in contact with the inner walls of the openings in the insulator 281, the insulator 274, the insulator 280, and the insulator 254, and the first conductor of the conductor 240*b* is formed in contact with the side surface of the insulator 241*b*. The conductor 242*b* is positioned on at least part of the bottom portion of the opening, and the conductor 240*b* is in contact with the conductor 242*b*.

The conductor 240*a* and the conductor 240*b* are preferably formed using a conductive material containing tungsten, copper, or aluminum as its main component. The conductor 240*a* and the conductor 240*b* may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230*a*, the metal oxide 230*b*, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 280 from being absorbed by the conductor 240*a* and the conductor 240*b*. Moreover, impurities such as water or hydrogen can be inhibited from entering the metal oxide 230 through the conductor 240*a* and the conductor 240*b* from a layer above the insulator 281.

As the insulator 241*a* and the insulator 241*b*, for example, the insulator that can be used as the insulator 254 or the like can be used. Since the insulator 241*a* and the insulator 241*b* are provided in contact with the insulator 254, impurities such as water or hydrogen in the insulator 280 or the like can be inhibited from entering the metal oxide 230 through the conductor 240*a* and the conductor 240*b*. Furthermore, oxygen contained in the insulator 280 can be inhibited from being absorbed by the conductor 240*a* and the conductor 240*b*.

Although not illustrated, a conductor functioning as a wiring may be placed in contact with the top surface of the conductor 240*a* and the top surface of the conductor 240*b*. For the conductor functioning as a wiring, a conductive material containing tungsten, copper, or aluminum as its main component is preferably used. Furthermore, the conductor may have a stacked-layer structure and may be a stack of titanium or a titanium nitride and the above conductive material, for example. Note that the conductor may be formed to be embedded in an opening provided in an insulator.

<Structure Example 2 of Transistor>

Figure 24A:
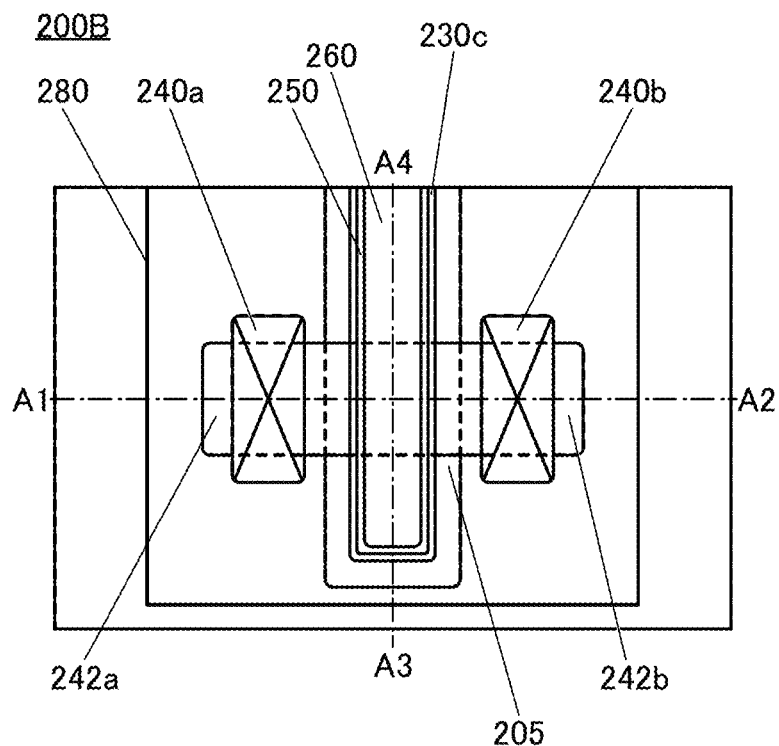
FIG. 24A is a top view illustrating a structure example of a transistor.
Figure 24C:
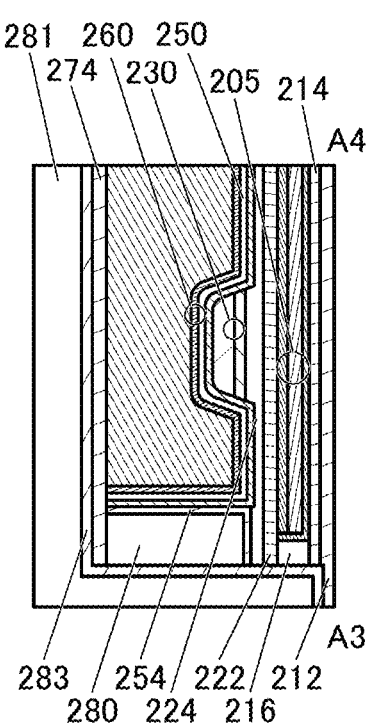
FIG. 24B and FIG. 24C are cross-sectional views illustrating the structure example of the transistor.
Figure 24B:
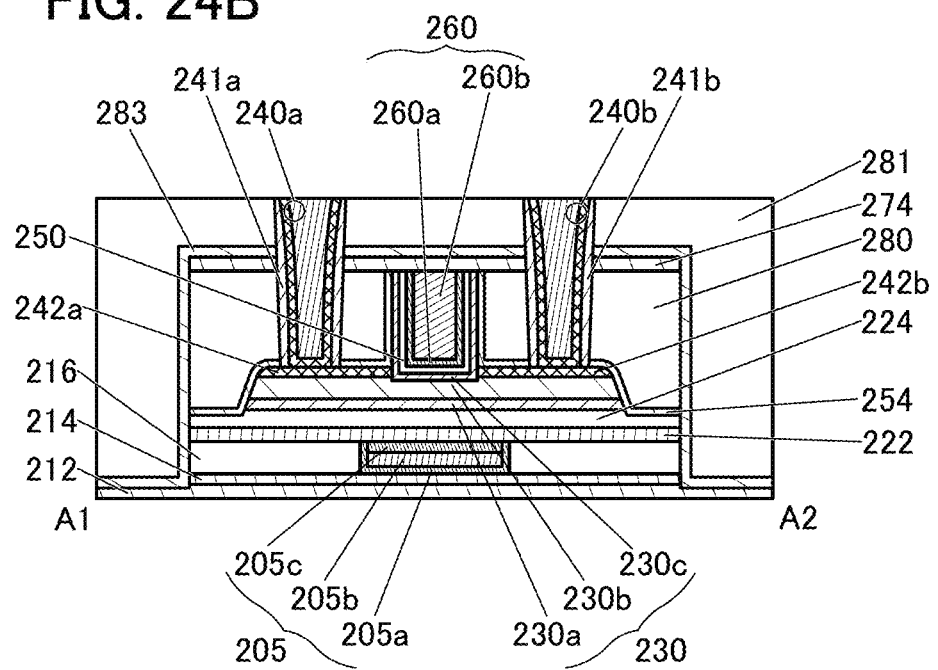

FIG. 24A, FIG. 24B, and FIG. 24C are a top view and cross-sectional views of a transistor 200B that can be used in the display apparatus of one embodiment of the present invention and the periphery of the transistor 200B. The transistor 200B is a variation example of the transistor 200A.

FIG. 24A is a top view of the transistor 200B. FIG. 24B and FIG. 24C are cross-sectional views of the transistor 200B. Here, FIG. 24B is a cross-sectional view of a portion indicated by the dashed-dotted line A1-A2 in FIG. 24A, and is also a cross-sectional view of the transistor 200B in the channel length direction. FIG. 24C is a cross-sectional view of a portion indicated by the dashed-dotted line A3-A4 in FIG. 24A, and is also a cross-sectional view of the transistor 200B in the channel width direction. Note that some components are omitted in the top view of FIG. 24A for clarity of the drawing.

The transistor 200B is different from the transistor 200A in including an insulator 212 and an insulator 283.

In the transistor 200B, the insulator 212 is provided over a substrate (not illustrated). In addition, the insulator 283 is provided over the insulator 212 and an insulator 271.

The transistor 200B has a structure in which the insulator 283 covers the insulator 214, the insulator 216, the insulator 222, the insulator 224, the insulator 244, the insulator 280, and the insulator 274. The insulator 283 is in contact with the top surface of the insulator 274, the side surface of the insulator 274, the side surface of the insulator 280, the side surface of the insulator 244, the side surface of the insulator 224, the side surface of the insulator 222, the side surface of the insulator 216, the side surface of the insulator 214, and the top surface of the insulator 212. Thus, the metal oxide 230 and the like are isolated from the outside by the insulator 283 and the insulator 212.

The insulator 283 and the insulator 212 preferably have high capability of inhibiting diffusion of hydrogen (e.g., at least one of a hydrogen atom, a hydrogen molecule, and the like) or a water molecule. For example, the insulator 281 and the insulator 212 are preferably formed using silicon nitride or silicon nitride oxide that is a material having a high hydrogen barrier property. This can inhibit diffusion of hydrogen or the like into the metal oxide 230, thereby suppressing the degradation of the characteristics of the transistor 200B. Consequently, the reliability of the semiconductor device of one embodiment of the present invention can be increased.

For example, silicon nitride can be used for the insulator 283. When the insulator 283 is formed by a sputtering method, a high-density silicon nitride film where a void or the like is less likely to be formed can be obtained. To obtain the insulator 283, silicon nitride deposited by an ALD method may be stacked over silicon nitride deposited by a sputtering method. Such a structure is preferable because even when a defect such as a void is generated in silicon nitride deposited by a sputtering method, the void can be filled with silicon nitride deposited by an ALD method achieving good coverage, so that sealing capability can be increased. For the insulator 212, any of the materials that can be used for the insulator 214 can be used. For example, silicon nitride can be used for the insulator 212 and aluminum oxide can be used for the insulator 214.

<Structure Example 3 of Transistor>

Figure 25A:
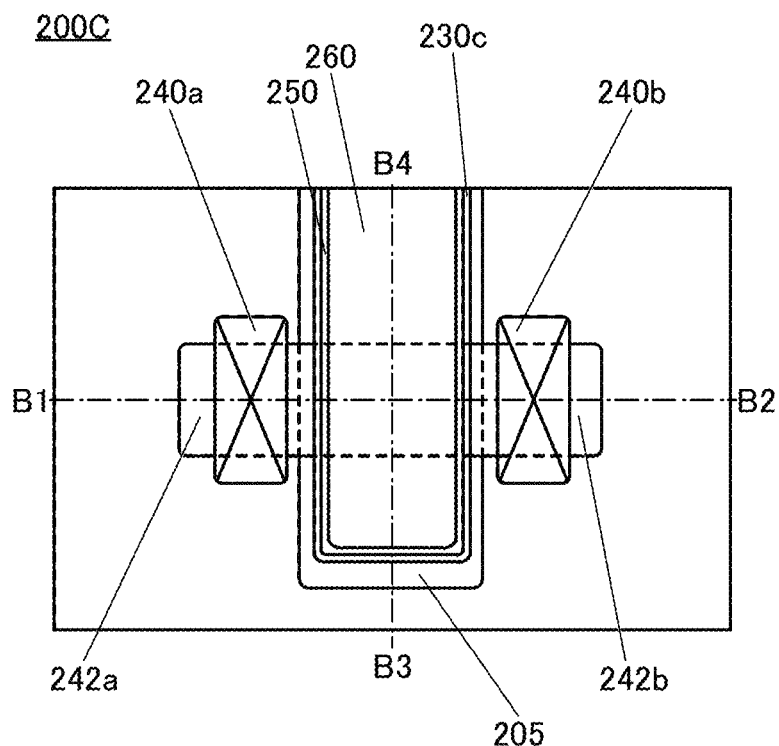
FIG. 25A is a top view illustrating a structure example of a transistor.
Figure 25C:
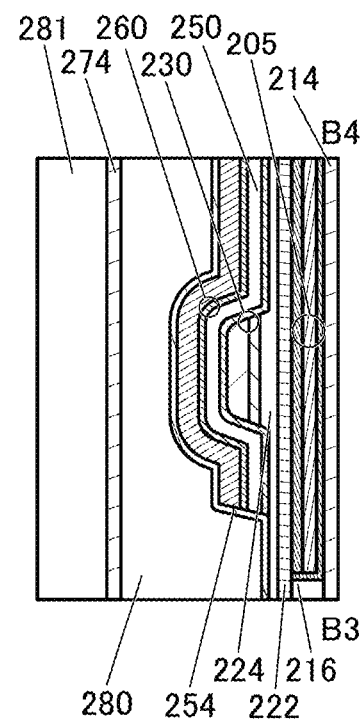
FIG. 25B and FIG. 25C are cross-sectional views illustrating the structure example of the transistor.
Figure 25B:
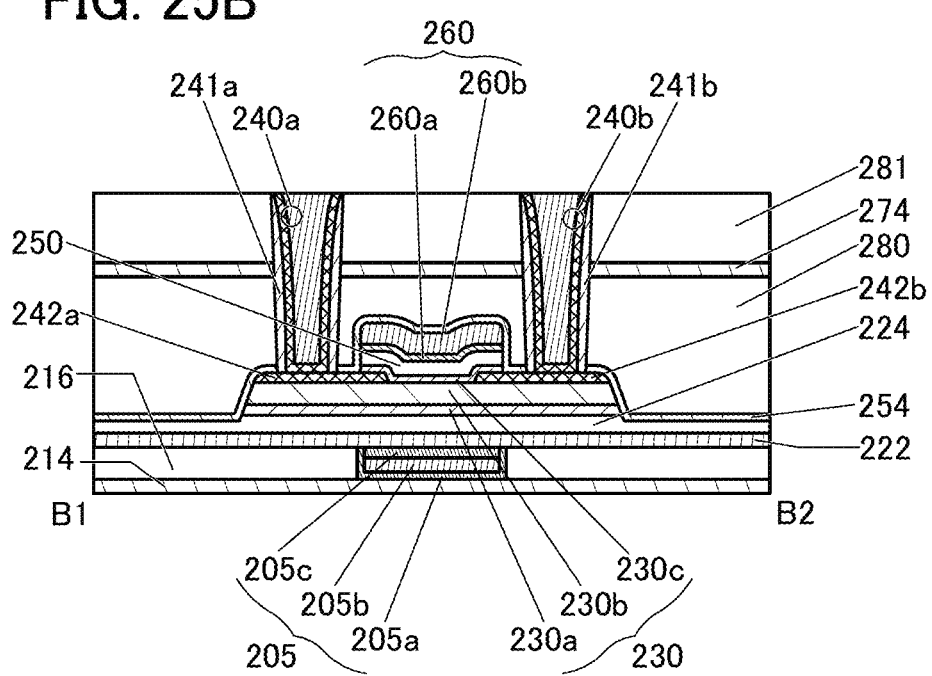

FIG. 25A, FIG. 25B, and FIG. 25C are a top view and cross-sectional views of a transistor 200C that can be used in the display apparatus of one embodiment of the present invention and the periphery of the transistor 200C. The transistor 200C is a variation example of the transistor 200A.

FIG. 25A is a top view of the transistor 200C. FIG. 25B and FIG. 25C are cross-sectional views of the transistor 200C. Here, FIG. 25B is a cross-sectional view of a portion indicated by the dashed-dotted line B1-B2 in FIG. 25A and is also a cross-sectional view of the transistor 200C in the channel length direction. FIG. 25C is a cross-sectional view of a portion indicated by the dashed-dotted line B3-B4 in FIG. 25A and is also a cross-sectional view of the transistor 200C in the channel width direction. Note that some components are omitted in the top view of FIG. 25A for clarity of the drawing.

In the transistor 200C, the conductor 242*a* and the conductor 242*b* each have a region overlapped by the metal oxide 230*c*, the insulator 250, and the conductor 260. This enables the transistor 200C to have a high on-state current. This also enables the transistor 200C to be a transistor that is easy to control.

The conductor 260 functioning as a gate electrode includes the conductor 260a and the conductor 260b over the conductor 260a. For the conductor 260a, a conductive material having a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the range of choices for the material of the conductor 260b can be expanded. In other words, the conductor 260a inhibits oxidation of the conductor 260b, thereby preventing a decrease in conductivity.

The insulator 254 is preferably provided to cover the top surface and the side surface of the conductor 260, the side surface of the insulator 250, and the side surface of the metal oxide 230c. Note that an insulating material having a function of inhibiting diffusion of oxygen and impurities such as water or hydrogen is preferably used for the insulator 254.

Providing the insulator 254 can inhibit oxidation of the conductor 260. Moreover, the insulator 254 can inhibit diffusion of impurities such as water or hydrogen contained in the insulator 280 into the transistor 200C.

<Structure Example 4 of Transistor>

Figure 26A:
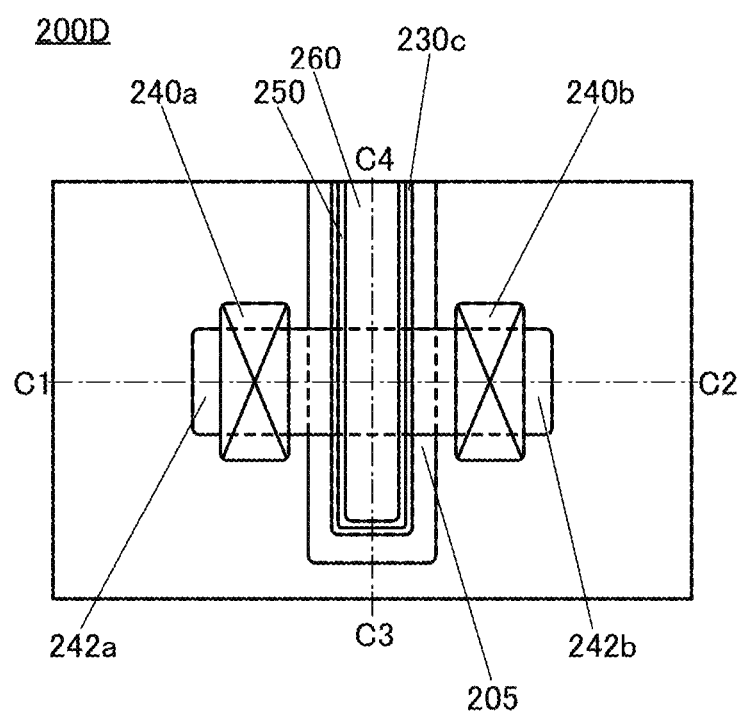
FIG. 26A is a top view illustrating a structure example of a transistor.
Figure 26C:
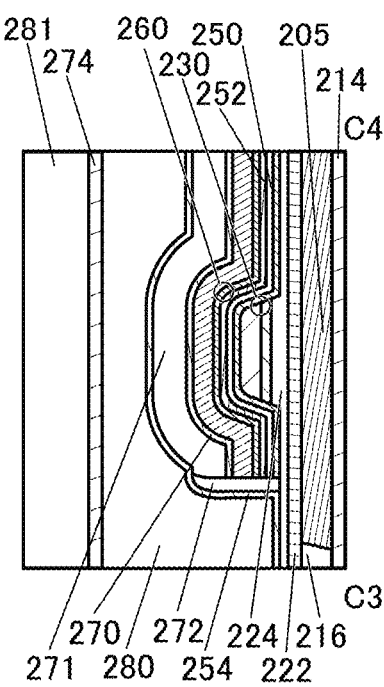
FIG. 26B and FIG. 26C are cross-sectional views illustrating the structure example of the transistor.
Figure 26B:
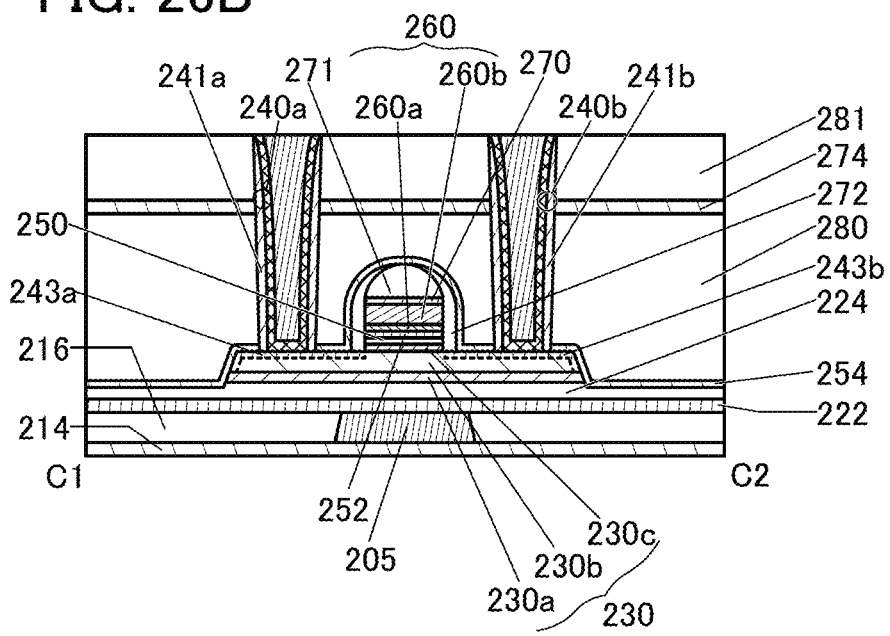

FIG. 26A, FIG. 26B, and FIG. 26C are a top view and cross-sectional views of a transistor 200D that can be used in the display apparatus of one embodiment of the present invention and the periphery of the transistor 200D. The transistor 200D is a variation example of the transistor 200A.

FIG. 26A is a top view of the transistor 200D. FIG. 26B and FIG. 26C are cross-sectional views of the transistor 200D. Here, FIG. 26B is a cross-sectional view of a portion indicated by the dashed-dotted line C1-C2 in FIG. 26A and is also a cross-sectional view of the transistor 200D in the channel length direction. FIG. 26C is a cross-sectional view of a portion indicated by the dashed-dotted line C3-C4 in FIG. 26A and is also a cross-sectional view of the transistor 200D in the channel width direction. Note that some components are omitted in the top view of FIG. 26A for clarity of the drawing.

The transistor 200D includes the insulator 250 over the metal oxide 230c and a metal oxide 252 over the insulator 250. The conductor 260 is provided over the metal oxide 252, and an insulator 270 is provided over the conductor 260. An insulator 271 is provided over the insulator 270.

The metal oxide 252 preferably has a function of inhibiting oxygen diffusion. When the metal oxide 252 that inhibits oxygen diffusion is provided between the insulator 250 and the conductor 260, oxygen diffusion into the conductor 260 is inhibited. In other words, a reduction in the amount of oxygen supplied to the metal oxide 230 can be inhibited. Moreover, oxidization of the conductor 260 due to oxygen can be inhibited.

Note that the metal oxide 252 may function as part of a gate electrode. For example, an oxide semiconductor that can be used for the metal oxide 230 can be used for the metal oxide 252. In that case, when the conductor 260 is formed by a sputtering method, the metal oxide 252 can have a reduced electric resistance and become a conductor. Such a conductor can be referred to as an OC (Oxide Conductor) electrode.

Note that the metal oxide 252 may function as part of a gate insulator. Thus, when silicon oxide, silicon oxynitride, or the like is used for the insulator 250, a metal oxide that is a high-k material with a high dielectric constant is preferably used as the metal oxide 252. Such a stacked-layer structure can be thermally stable and can have a high dielectric constant. Accordingly, a gate potential applied at the time of operation of the transistor can be lowered while the physical thickness is maintained. In addition, the equivalent oxide thickness (EOT) of an insulating layer functioning as a gate insulator can be reduced.

Although the metal oxide 252 in the transistor 200D is illustrated as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200D can be increased without a reduction in the influence of the electric field from the conductor 260. In addition, with the metal oxide 252 functioning as a gate insulator, the distance between the conductor 260 and the metal oxide 230 is kept by the physical thicknesses of the insulator 250 and the metal oxide 252, so that leakage current between the conductor 260 and the metal oxide 230 can be reduced. Thus, the stacked-layer structure of the insulator 250 and the metal oxide 252 makes it easy to adjust the physical distance between the conductor 260 and the metal oxide 230 and the intensity of electric fields applied from the conductor 260 to the metal oxide 230.

Specifically, for the metal oxide 252, a material obtained by reducing the resistance of an oxide semiconductor that can be used for the metal oxide 230 can be used. Alternatively, a metal oxide containing one or more of hafnium, aluminum, gallium, yttrium, zirconium, tungsten, titanium, tantalum, nickel, germanium, magnesium, and the like can be used.

In particular, it is preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 252 is not an essential component. Design is appropriately determined in consideration of required transistor characteristics.

For the insulator 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen from above the insulator 270 can be inhibited. Moreover, the entry of impurities such as water or hydrogen from above the insulator 270 into the metal oxide 230 through the conductor 260 and the insulator 250 can be inhibited.

The insulator 271 functions as a hard mask. By providing the insulator 271, the conductor 260 can be processed such that the side surface of the conductor 260 is substantially perpendicular; specifically, an angle formed by the side surface of the conductor 260 and a surface of the substrate can be greater than or equal to 75° and less than or equal to 100°, preferably greater than or equal to 80° and less than or equal to 95°.

Note that the insulator 271 may be formed using an insulating material having a function of inhibiting the passage of oxygen and impurities such as water or hydrogen so that the insulator 271 also functions as a barrier layer. In that case, it is not necessary to provide the insulator 270.

Parts of the insulator 270, the conductor 260, the metal oxide 252, the insulator 250, and the metal oxide 230c are selectively removed using the insulator 271 as a hard mask, whereby their side surfaces can be substantially aligned with each other and the surface of the metal oxide 230b can be partly exposed.

The transistor 200D includes a region 243a and a region 243b on part of the exposed surface of the metal oxide 230b. One of the region 243a and the region 243b functions as a source region, and the other of the region 243a and the region 243b functions as a drain region.

The region 243a and the region 243b can be formed by adding an impurity element such as phosphorus or boron to the exposed surface of the metal oxide 230b by an ion implantation method, an ion doping method, a plasma immersion ion implantation method, or plasma treatment, for example. In this embodiment and the like, an "impurity element" refers to an element other than main constituent elements.

The region 243a and the region 243b can also be formed in such a manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as "impurity regions" or "low-resistance regions".

The region 243a and the region 243b can be formed in a self-aligned manner by using the insulator 271 and/or the conductor 260 as a mask. Accordingly, the conductor 260 does not overlap the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves a higher on-state current, a lower threshold voltage, and a higher operating frequency, for example.

The transistor 200D includes an insulator 272 on the side surfaces of the insulator 271, the insulator 270, the conductor 260, the metal oxide 252, the insulator 250, and the metal oxide 230c. The insulator 272 is preferably an insulator having a low dielectric constant. For example, the insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. In particular, silicon oxide, silicon oxynitride, silicon nitride oxide, or porous silicon oxide is preferably used for the insulator 272, in which case an excess oxygen region can be easily formed in the insulator 272 in a later step. Silicon oxide and silicon oxynitride are preferable because they are thermally stable. The insulator 272 preferably has a function of diffusing oxygen.

Note that an offset region may be provided between the channel formation region and the source/drain region in order to further reduce the off-state current. The offset region is a region where the electrical resistivity is high and a region where the above-described addition of the impurity element is not performed. The offset region can be formed in such a manner that the insulator 272 is formed and then the above-described addition of the impurity element is performed. In that case, the insulator 272 also serves as a mask, like the insulator 271 or the like. Thus, the impurity element is not added to a region of the metal oxide 230b overlapped by the insulator 272, so that the electrical resistivity of the region can be kept high.

The transistor 200D also includes the insulator 254 over the insulator 272 and the metal oxide 230. The insulator 254 is preferably formed by a sputtering method. By a sputtering method, an insulator containing few impurities such as water or hydrogen can be formed.

Note that an oxide film obtained by a sputtering method may extract hydrogen from a component over which the oxide film is formed. For that reason, the hydrogen concentrations in the metal oxide 230 and the insulator 272 can be reduced when the insulator 254 absorbs hydrogen and water from the metal oxide 230 and the insulator 272.

<Materials for Transistor>

Materials that can be used for the transistor will be described.

[Substrate]

As a substrate where the transistor 200A, the transistor 200B, the transistor 200C, or the transistor 200D is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting device, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of leakage current may arise because of a thinned gate insulator. When a high-k material is used for the insulator functioning as a gate insulator, the voltage at the time of operation of the transistor can be reduced while the physical thickness is maintained. By contrast, when a material with a low dielectric constant is used for the insulator functioning as an interlayer film, parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 230, oxygen vacancies in the metal oxide 230 can be compensated.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

Embodiment 3

Described in this embodiment is a metal oxide (hereinafter also referred to as an oxide semiconductor) that can be used in an OS transistor described in the above embodiment.

<Classification of Crystal Structures>

First, the classification of the crystal structures of an oxide semiconductor will be described with reference to FIG. 27A. FIG. 27A is a diagram showing the classification of crystal structures of an oxide semiconductor, typically IGZO (a metal oxide containing In, Ga, and Zn).

As shown in FIG. 27A, an oxide semiconductor is roughly classified into "Amorphous", "Crystalline", and "Crystal". The term "Amorphous" includes a completely amorphous structure. The term "Crystalline" includes CAAC (c-axis-aligned crystalline), nc (nanocrystalline), and CAC (cloud-aligned composite) structures. Note that the term "Crystalline" excludes single crystal, poly crystal, and completely amorphous structures. The term "Crystal" includes single crystal and poly crystal structures.

Note that the structures in the thick frame shown in FIG. 27A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 27B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 27B and obtained by GIXD measurement is hereinafter simply referred to as an XRD spectrum. The CAAC-IGZO film in FIG. 27B has a composition of In:Ga:Zn=4:2:3 [atomic ratio] or the neighborhood thereof. The CAAC-IGZO film in FIG. 27B has a thickness of 500 nm.

As shown in FIG. 27B, a clear peak indicating crystallinity is observed in the XRD spectrum of the CAAC-IGZO film. In FIG. 27B, the horizontal axis represents 2° [deg.] and the vertical axis represents intensity (Intensity) [a.u.]. Specifically, a peak indicating c-axis alignment is observed at 2° of around 31° in the XRD spectrum of the CAAC-IGZO film. As shown in FIG. 27B, the peak at 2° of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 27C shows a diffraction pattern of the CAAC-IGZO film. FIG. 27C shows a diffraction pattern obtained by the NBED method in which an electron beam is incident in the direction parallel to the substrate. The CAAC-IGZO film in FIG. 27C has a composition of In:Ga:Zn=4:2:3 [atomic ratio] or the neighborhood thereof. In the nanobeam electron diffraction method, electron diffraction is performed with a probe diameter of 1 nm.

As shown in FIG. 27C, a plurality of spots indicating c-axis alignment are observed in the diffraction pattern of the CAAC-IGZO film.

[Structure of Oxide Semiconductor]

Oxide semiconductors might be classified in a manner different from the one in FIG. 27A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Composition of Oxide Semiconductor]

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in an adjacent film is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon (the concentration obtained by secondary ion mass spectrometry (SIMS)) in the oxide semiconductor and in the vicinity of an interface with the oxide semiconductor is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, stable electrical characteristics can be given.

At least part of this embodiment can be implemented in combination with any of the other embodiments described in this specification as appropriate.

Embodiment 4

In this embodiment, electronic devices each including a display apparatus of one embodiment of the present invention are described.

Figure 28A:
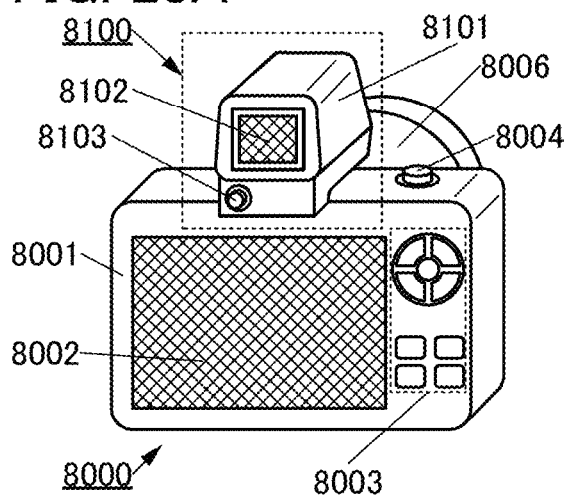
FIG. 28A to FIG. 28E are perspective views illustrating electronic device examples.

FIG. 28A is a diagram illustrating the appearance of a camera 8000 to which a finder 8100 is attached. The camera 8000 is provided with an imaging device. The camera 8000 can be a digital camera, for example. Note that although the camera 8000 and the finder 8100 are separate and detachable electronic devices in FIG. 28A, a finder including a display apparatus may be incorporated in a housing 8001 of the camera 8000.

The camera 8000 includes the housing 8001, a display portion 8002, operation buttons 8003, a shutter button 8004, and the like. In addition, a detachable lens 8006 is attached to the camera 8000.

Although the lens 8006 of the camera 8000 here is detachable from the housing 8001 for replacement, the lens 8006 may be integrated with the housing.

The camera 8000 can take images at the press of the shutter button 8004. The display portion 8002 functions as a touch panel and images can also be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like. The finder 8100 can be an electronic viewfinder.

The housing 8101 includes a mount for engagement with the mount of the camera 8000 so that the finder 8100 can be attached to the camera 8000. The mount includes an electrode, and an image or the like received from the camera 8000 through the electrode can be displayed on the display portion 8102.

The button 8103 functions as a power button. The on/off state of the display portion 8102 can be switched with the button 8103.

A display apparatus of one embodiment of the present invention can be used for the display portion 8002 of the camera 8000 and the display portion 8102 of the finder 8100. The display apparatus of one embodiment of the present invention has extremely high resolution; thus, even when the display portion 8002 or the display portion 8102 is close to the user, a more realistic image can be displayed on the display portion 8002 or the display portion 8102 without perception of pixels by the user. In particular, an image displayed on the display portion 8102 provided in the finder 8100 is perceived when the user brings his/her eyes closer to the eyepiece of the finder 8100; thus, the distance between the user and the display portion 8102 becomes very short. Thus, in particular, the display apparatus of one embodiment of the present invention is preferably used for the display portion 8102. Note that in the case where the display apparatus of one embodiment of the present invention is used for the display portion 8102, the resolution of an image that can be displayed on the display portion 8102 can be 4K, 5K, or higher.

Note that the resolution of an image that can be taken by the imaging device provided in the camera 8000 is preferably the same as or higher than the resolution of an image that can be displayed on the display portion 8002 or the display portion 8102. For example, in the case where an image having a resolution of 4K can be displayed on the display portion 8102, the camera 8000 is preferably provided with an imaging device that can take an image of 4K or higher. Moreover, for example, in the case where an image having a resolution of 5K can be displayed on the display portion 8102, the camera 8000 is preferably provided with an imaging device that can take an image of 5K or higher.

Figure 28B:
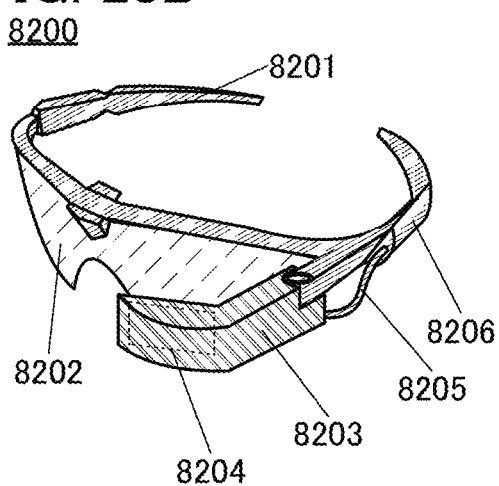

FIG. 28B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball and the eyelid of the user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display apparatus of one embodiment of the present invention can be used for the display portion 8204. Accordingly, the head-mounted display 8200 can have a narrower bezel, and on the display portion 8204, a high-quality image can be displayed and a more realistic image can be displayed.

Figure 28C:
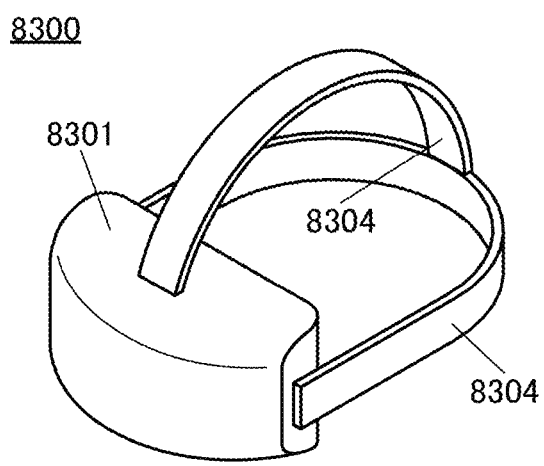
Figure 28D:
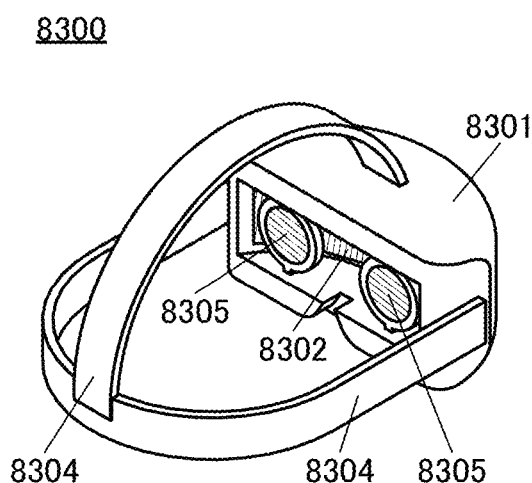
Figure 28E:
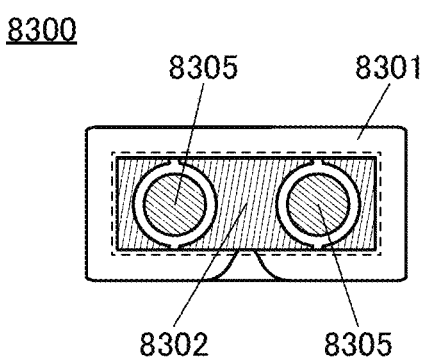

FIG. 28C, FIG. 28D, and FIG. 28E are diagrams illustrating the appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. It is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

Note that the display apparatus of one embodiment of the present invention can be used for the display portion 8302. The display apparatus of one embodiment of the present invention has extremely high resolution; thus, even when an image is magnified using the lenses 8305 as in FIG. 28E, the user does not perceive pixels, and a more realistic image can be displayed.

Next, FIG. 29A to FIG. 29G illustrate examples of electronic devices that are different from the electronic devices illustrated in FIG. 28A to FIG. 28E.

Electronic devices illustrated in FIG. 29A to FIG. 29G include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 29A to FIG. 29G have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 29A to FIG. 29G are not limited thereto, and the electronic devices can have a variety of functions. Although not illustrated in FIG. 29A to FIG. 29G, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, and the like.

The details of the electronic devices illustrated in FIG. 29A to FIG. 29G are described below.

Figure 29A:
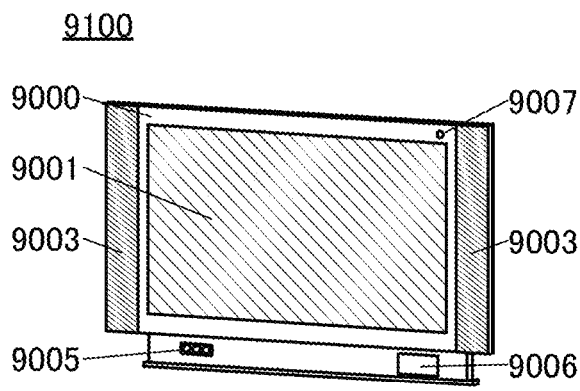
FIG. 29A to FIG. 29G are perspective views illustrating electronic device examples.

FIG. 29A is a perspective view illustrating a television device 9100. The television device 9100 can include the display portion 9001 having a large screen size of, for example, 50 inches or more, or 100 inches or more.

The display apparatus of one embodiment of the present invention can be used for the display portion 9001 included in the television device 9100. Accordingly, the television device 9100 can have a narrower bezel, and on the display portion 9001, a high-quality image can be displayed and a more realistic image can be displayed.

Figure 29D:
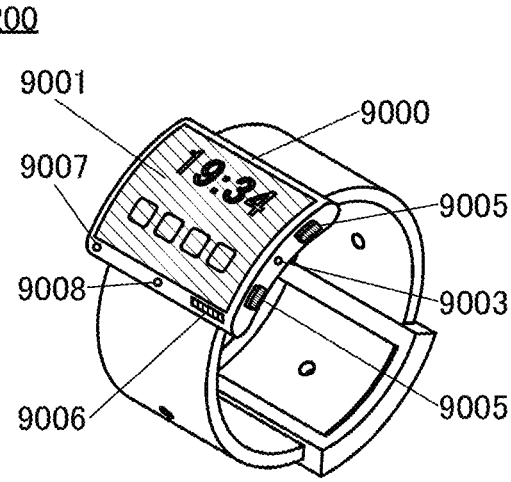
Figure 29B:
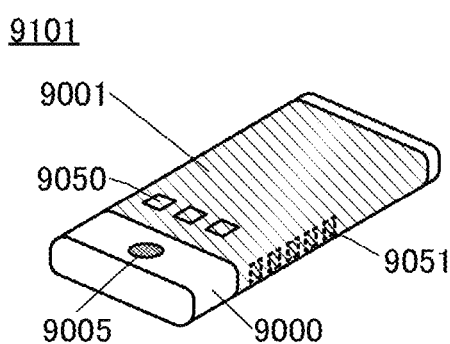

FIG. 29B is a perspective view illustrating a portable information terminal 9101. The portable information terminal 9101 has a function of one or more selected from a telephone set, a notebook, an information browsing device, and the like, for example. Specifically, the portable information terminal can be used as a smartphone. Note that the portable information terminal 9101 may be provided with the speaker 9003, the connection terminal 9006, the sensor 9007, or the like. The portable information terminal 9101 can display characters and image information on its plurality of surfaces. For example, three operation buttons 9050 (also referred to as operation icons, or simply icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display apparatus of one embodiment of the present invention can be used for the display portion 9001 included in the portable information terminal 9101. Accordingly, the size of the portable information terminal 9101 can be reduced, and on the display portion 9001, a high-quality image can be displayed and a more realistic image can be displayed.

Figure 29E:
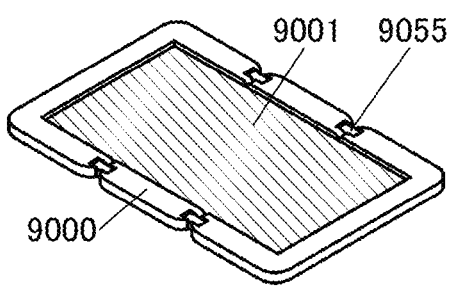
Figure 29C:
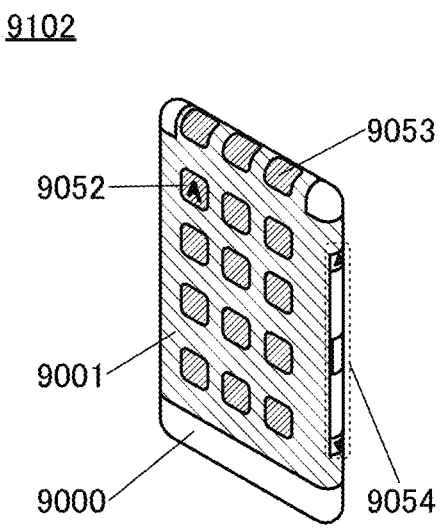

FIG. 29C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The display apparatus of one embodiment of the present invention can be used for the display portion 9001 of the portable information terminal 9102. Accordingly, the size of the portable information terminal 9101 can be reduced, and on the display portion 9001, a high-quality image can be displayed and a more realistic image can be displayed.

FIG. 29D is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can perform near field communication conformable to a communication standard. For example, mutual communication with a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display apparatus of one embodiment of the present invention can be used for the display portion 9001 of the portable information terminal 9200. Accordingly, the portable information terminal 9200 can have a narrower bezel, and on the display portion 9001, a high-quality image can be displayed and a more realistic image can be displayed.

Figure 29F:
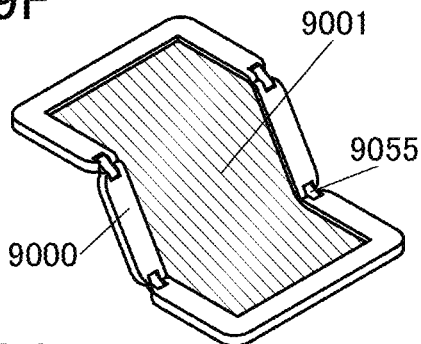
Figure 29G:
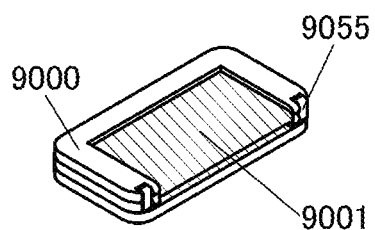

FIG. 29E, FIG. 29F, and FIG. 29G are perspective views illustrating a foldable portable information terminal 9201. FIG. 29E is a perspective view of the portable information terminal 9201 in the opened state, FIG. 29F is a perspective view of the portable information terminal 9201 that is shifted from one of the opened state and the folded state to the other, and FIG. 29G is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The display apparatus of one embodiment of the present invention can be used for the display portion 9001 of the portable information terminal 9201. Accordingly, the portable information terminal 9201 can have a narrower bezel, and on the display portion 9001, a high-quality image can be displayed and a more realistic image can be displayed.

At least part of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

Example 1

In this example, operation of a pixel that can be used in a display apparatus of one embodiment of the present invention was verified using circuit simulation. In the simulation, the configuration of the pixel 10 illustrated in FIG. 1B and the timing chart shown in FIG. 2 were used.

In the simulation, the transistor 101, the transistor 102, the transistor 103, and the transistor 104 were each an OS transistor having a channel length of 200 nm and a channel width of 60 nm. The capacitance value of the capacitor 111 was 17.0 fF and the capacitance value of the capacitor 112 was 3.4 fF. As potentials supplied to the wiring 121 and the wiring 122, "High" was 5 V and "Low" was 0 V. "Vdata" of the wiring 131 was set to 4.0 V, "Vref" of the wiring 161 was set to 0.5 V, "Vano" of the wiring 128 was set to 11.0 V, and "Vcath" of the wiring 129 was set to −5.0 V, and the simulation was conducted. SPICE was used as circuit simulation software.

Figure 30:
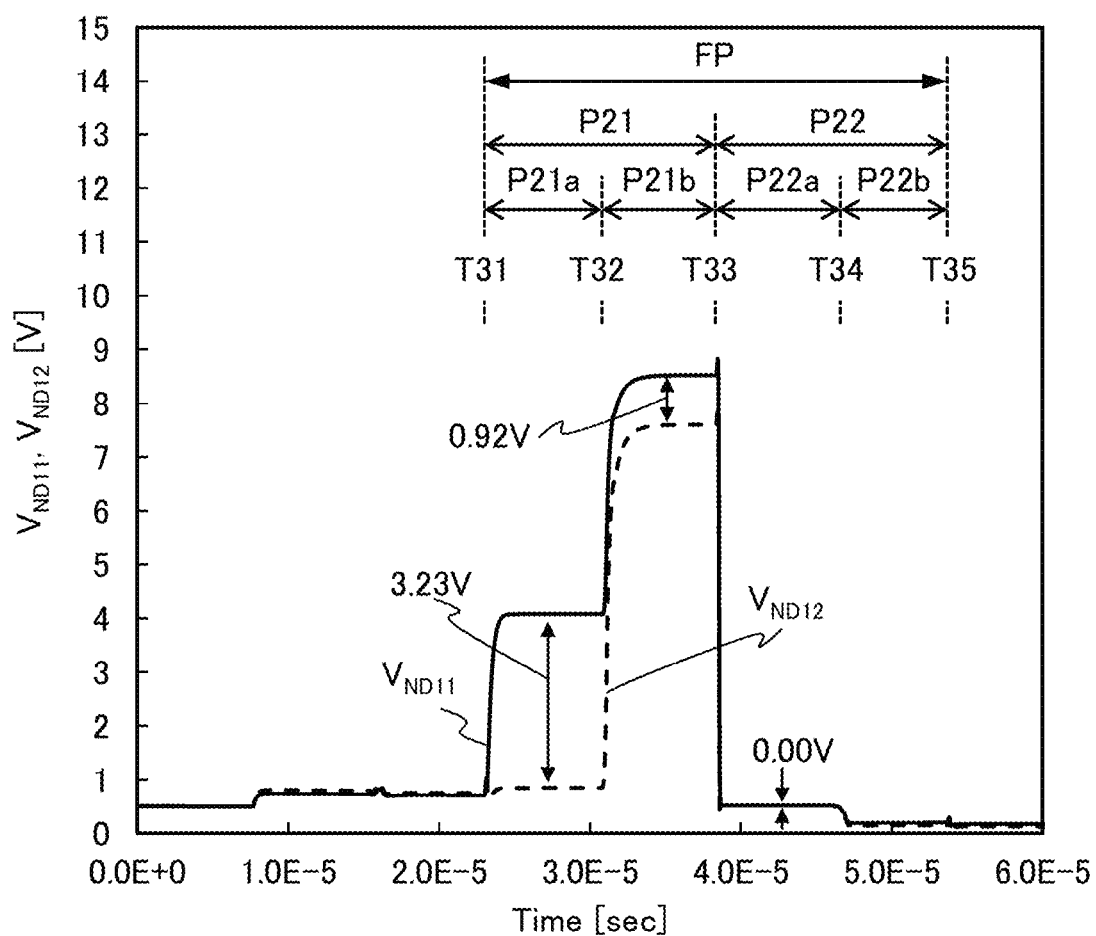
FIG. 30 is a diagram showing simulation results.

The simulation results are shown in FIG. 30. In FIG. 30, the horizontal axis represents time (Time) following the timing chart, and the vertical axis represents the potential $V_{ND11}$ of the node ND11 and the potential $V_{ND12}$ of the node ND12.

As shown in FIG. 30, the difference between the potential $V_{ND11}$ and the potential $V_{ND12}$ was 3.23 V in Period P21a, 0.92 V in Period P21b, and 0.00 V in Period P22a. It was confirmed that the difference between the potential $V_{ND11}$ and the potential $V_{ND12}$ was smaller than "Vdata" of 4.0 V in Period P21. It was also confirmed that the difference between the potential $V_{ND11}$ and the potential $V_{ND12}$ was 0 V in Period P22.

Example 2

In this example, the display apparatus described in the embodiments was fabricated.

In the fabricated display panel, the diagonal size of a display portion is 0.66 inches, the pixel number is 1440× 1440, the resolution (pixel density) is 3078 ppi, the pixel size is 2.75 μm×8.25 μm (2.75 μm×RGB×8.25 μm), the aperture ratio is 33.7%, and the frame frequency is 90 Hz. A gate driver and a source driver are incorporated; an OS transistor was used in the gate driver and a CMOS using a Si transistor was used in the source driver.

Figure 31A:
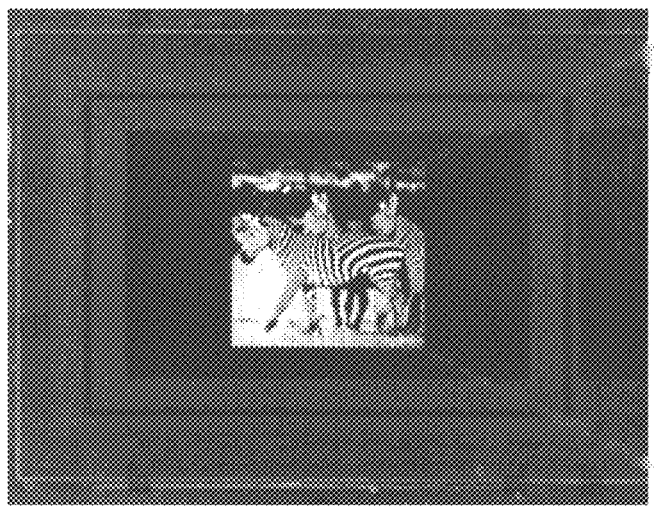
FIG. 31A and FIG. 31B are photographs of a display apparatus.
Figure 31B:
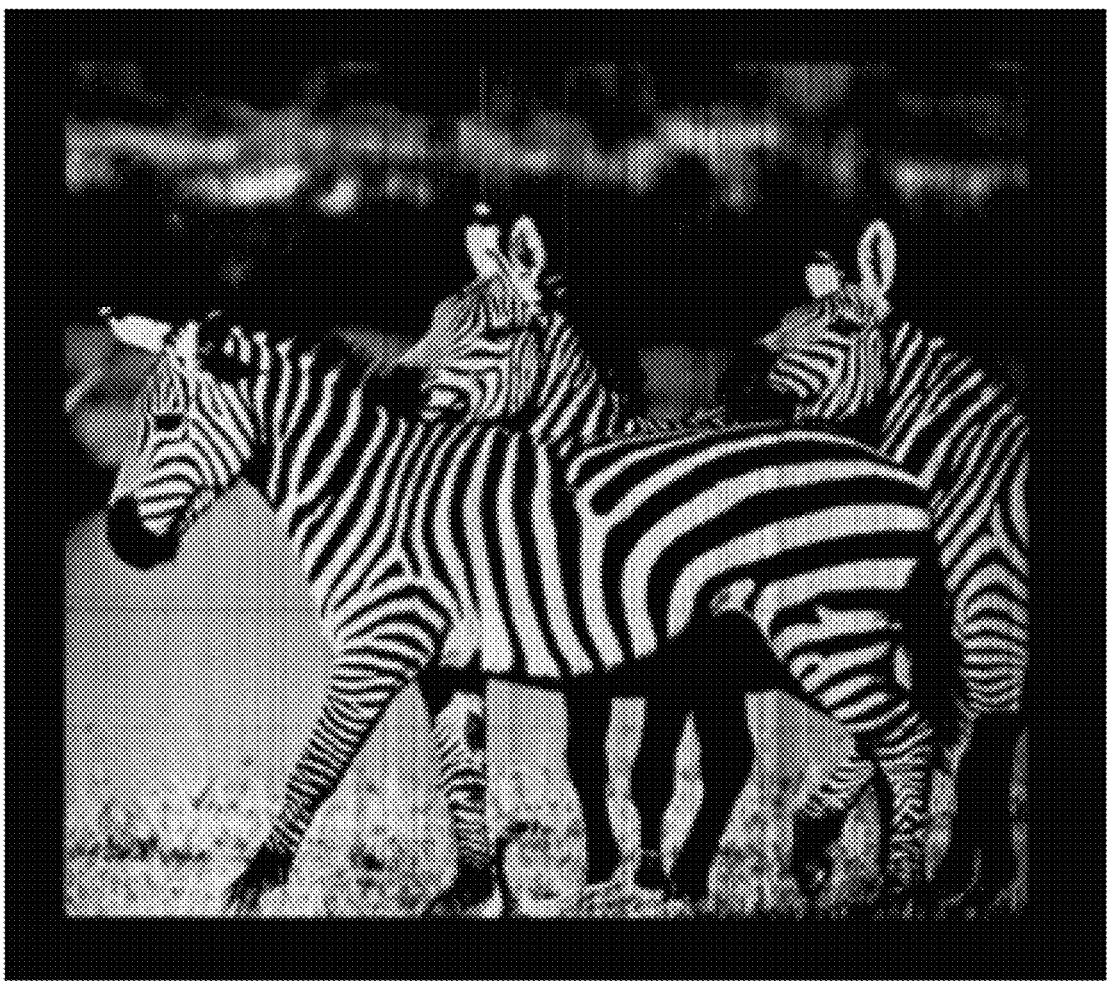

FIG. 31A shows a photograph of the fabricated display apparatus. FIG. 31B shows an enlarged photograph of a pixel portion. As shown in FIG. 31A and FIG. 31B, favorable display in the entire pixel portion was confirmed.

Figure 32A:
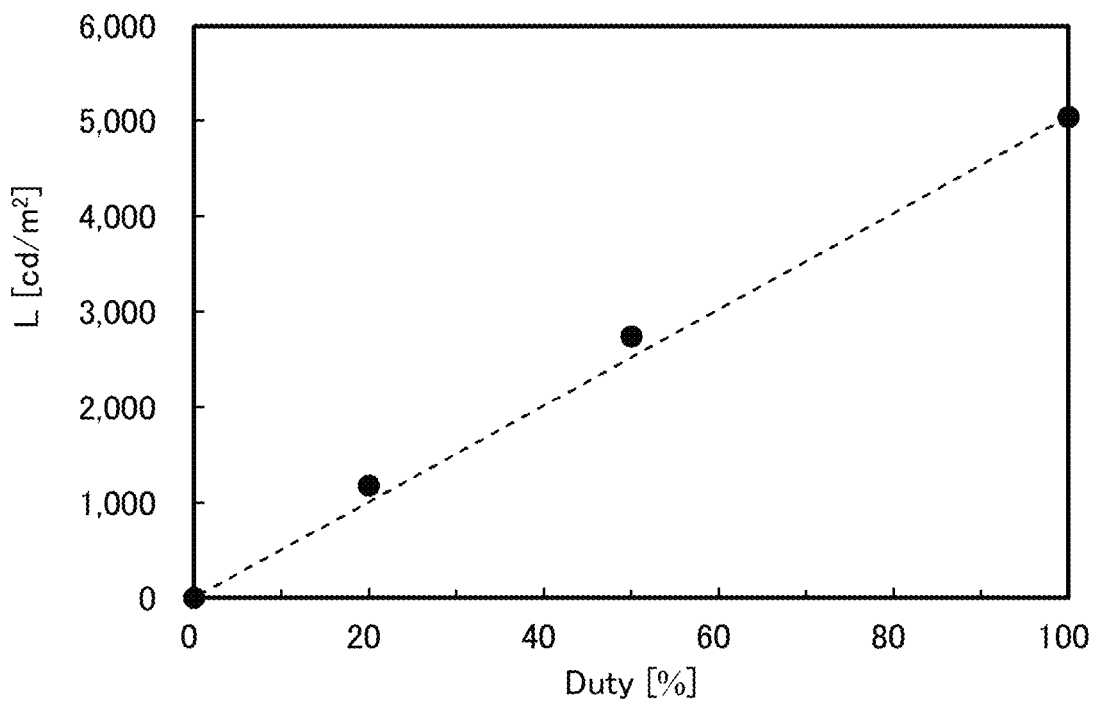
FIG. 32A is a diagram showing a correlation relationship between duty and luminance of a display apparatus.

The luminance of the above-described display apparatus was evaluated at different duties. FIG. 32A shows a correlation relationship between the duty and the luminance. In FIG. 32A, the horizontal axis represents duty (Duty) and the vertical axis represents luminance L. Note that FIG. 32A shows the luminance of the case where white is displayed in the entire pixel portion.

The luminance was 5040 cd/m$^2$ at a duty of 100%, the luminance was 2520 cd/m$^2$ at a duty of 50%, the luminance was 1008 cd/m$^2$ at a duty of 20%, and the luminance was 0 cd/m$^2$ at a duty of 0%, which demonstrated that the duty and the luminance had a proportional relationship. Note that in FIG. 32A, a straight line connecting the plot of a duty of 100% and the plot of a duty of 0% is indicated by a dashed line.

Figure 32B:
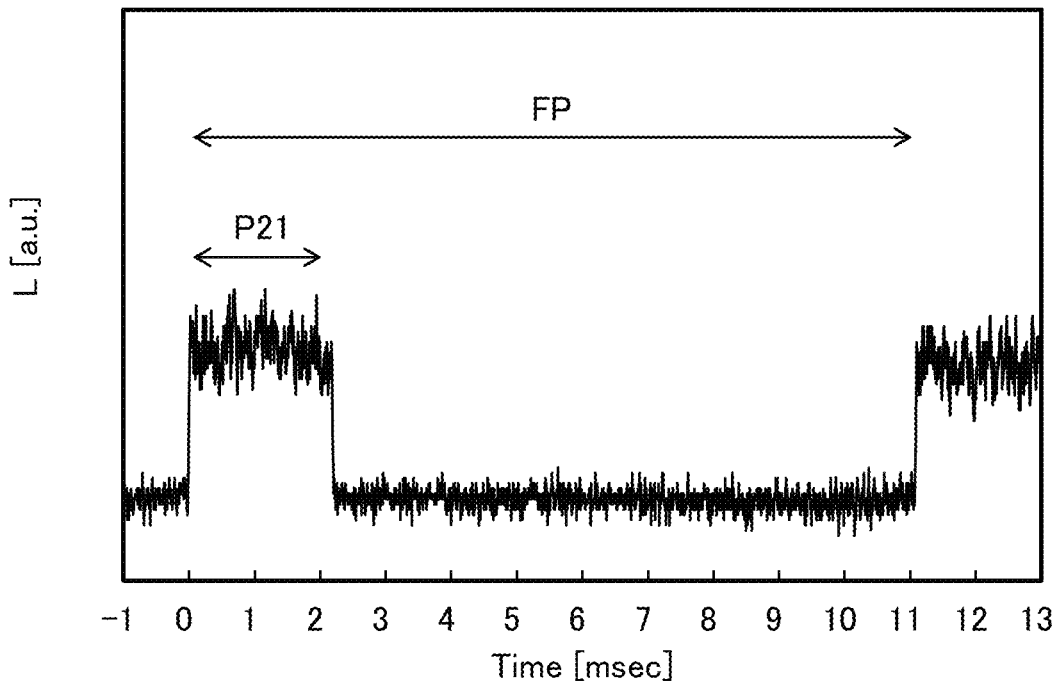
FIG. 32B is a diagram showing a time-dependent change in luminance of the display apparatus.

FIG. 32B shows a time-dependent change in luminance during display. In FIG. 32B, the horizontal axis represents time (Time) and the vertical axis represents luminance L. Note that FIG. 32B shows data on the luminance of the case where a white line with a width corresponding to one pixel is displayed at a duty of 20%, which is measured with a spectroradiometer.

It was confirmed that the luminance increased so that black display was switched to white display in the light-emitting period (P21) in one frame period (FP).

REFERENCE NUMERALS

ND11: node, ND12: node, 10a: pixel, 10B: subpixel, 10b: pixel, 10c: pixel, 10d: pixel, 10e: pixel, 10f: pixel, 10G: subpixel, 10R: subpixel, 10: pixel, 20: first layer, 30: second layer, 51a: display region, 51b: display region, 51c: display region, 53a: pixel electrode, 53b: pixel electrode, 53c: pixel electrode, 53: pixel electrode, 100: display apparatus, 101: transistor, 102: transistor, 103: transistor, 104: transistor, 111: capacitor, 112: capacitor, 114: light-emitting device, 121: wiring, 122: wiring, 123: wiring, 128: wiring, 129: wiring, 130: driver circuit portion, 131: wiring, 140a: driver circuit portion, 140b: driver circuit portion, 150: pixel portion, 161: wiring, 162: wiring, 200A: transistor, 200B: transistor, 200C: transistor, 200D: transistor, 205a: conductor, 205b: conductor, 205c: conductor, 205: conductor, 212: insulator, 214: insulator, 216: insulator, 222: insulator, 224: insulator, 230a: metal oxide, 230b: metal oxide, 230c: metal oxide, 230: metal oxide, 240a: conductor, 240b: conductor, 240: conductor, 241a: insulator, 241b: insulator, 241: insulator, 242a: conductor, 242b: conductor, 242: conductor, 243a: region, 243b: region, 244: insulator, 250: insulator, 252: metal oxide, 254: insulator, 260a: conductor, 260b: conductor, 260: conductor, 270: insulator, 271: insulator, 272: insulator, 274: insulator, 280: insulator, 281: insulator, 283: insulator, 301a: conductor, 301b: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 403: element isolation layer, 405: insulator, 407: insulator, 409: insulator, 411: insulator, 413: insulator, 415: insulator, 417: insulator, 419: insulator, 421: insulator, 441: transistor, 443: conductor, 445: insulator, 447: semiconductor region, 449a: low-resistance region, 449b: low-resistance region, 451: conductor, 453: conductor, 455: conductor, 457: conductor, 459: conductor, 461: conductor, 463: conductor, 465: conductor, 467: conductor, 469: conductor, 471: conductor, 501: insulator, 503: insulator, 505: insulator, 507: insulator, 509: insulator, 572: light-emitting device, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716: FPC, 721: hole-injection layer, 722: hole-transport layer, 723: light-emitting layer, 724: electron-transport layer, 725: electron-injection layer, 730: insulator, 732: sealing layer, 734: insulator, 736: coloring layer, 738: light-blocking layer, 750: transistor, 760: connection electrode, 772: conductor, 778: component, 780: anisotropic conductor, 782: light-emitting device, 786a: EL layer, 786b: EL layer, 786c: EL layer, 786: EL layer, 788: conductor, 790: capacitor, 792: charge generation layer, 800: transistor, 801a: conductor, 801b: conductor, 805: conductor, 811: conductor, 813: conductor, 814: insulator, 816: insulator, 817: conductor, 821: insulator, 822: insulator, 824: insulator, 844: insulator, 853: conductor, 854: insulator, 855: conductor, 874: insulator, 880: insulator, 881: insulator, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal This application is based on Japanese Patent Application Serial No. 2019-235131 filed on Dec. 25, 2019 and Japanese Patent Application Serial No. 2020-067214 filed on Apr. 3, 2020, the entire contents of each are hereby incorporated herein by reference.

The invention claimed is:

1. A display apparatus comprising a pixel portion comprising a plurality of pixels, a first wiring, a first scan line, a second scan line, a third scan line, and a signal line,
wherein the pixels each comprise a light-emitting device, a first transistor, a second transistor, a third transistor, a fourth transistor, a first capacitor, and a second capacitor,
wherein one electrode of the light-emitting device is electrically connected to one of a source and a drain of the first transistor, one of a source and a drain of the second transistor, and one electrode of the first capacitor,
wherein a gate of the second transistor is electrically connected to the other electrode of the first capacitor, one of a source and a drain of the third transistor, one of a source and a drain of the fourth transistor, and one electrode of the second capacitor,
wherein the other electrode of the second capacitor is electrically connected to the other of the source and the drain of the second transistor,
wherein the other of the source and the drain of the first transistor and the other of the source and the drain of the fourth transistor are each electrically connected to the first wiring,
wherein a gate of the first transistor is electrically connected to the first scan line,
wherein a gate of the third transistor is electrically connected to the second scan line,
wherein a gate of the fourth transistor is electrically connected to the third scan line,
wherein the other of the source and the drain of the third transistor is electrically connected to the signal line, and
wherein one frame period of each of the pixels comprises a period in which the first transistor and the fourth transistor are each in a conduction state.

2. The display apparatus according to claim 1,
wherein the second transistor comprises a back gate, and
wherein the back gate is electrically connected to the one of the source and the drain of the second transistor.

3. The display apparatus according to claim 1,
wherein the light-emitting device is an organic light-emitting diode.

4. The display apparatus according to claim 1,
further comprising a first driver circuit portion,
wherein the first driver circuit portion comprises a region overlapping with the pixel portion, and
wherein the first driver circuit portion is electrically connected to the signal line.

5. The display apparatus according to claim 4, further comprising a first layer and a second layer over the first layer,
wherein the first layer comprises the first driver circuit portion and a second driver circuit portion,
wherein the second layer comprises the pixel portion, and
wherein the second driver circuit portion is electrically connected to the first scan line.

6. The display apparatus according to claim 1,
wherein the first transistor, the second transistor, the third transistor, and the fourth transistor each comprise a metal oxide in a channel formation region,
wherein the metal oxide comprises indium, zinc, and an element M, and
wherein the element M is one or more selected from aluminum, titanium, gallium, germanium, yttrium, zirconium, lanthanum, cerium, tin, neodymium, and hafnium.

7. An electronic device comprising the display apparatus according to claim 1, and a camera.

8. The display apparatus according to claim 1,
wherein the second transistor comprises a back gate, and
wherein the back gate is electrically connected to the gate of the second transistor.

9. The display apparatus according to claim 1,
wherein the other electrode of the light-emitting device is electrically connected to a third wiring,
wherein a first potential is supplied to the first wiring,
wherein a third potential is supplied to the third wiring, and
wherein the third potential is lower than the first potential.

10. The display apparatus according to claim 1,
wherein the one electrode of the light-emitting device is electrically connected to a back gate of the second transistor.

11. The display apparatus according to claim 10,
wherein the gate of the first transistor is electrically connected to a back gate of the first transistor,
wherein the gate of the third transistor is electrically connected to a back gate of the third transistor, and
wherein the gate of the fourth transistor is electrically connected to a back gate of the fourth transistor.

* * * * *